(12) United States Patent
Mochizuki et al.

(10) Patent No.: US 8,721,922 B2
(45) Date of Patent: *May 13, 2014

(54) PRINTABLE LIGHT-EMITTING COMPOSITIONS

(75) Inventors: Amane Mochizuki, San Diego, CA (US); Takashi Kondo, Settsu (JP); Sheng Li, Vista, CA (US); Jesse Dan Froehlich, Vista, CA (US); Hyunsik Chae, San Diego, CA (US)

(73) Assignee: Nitto Denko Corporation, Osaka (JP)

( * ) Notice: Subject to any disclaimer, the term of this patent is extended or adjusted under 35 U.S.C. 154(b) by 284 days.

This patent is subject to a terminal disclaimer.

(21) Appl. No.: 13/123,895

(22) PCT Filed: Oct. 13, 2009

(86) PCT No.: PCT/US2009/045263

§ 371 (c)(1),
(2), (4) Date: Apr. 12, 2010

(87) PCT Pub. No.: WO2010/045263

PCT Pub. Date: Apr. 22, 2010

(65) Prior Publication Data

US 2011/0193075 A1    Aug. 11, 2011

Related U.S. Application Data

(60) Provisional application No. 61/105,018, filed on Oct. 13, 2008.

(51) Int. Cl.
*C09K 11/06* (2006.01)
*C07F 19/00* (2006.01)
*H01L 51/54* (2006.01)

(52) U.S. Cl.
USPC ...... 252/301.16; 428/690; 428/917; 313/504; 313/506; 438/46; 427/66

(58) Field of Classification Search
None
See application file for complete search history.

(56) References Cited

U.S. PATENT DOCUMENTS

| | | | |
|---|---|---|---|
| 5,635,249 A | 6/1997 | Haluska et al. | |
| 6,013,982 A | 1/2000 | Thompson et al. | |
| 6,018,002 A | 1/2000 | Pernisz | |
| 6,087,196 A | 7/2000 | Sturm et al. | |
| 6,406,804 B1 | 6/2002 | Higashi et al. | |
| 6,517,958 B1 | 2/2003 | Sellinger et al. | |
| 6,528,188 B1 | 3/2003 | Suzuki et al. | |
| 6,657,224 B2 | 12/2003 | Shi et al. | |
| 6,863,961 B2 | 3/2005 | Miyashita et al. | |
| 7,147,938 B2 | 12/2006 | Helber et al. | |
| 7,993,747 B2 | 8/2011 | Mochizuki et al. | |
| 2003/0120099 A1 | 6/2003 | Laine et al. | |
| 2003/0162299 A1 | 8/2003 | Hsieh et al. | |
| 2005/0123760 A1 | 6/2005 | Cammack et al. | |
| 2005/0247911 A1 | 11/2005 | Burn et al. | |
| 2006/0040136 A1 | 2/2006 | Liu et al. | |
| 2006/0186791 A1 | 8/2006 | Yoshitake et al. | |
| 2006/0246315 A1 | 11/2006 | Begley et al. | |
| 2007/0045619 A1 | 3/2007 | Park et al. | |
| 2007/0184301 A1 | 8/2007 | Oshiyama et al. | |
| 2007/0285003 A1 | 12/2007 | Smith et al. | |
| 2008/0135804 A1 | 6/2008 | Qiu et al. | |
| 2009/0066234 A1* | 3/2009 | Chae et al. | 313/504 |
| 2009/0179552 A1 | 7/2009 | Froehlich et al. | |
| 2012/0273765 A1* | 11/2012 | Froehlich et al. | 257/40 |
| 2012/0305895 A1* | 12/2012 | Chae et al. | 257/40 |

FOREIGN PATENT DOCUMENTS

| | | |
|---|---|---|
| CN | 1 631 890 | 6/2005 |
| CN | 1 680 366 | 10/2005 |
| CN | 1 810 817 | 8/2006 |
| EP | 1 359 630 | 11/2003 |
| JP | 2004-506050 | 2/2004 |
| JP | 2006-108458 | 4/2006 |
| JP | 2006-131796 | 5/2006 |
| JP | 2006-298899 | 11/2006 |
| JP | 2006-298900 | 11/2006 |
| JP | 2007-169593 | 7/2007 |
| JP | 2007-184348 | 7/2007 |
| JP | 2007-214175 | 8/2007 |
| TW | I245793 | 12/2005 |
| WO | WO 02/05971 A1 | 1/2002 |
| WO | WO 03/079736 | 9/2003 |
| WO | WO 2004/060898 A1 | 7/2004 |
| WO | WO 2005/027583 | 3/2005 |
| WO | WO 2005/037955 A1 | 4/2005 |
| WO | WO 2005/042444 | 5/2005 |
| WO | WO 2005/124889 | 12/2005 |
| WO | WO 2006/093466 | 9/2006 |
| WO | WO 2007/136588 | 11/2007 |

(Continued)

OTHER PUBLICATIONS

Kuei-Bai Chen et al., "*Novel dendritic light-emitting materials containing polyhedral oligomeric silsequioxanes core*" Thin Solid Films, Elsevier-Sequoia S.A., 514 (2006) 103-109.

Changyun Jiang et al., "*High-Efficiency, Saturated Red-Phosphoresent Polymer Light-Emitting Diodes Based on Conjugated and Non-Conjugated Polymers Doped with an Ir Complex*," Advanced Materials, Willey VCH Verlag, DE LNKD, vol. 16, No. 6, Mar. 8, 2004, pp. 537-541.

The International Search Report issued in the corresponding PCT application No. PCT/US2009/060555, dated Apr. 22, 2010.

Billmeyer, et al., "Principles of Color Technology", 2nd edition, John Wiley & Sons, Inc., New York, 1981.

Chen et al., "Synthesis and Opto-Electrical Properties of Stellar Polyfluorene Derivatives Containing Polhedral Oligomeric Silsesquixanes as the Center Core", Journal of Polymer Research, Nov. 2, 2005, vol. 13, pp. 237-245.

(Continued)

*Primary Examiner* — Dawn L. Garrett
(74) *Attorney, Agent, or Firm* — Knobbe, Martens, Olson & Bear, LLP

(57) ABSTRACT

Disclosed herein are compositions comprising an electron transport compound, an emissive compound, and an organic solvent. The emissive compound comprises an organic indium complex attached to a nanoparticle core. These compositions are useful in fabricating light emitting devices and can be deposited on a substrate via a printing process.

31 Claims, No Drawings

(56) References Cited

FOREIGN PATENT DOCUMENTS

| WO | WO 2008/049577 | 5/2008 |
|----|----------------|--------|
| WO | WO 2009/006550 A1 | 1/2009 |
| WO | WO 2009/064661 | 5/2009 |
| WO | WO 2010/045263 | 4/2010 |

OTHER PUBLICATIONS

CIE 1971, International Commission on Illumination, Colorimetry: Official Recommendations of the International Commission on Illumination, Publication CIE No. 15 (E-1.3.1) 1971, Bureau Central de la CIE, Paris, 1971.

Evans et al., "Coordinationg Complexes Exhibiting Room-Temperature Phosphoresence:Evaluation of their Suitability as Triplet Emitters in Organic Light Emitting Diodes", Coordination Chemistry Reviews, Mar. 6, 2006, vol. 250, pp. 203-2126.

Fenenko et al., "Electronic Characterization of New Bright-Blue-Light-Emitting Poly(9,9-dioctylfluorenyl-2,7-diyl)-End Capped With Polyhedral Oligomeric Silsesquioxanes", Japanese Journal of Applied Physics, 2006, vol. 45, No. 1B, pp. 550-554.

Fréchet et al., "Synthesis and Properties of Dendrimer and Hyperbranched Polymers", Comprehensive Polymer Science, 1996, pp. 71-132.

Gerlach et al., "Synthese von *endo*-und *exo*-1,3-Dimethyl-2,9-dioxabicylo[3.3.1]nonan", Helvetica Chemica Acta, 1977, vol. 60, No. 2, pp. 638-642.

Gustafsson et al. "Flexible Light-Emitting Diodes Made from Soluble Conducting Polymer," Nature, Jun. 11, 1992, vol. 357, pp. 477-479.

He et al., "Highly Efficient Luminescent Organic Cluster with Quantum Dot-Like Properties," Journal of American Chemical Society, 2004, vol. 126, No. 25, pp. 7792-7793.

Jiang et al., "High-Efficiency White-Light-Emitting Devices from a Single Polymer by Mixing Singlet and Triplet Emission", Advanced Materials, 2006, vol. 17, Issue 13, pp. 1769-1773.

Lee et al., "Stabalized Blue Luminescent Polyfluorenes: Introducing Polyhedral Oligomeric Silsesquioxane", Macromolecules, 2004, vol. 37, pp. 8523-8529.

Lee et al., "Synthesis of Polyhedral Oligomeric Silsesquioxane-Functionalized Polyfluorenes: Hybrid Organic-Inorganic n-Conjugated Polymers", Synthetic Metals, 2006, vol. 156, No. 7-8, pp. 590-596.

Liu et al., "Red Phosphorescent Iridium Complex Containing Carbazole-Functionalized β-Diketonate for Highly Efficient Nondoped Organic Light-Emitting Diodes", Advanced Functional Materials, 2006, vol. 16, Issue 11, pp. 1441-1448.

Nonoyama, Matsuo, "Benzo[*h*]quinolin-10-yl-N Iridium (III) Complexes", Bulletin of the Chemical Society of Japan, 1974, vol. 47, No. 3, pp. 767-768.

Odian, "Principles of Polymerization", John Wiley, New York, 2nd Ed., 1981, pp. 177-179.

Sellinger et al., "Heck Coupling of Haloaromatics with Octavinylsilsesquioxane:Solution Processable Nanocomposites for Application in Electroluminescent Devices", The Royal Society of Chemistry, 2005, pp. 3700-3702.

Sorenson et al., "Preparative Methods of Polymer Chemistry", John Wiley, New York, 3rd ed., 2001, pp. 442-444.

Sprouse et al., "Photophysical Effects of Metal-Carbon a Bonds in Ortho-Metalated Complexes of Ir(III) and Rh(III)", Journal of American Chemical Society, 1984, vol. 106, No. 22, pp. 6647-6653.

Vögtle et al., "Dendrimers III: Design, Dimension, Function", 212 Topics in Current Chemistry, 2001, pp. 9.

Xiao et al., "Nano-Hybrid Luminescent Dot: Synthesis, Characterization and Optical Properties", Journal of Materials Chemistry, 2006, vol. 16, pp. 829-836.

Xuebao, Faguang, Chinese Journal of Luminescence, Oct. 5, 2006, vol. 27, No. 5, pp. 700-704.

* cited by examiner

PRINTABLE LIGHT-EMITTING COMPOSITIONS

CROSS-REFERENCE TO RELATED APPLICATIONS

This application is a national phase application of PCT/US2009/060555, filed Oct. 13, 2009, which claims the benefit of U.S. Provisional Application No. 61/105,018, filed Oct. 13, 2008, all of which are hereby incorporated by reference in their entirety.

BACKGROUND

1. Field of the Invention

This invention relates to light emitting compositions and light-emitting devices that include the light-emitting compositions. Specifically, this invention relates to light emitting compositions that are printable and light-emitting devices that include iridium-functionalized nanoparticles.

2. Description of the Related Art

Organic Light Emitting Diodes (OLEDs) can be composed of small molecule or polymeric fluorescent or phosphorescent compounds. OLEDs comprise a cathode, a hole transporting layer, an emissive layer, an electron transporting layer and an anode. OLED devices emit light as a result of recombination of positive charges (holes) and negative charges (electrons) inside an organic compound (emissive) layer. This organic compound is referred as an electro-fluorescent material or electro-phosphorescent material depending on the nature of the radiative process. As OLED devices have developed to increase luminousity and increased lifetimes, additional layers, such as hole blocking layers and electron blocking layers, have been incorporated into the OLED device. However, introducing more layers of materials has made the OLED structure increasingly complex. This increased complexity makes the fabrication process significantly more difficult. The addition of layers also makes fabrication more difficult because poor control of layer thickness may impair performance. Thus, improving the performance of OLEDs is often tedious, difficult, and expensive.

There are several methods for manufacturing these above described layers within an OLED device. Primary methodologies include dry processing and wet processing. Dry processing is processing performed without a liquid. Examples of a dry processing operation include dry etching, laser ablation, chemical vapor deposition and vacuum deposition. Dry processing methods have several drawbacks, including difficulty controlling the thickness or composition of a previously deposited layer during serial deposition, high cost of equipment set up and maintenance, slow processing, and difficulty with substrates having a large area. Thus wet production methods may offer significant advantages.

Solution or wet-processing includes the dissolution or suspension of the precursor materials in a solvent and the application of the solution to the desired substrate. Exemplary methodologies include spin coating and inkjet applications. Spin coating can be undesirable because large quantities of the dissolved solution are spun off of the desired surface during the coating process. Thus, large amounts material is wasted production costs are higher.

Inkjet fabrication is less expensive. Inkjet fabrication also allows fine patterning in a simple manner and in a short time. Furthermore, it provides better control of luminescent characteristics such as color balance and brightness (luminance) because the thickness of the layer is easily controlled through adjustment of the discharge amount of the ink or by adjusting the ink concentration.

SUMMARY

The inventors have discovered compositions that are, inter alia, useful as ink compositions that may be used in inkjet printers to fabricate light emitting compositions and devices. Some embodiments described herein relate to compositions comprising an iridium-functionalized nanoparticle that can include a nanoparticle core and an iridium-complex. In other embodiments, the iridium-functionalized nanoparticles described herein are light-emitting, e.g., white light-emitting.

One embodiment disclosed herein is a composition comprising an electron transport compound, an emissive compound, and an organic solvent, wherein the emissive compound is represented by formula (I):

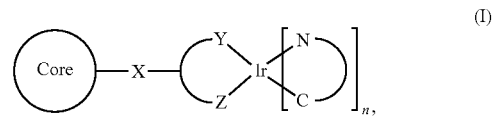

wherein core is a nanoparticle core, n is 2, X is a single bond or

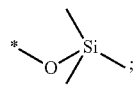

each

is independently a first optionally substituted bidentate ligand;

is a second optionally substituted bidentate ligand selected from:

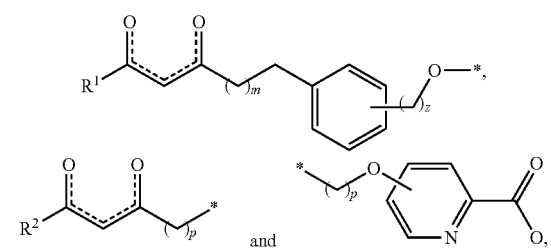

wherein m is an integer in the range of 1 to 9, p is an integer in the range or 1 to 20, z is 0, 1 or 2, $R^1$ is selected from alkyl, substituted alkyl, aryl and substituted aryl, $R^2$ is selected from: alkyl, substituted alkyl, aryl and substituted aryl, and * indicates a point of attachment of the second optionally substituted bidentate ligand to the core or X.

One embodiment also disclosed herein is a composition comprising an electron transport compound, an emissive compound, and an organic solvent, wherein the emissive compound is represented by one of the following formulas:

(II)

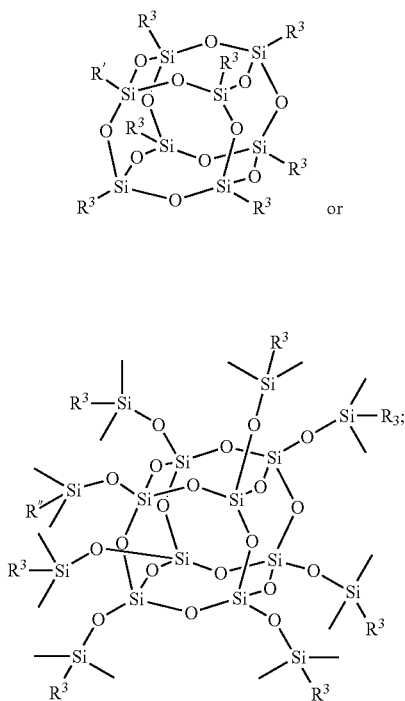

or (III)

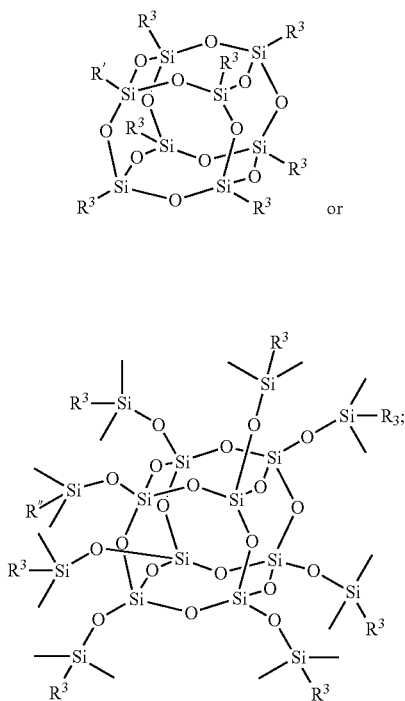

wherein R' is represented by

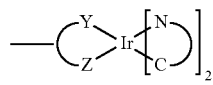

or

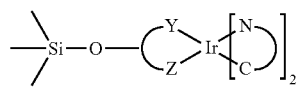

and R" is represented by

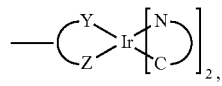

wherein each

is independently a first optionally substituted bidentate ligand, and

is a second optionally substituted bidentate ligand; $R^3$ is

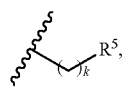

wherein k is 0 or an integer selected from 1 to 20, and $R^5$ is independently selected from the following:

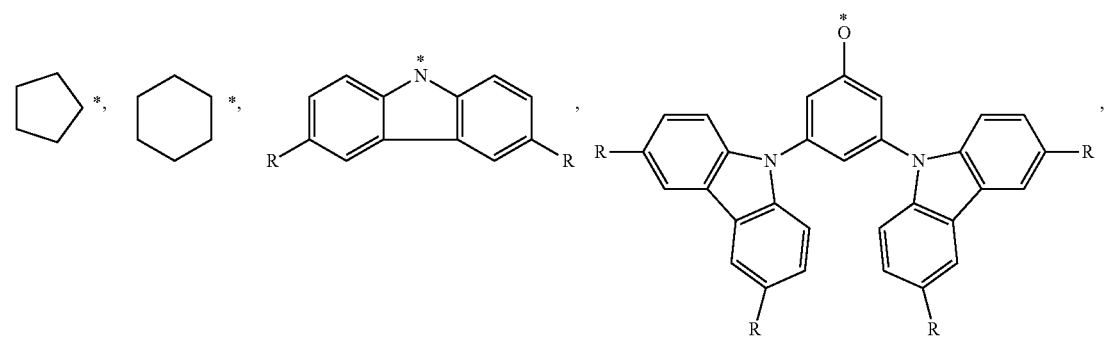

-continued
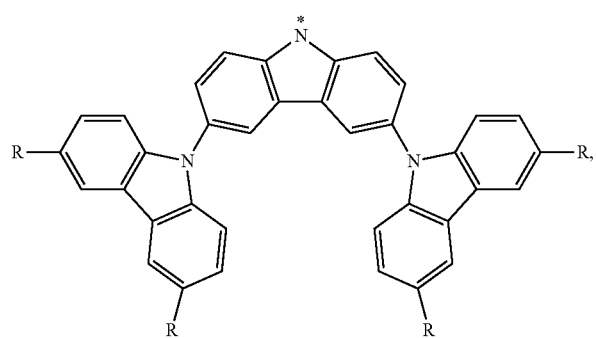
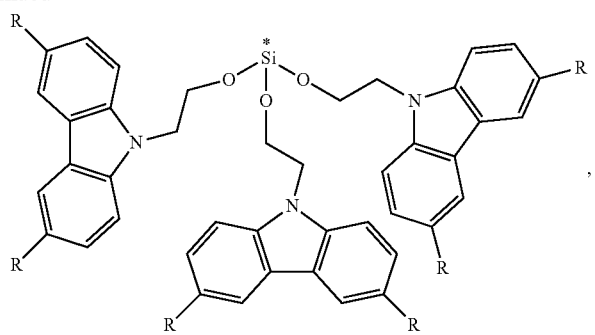
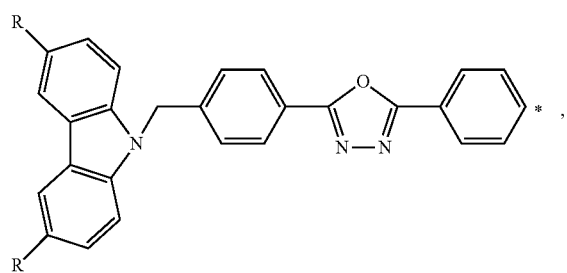
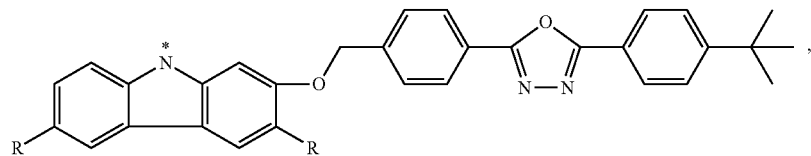
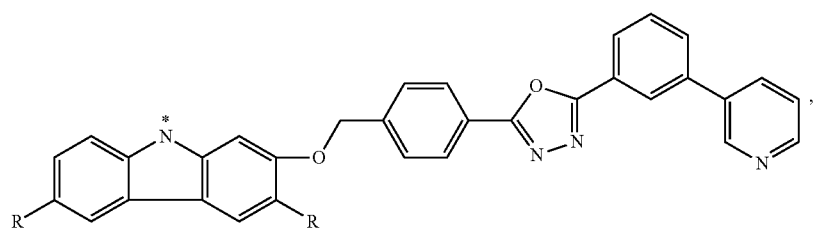
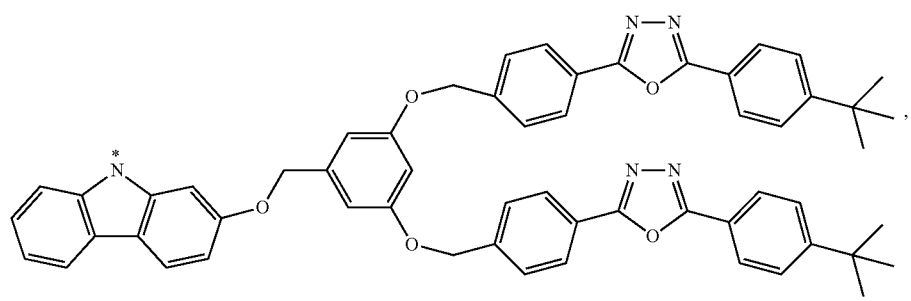

-continued
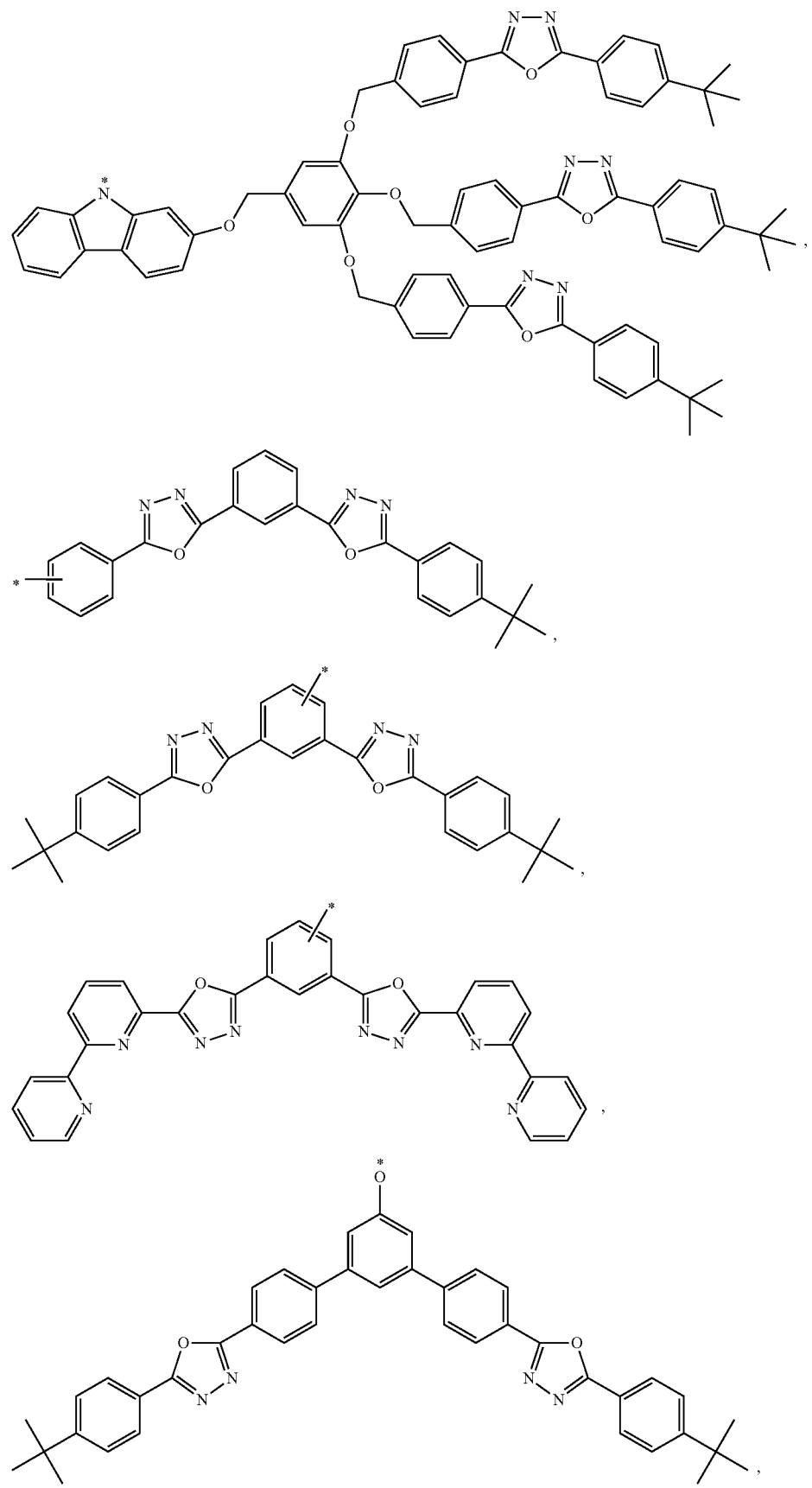

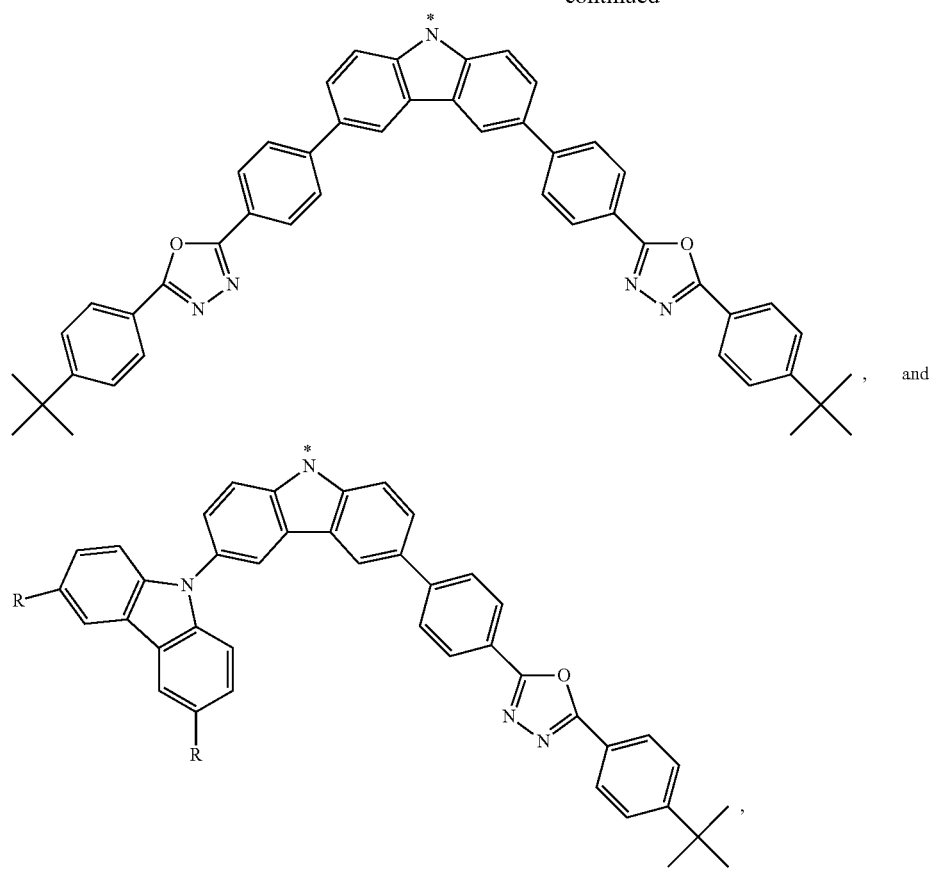

wherein R is independently selected from H or alkyl, and * indicates a point of attachment in R³.

Another embodiment provides a method of fabricating a light-emitting device comprising depositing any composition disclosed herein upon an electrically conductive substrate via an inkjet printer.

Another embodiment provides a composition (IV) comprising: an emissive compound represented by Formula (IV), and an electron transport compound; and an organic solvent.

Formula (IV)

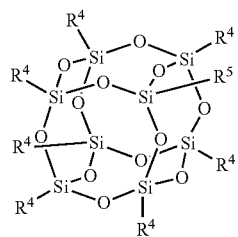

With respect to Formula (IV), each R⁴ is independently selected from:

 and and R⁵ is

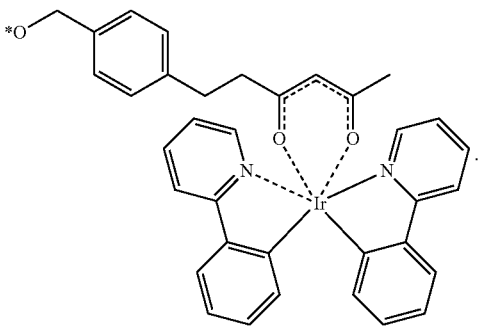

Another embodiment is composition (V) comprising: an emissive compound represented by Formula (V), an electron transport compound, and an organic solvent.

Formula (V)

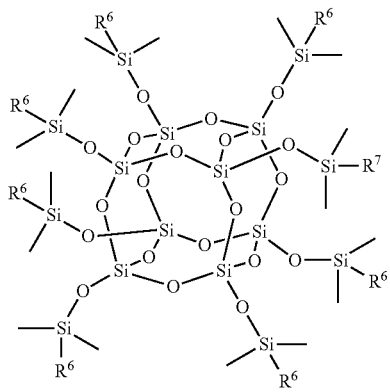

With respect to formula (V), each $R^6$ is independently selected from the following:

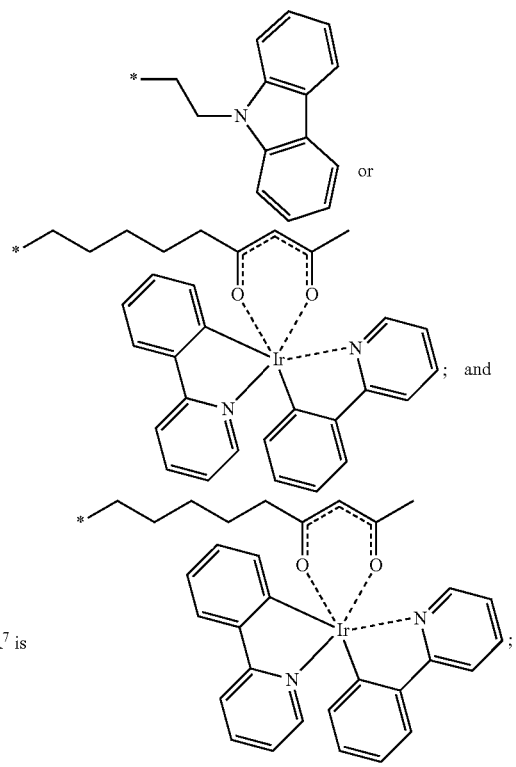

$R^7$ is

These and other embodiments are described in greater detail below.

DETAILED DESCRIPTION

A nanoparticle is a particle having a cross-sectional measurement (e.g., diameter if spherical) of about 100 nm or less. Nanoparticles may be soluble or insoluble polymers (copolymers, hyperbranched polymers, etc), having the ability to aggregate, accumulate and/or self-assemble into particles of about 100 nm or less. The silsesquioxane group of the formula (II) is an example of a nanoparticle.

Dendrimers are examples of nanoparticles. Dendrimers are branched molecular materials that exhibit useful properties of both small molecules and polymers. See e.g. Fréchet, J. M. J.; Hawker, C. J. Comprehensive Polymer Science, 2nd Supplement; Pergamon: Oxford, England, 1996; pp 140-206. A dendrimer is a substantially monodisperse synthetic macromolecule possessing a three-dimensional architecture that comprises a central core, highly branched but substantially regular iterative building units, and numerous peripheral ending groups. A more detailed description of these terms is found in G. Odian, Principles of Polymerization, John Wiley, New York, $2^{nd}$ Ed., 1981, pp. 177-179 and in W. R. Sorenson, F. Sweeney and T. W. Campbell, Preparative Methods of Polymer Chemistry, John Wiley, New York, 3rd ed., 2001, pp. 442-444, both of which are hereby incorporated by reference in their entireties. The numerous functional groups in the periphery of dendrimers are ideally suited for the incorporation of light-emitting lumophores, e.g., by covalent bonding. Modifications of peripheral functional groups in dendrimers to accommodate the attachment of lumophores can be carried out by general methods described in "Dendrimers III: Design Dimension Function", Vogtle, F., Vol. Ed. Top. Curr. Chem. 2001, 212. Similar methods may also used to functionalize polymer nanoparticles.

Unless otherwise indicated, when a substituent referred to as being "optionally substituted," or "substituted" it is meant that the substituent is a group that may be substituted with one or more group(s) containing about 1 to about 20 atoms individually and independently selected from alkyl, alkenyl, alkynyl, cycloalkyl, cycloalkenyl, cycloalkynyl, aryl, heteroaryl, heteroalicyclyl, aralkyl, heteroaralkyl, (heteroalicyclyl)alkyl, hydroxy, protected hydroxyl, alkoxy, aryloxy, acyl, ester, mercapto, alkylthio, arylthio, cyano, halogen, carbonyl, thiocarbonyl, O-carbamyl, N-carbamyl, O-thiocarbamyl, N-thiocarbamyl, C-amido, N-amido, S-sulfonamido, N-sulfonamido, C-carboxy, protected C-carboxy, O-carboxy, isocyanato, thiocyanato, isothiocyanato, nitro, silyl, sulfenyl, sulfinyl, sulfonyl, haloalkyl, haloalkoxy, trihalomethanesulfonyl, trihalomethanesulfonamido, and amino, including mono- and di-substituted amino groups, and the protected derivatives thereof.

The term "aryl" as used herein refers to single $C_{3-20}$ carbocyclic and poly-$C_{3-20}$ carbocyclic ring systems with a fully delocalized pi-system. Exemplary aryl groups are phenyl and naphthyl.

The term "alkyl" as used herein is a linear or branched chain of one to thirty-five carbon atoms. Examples of alkyl groups include but are not limited to methyl, ethyl, propyl, isopropyl, n-butyl, iso-butyl, tert-butyl, and the like.

The term "cycloalkyl" as used herein refers to fully saturated single carbocyclic and poly-carbocyclic ring systems with three to thirty five carbon atoms.

A "monodentate ligand" refers to a ligand which forms one bond (e.g., a coordinate covalent bond and/or covalent bond) to a central atom, such as a metal ion, A monodentate ligand can be a neutral molecule or an ion with a lone pair. A "bidentate" ligand refers to a ligand which forms two bonds (e.g., a coordinate covalent bond and/or covalent bond) to a central atom.

As used herein, the term "phosphorescence" refers to emission from a triplet excited state of an organic molecule. The term "fluorescence" refers to emission from a singlet excited state of an organic molecule.

An "aggregate emitter" comprises two or more light-emitting compounds that are bound in the ground state and/or in the excited state. An "excimer" is a dimer with an excited state wavefunction that extends over two identical molecules, and is formed when the light-emitting compounds comprising the aggregate emitters are bound in the excited state but not in the ground state.

The term "silsesquioxane" is the general name for a family of polycyclic compounds consisting of silicon and oxygen. Silsesquioxanes are also known as silasesquioxanes and polyhedral oligomeric silsesquioxanes (POSS).

The "work function" of a metal is a measure of the minimum energy required to extract an electron from the surface of the metal.

A "high work function metal" is a metal or alloy that easily injects holes and typically has a work function greater than or equal to 4.5.

A "low work function metal" is a metal or alloy that easily loses electrons and typically has a work function less than 4.3.

A "wet process" is used herein in its ordinary sense as understood by those skilled in the art and includes a process of laying down a layer where the materials that are included in the layer are in aqueous or organic solution. Examples of wet processes include but are not limited to spraying, spin coating, drop casting, inkjet printing and screen printing.

A material is white light-emitting if it emits white light. White light is light having the approximate CIE color coordinates (X=⅓, Y=⅓). The CIE color coordinates (X=⅓, Y=⅓) is defined as the achromatic point. The X and Y color coordinates are weights applied to the CIE primaries to match a color. A more detailed description of these terms may be found in CIE 1971, International Commission on Illumination, Colorimetry: Official Recommendations of the International Commission on Illumination, Publication CIE No. 15 (E-1.3.1) 1971, Bureau Central de la CIE, Paris, 1971 and in F. W. Billmeyer, Jr., M. Saltzman, Principles of Color Technology, 2nd edition, John Wiley & Sons, Inc., New York, 1981, both of which are hereby incorporated by reference in their entireties. The color rendering index (CRI) refers to the ability to render various colors and has values ranging from 0 to 100, with 100 being the best.

An embodiment provides a composition comprising an electron transport compound, an emissive compound, and an organic solvent. In some embodiments, the composition may further comprise a hole transport compound. The composition is useful for making a light-emitting device by a printing process. The composition may be used with an inkjet printer.

The emissive compound comprises an iridium complex attached to the nanoparticle core (i.e., iridium-functionalized nanoparticle). In some embodiments, the iridium-complex can be a phosphorescent emitter. In one embodiment, the iridium-functionalized nanoparticle is represented by Formula (I) as follows:

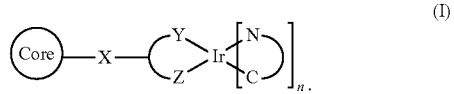

(I)

The core in Formula (I) represents the nanoparticle core, while

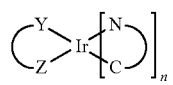

represents the iridium complex. The n in the iridium complex is 2, each

is independently a first optionally substituted bidentate ligand, and

is a second optionally substituted bidentate ligand. The X in Formula (I) may be a single bond or

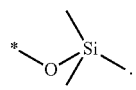

In some embodiments, the second optionally substituted bidentate ligand may be selected from

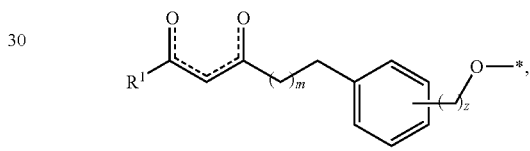

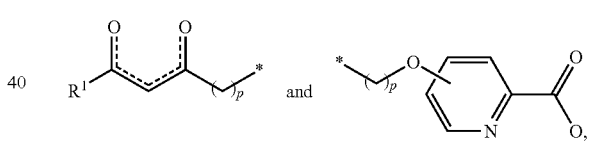

wherein m is an integer in the range of 1 to 9, p is an integer in the range or 1 to 20, z is 0, 1 or 2, R¹ is selected from alkyl, substituted alkyl, aryl and substituted aryl, R² is selected from: alkyl, substituted alkyl, aryl and substituted aryl, and * indicates a point of attachment of the second optionally substituted bidentate ligand to the core or X.

In some embodiments, the iridium-functionalized nanoparticle of Formula (I) further comprises at least one host attached to the core, wherein the at least one host may be a hole transport material, an electron transport material or a mixture thereof. In other words, the at least one host is independently selected from a hole transport material and an electron transport material. In some embodiments, the at least one host may comprise

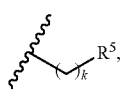

wherein k is 0 or an integer selected from 1, 2, 3, 4, 5, 6, 7, 8, 9, 10, 11, 12, 13, 14, 15, 16, 17, 18, 19 and 20. Each R⁵ is independently selected from the following:

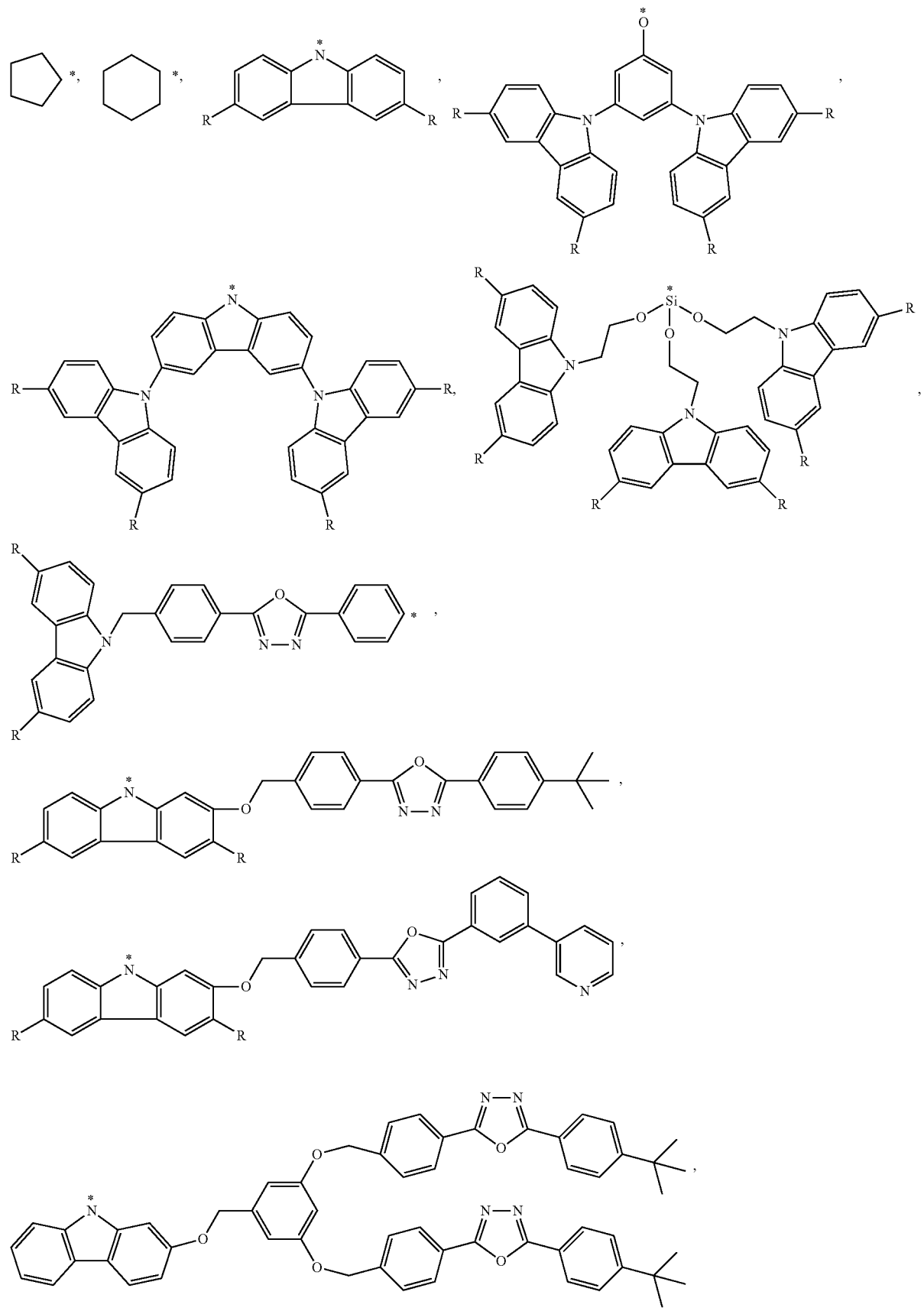

-continued
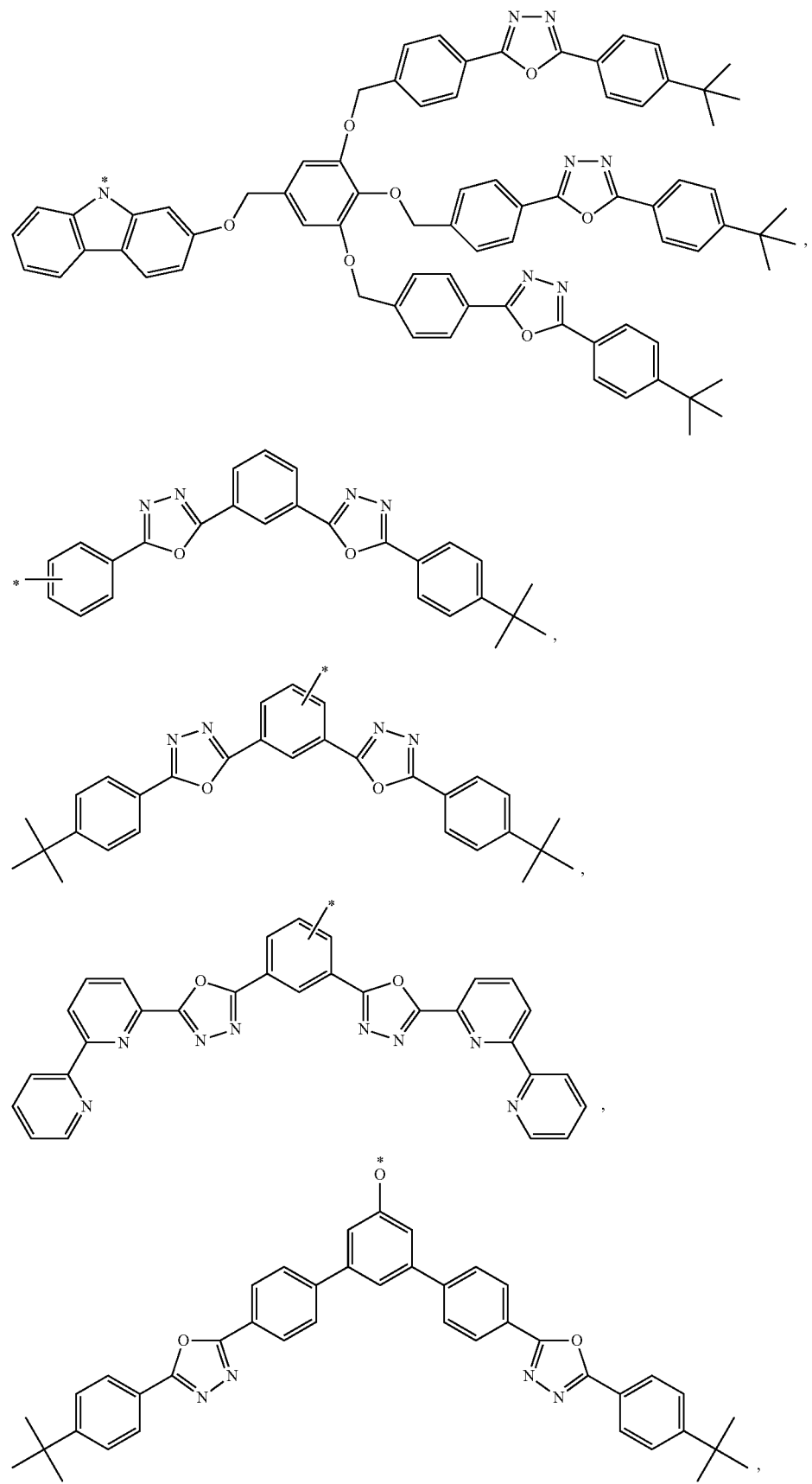

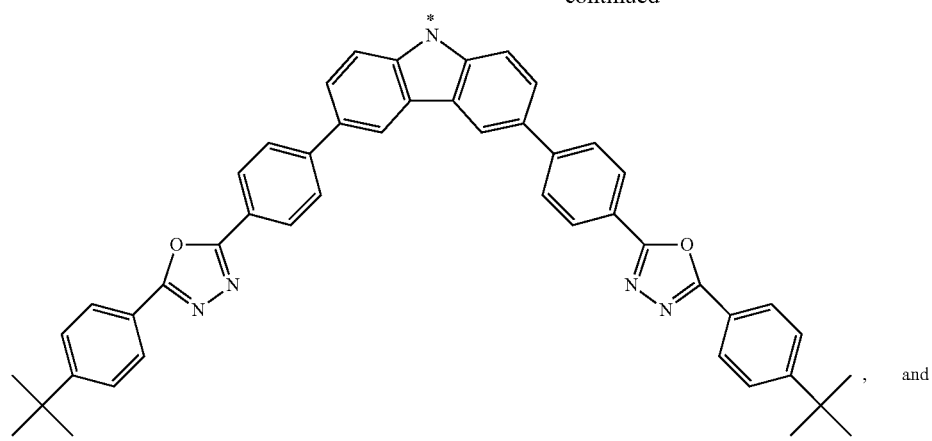

, and

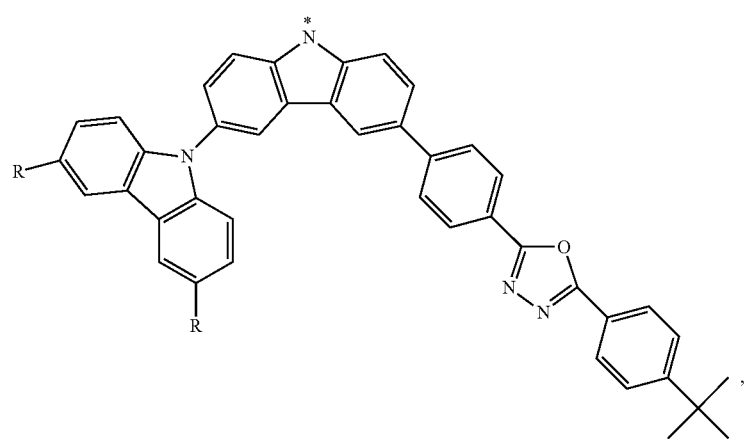

, wherein R is independently selected from H or alkyl, and * indicates a point of attachment. The ⌇ indicates that the bond is attached to the core.

In some embodiment, the core may comprise a moiety selected from the group consisting of a silsesquioxane, a cyclophosphazene, a triazine, a cyclodextrin, a calizarene, a phthalocyanine, and a silica particle. In one embodiment, the core is [POSS].

In some embodiments, the iridium-functionalized nanoparticle or the emissive compound may be represented by the following formulas:

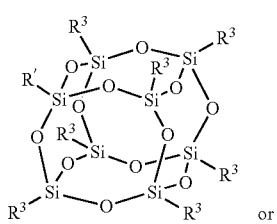

(II)

or

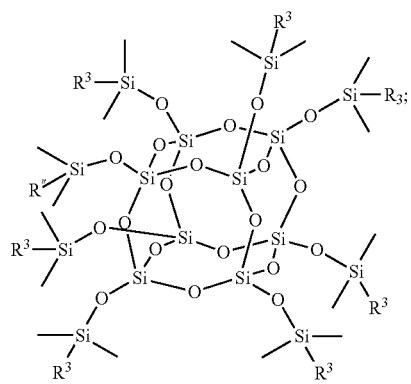

(III)

wherein both R' and R" are Ir complexes, R' is represented by

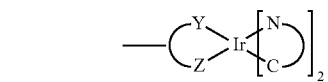

or
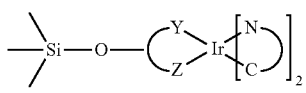
and R″ is represented by
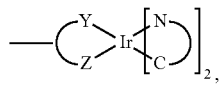
wherein each
is independently a first optionally substituted bidentate ligand, and
is a second optionally substituted bidentate ligand. The $R^3$ is
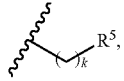
wherein k is 0 or an integer selected from 1 to 20. In some embodiments, $R^3$ may be a host, and each $R^5$ in Formula (I), (II), and (III) can be independently selected from the following:
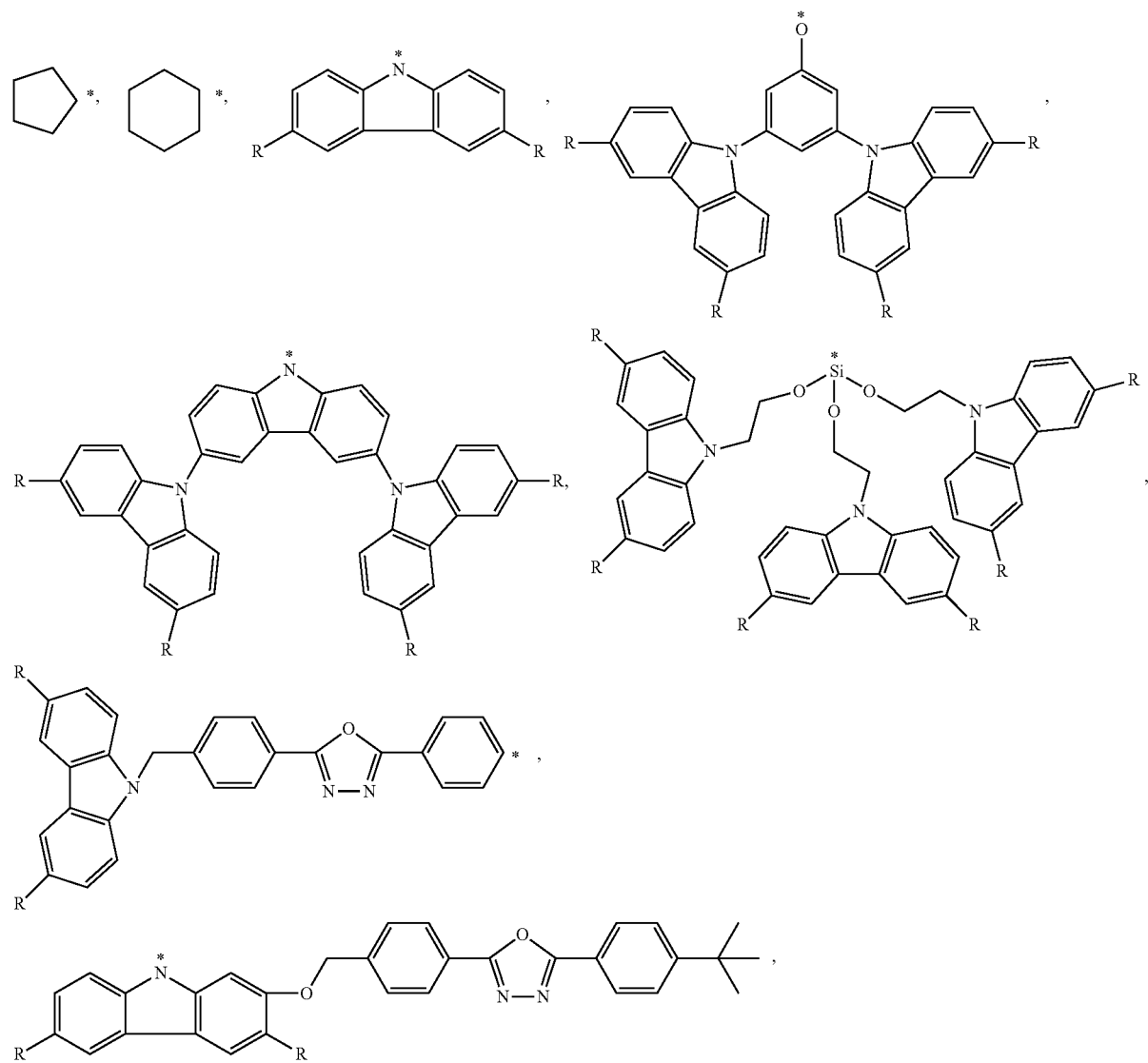

-continued
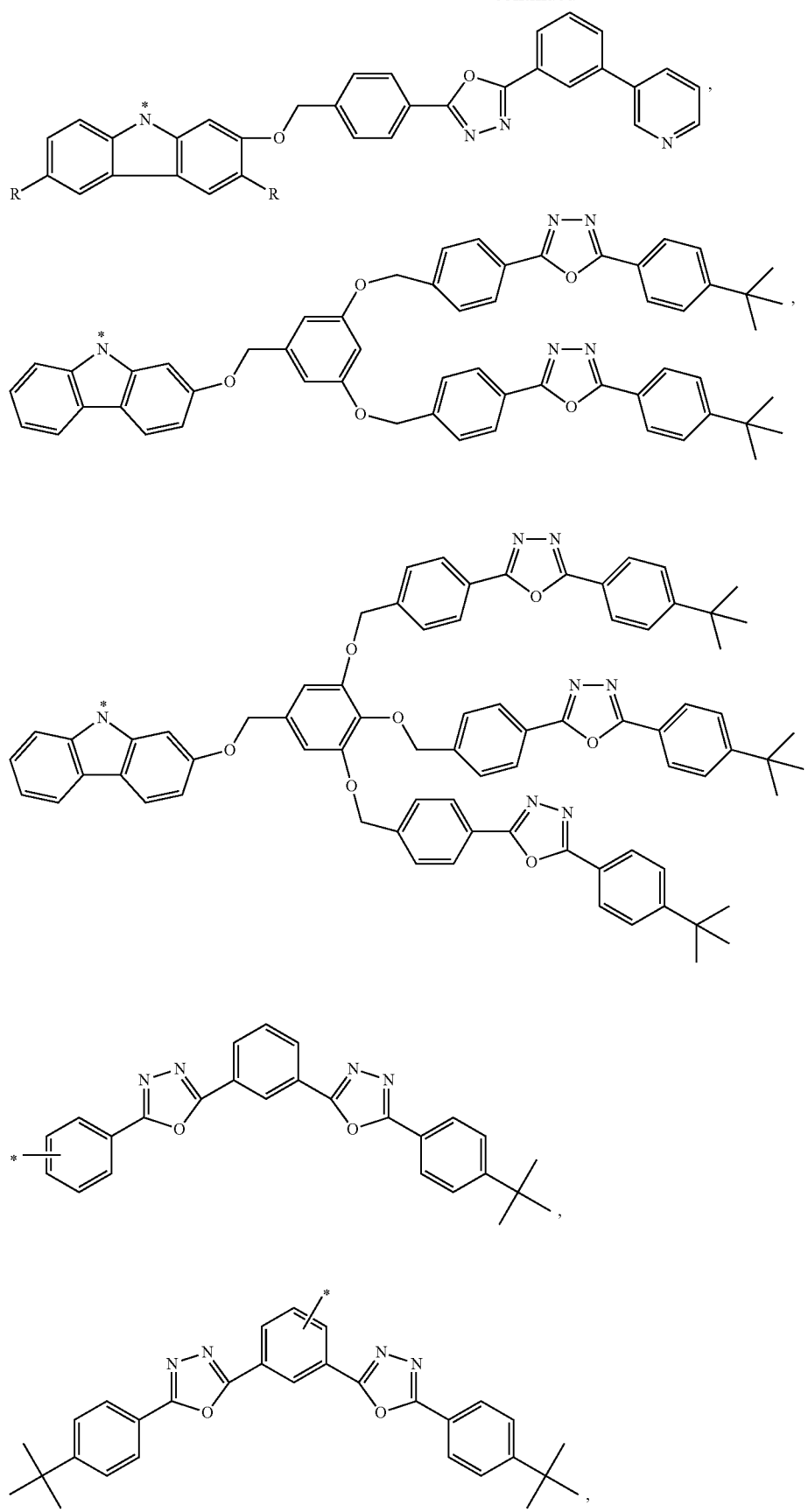

-continued

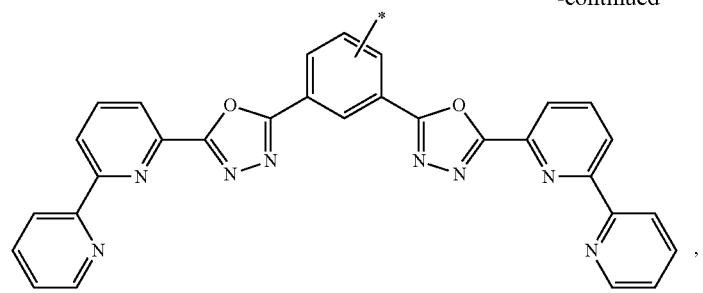

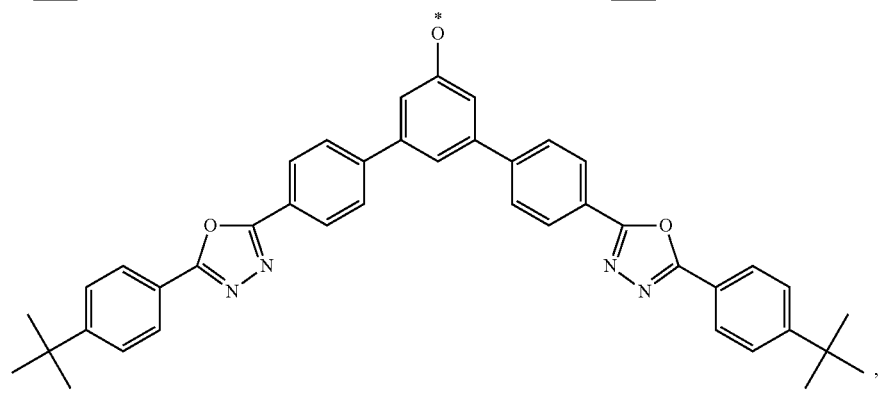

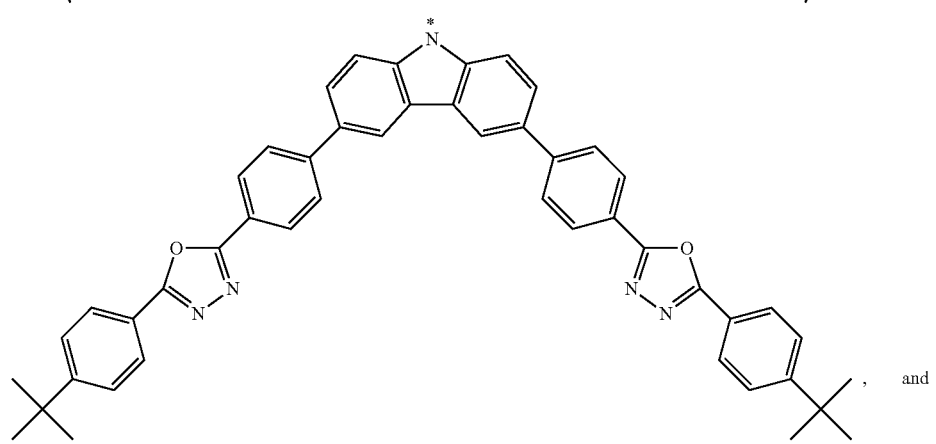

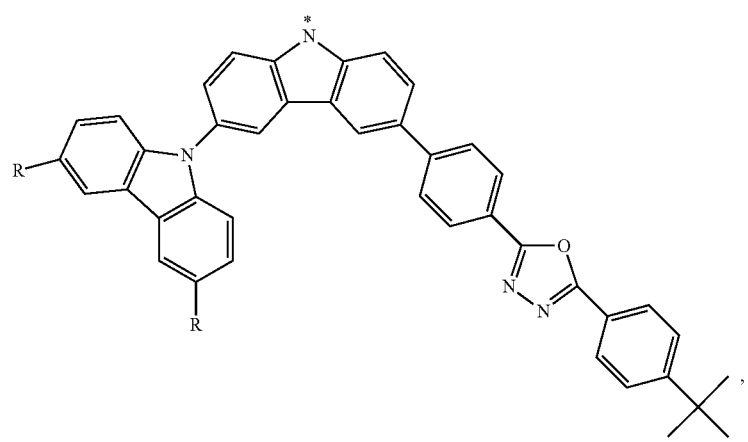

wherein R is independently selected from H or alkyl, and * indicates a point of attachment to Si or the alkyl group in $R^3$. In some embodiments, more than one host may be present in an iridium-functionalized nanoparticle complex. In some embodiments, a light-emitting composition may comprise a plurality of the iridium-functionalized nanoparticles independently selected from the compounds of Formula (I), (II) or (III).

In some embodiments, the first optionally substituted bidentate ligand may be independently selected from the following:

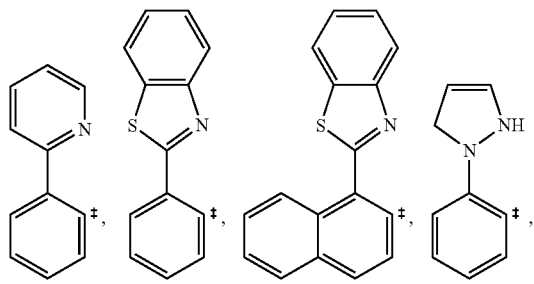

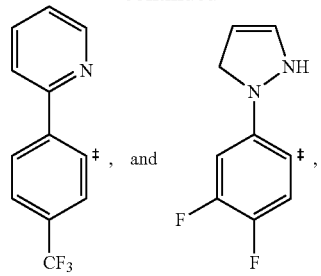

-continued wherein ‡ indicates a point of attachment to the Ir. In some embodiments, the first bidentate ligand may be independently selected from the following:

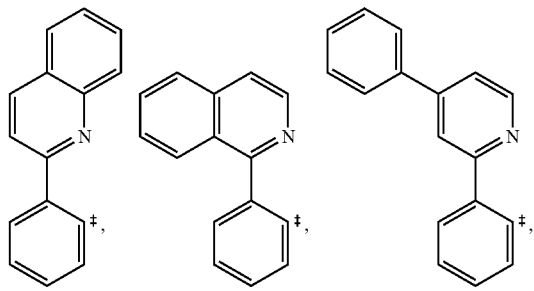

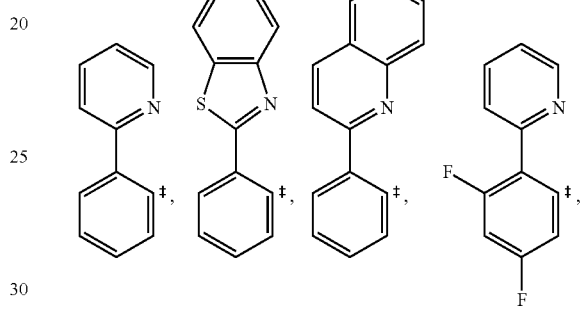

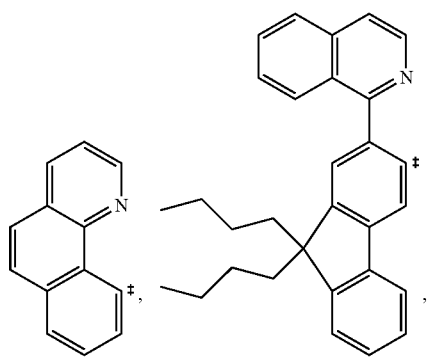

and optionally substituted derivatives thereof, wherein ‡ indicates a point of attachment to the Ir. In some embodiments, the first optionally substituted bidentate ligand may also be independently selected from substituted derivatives of the following:

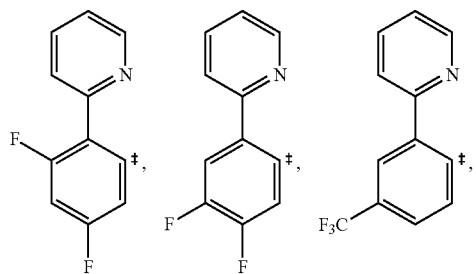

wherein ‡ indicates a point of attachment to the Ir. In some embodiments, the two bidentate ligands or the two optionally substituted bidentate ligands may be the same.

In some embodiments, the second optionally substituted bidentate ligand may be selected from the following group:

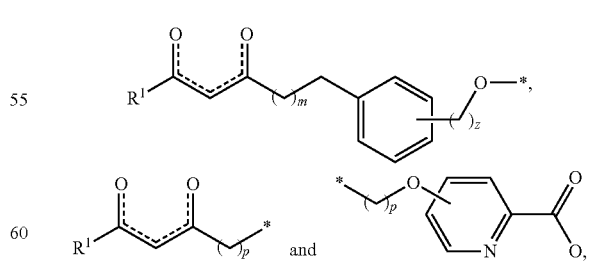

wherein m is an integer in the range of 1 to 9, p is an integer in the range of 1 to 20, z is 0, 1 or 2, $R^1$ is selected from alkyl, substituted alkyl, aryl and substituted aryl, and $R^2$ is selected from: alkyl, substituted alkyl, aryl and substituted aryl; and * indicates a point of attachment to the core or X.

An embodiment described herein relates to a composition that comprises one or more compound of formula (I) selected from:
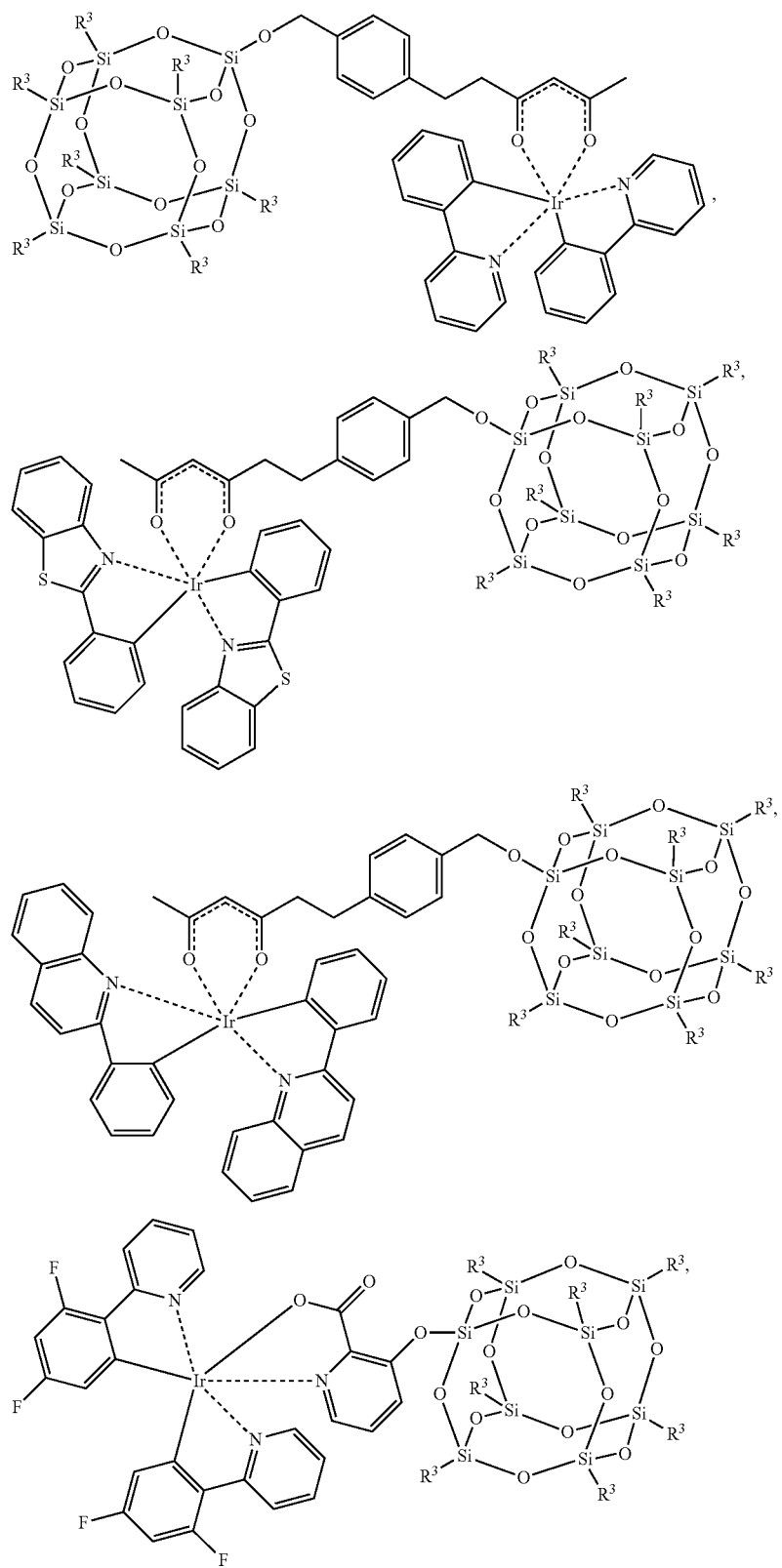

-continued
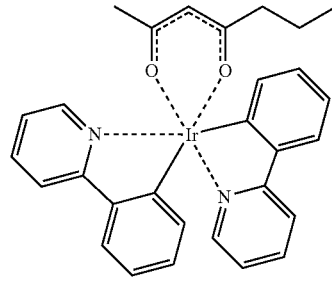 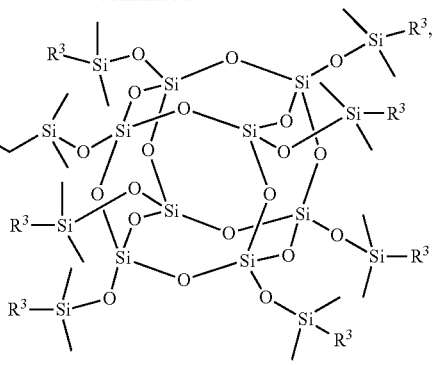
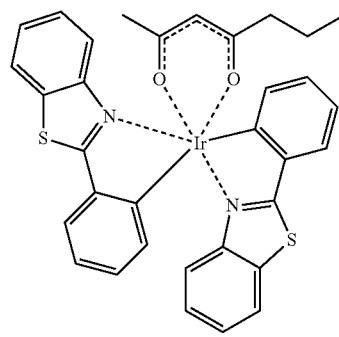 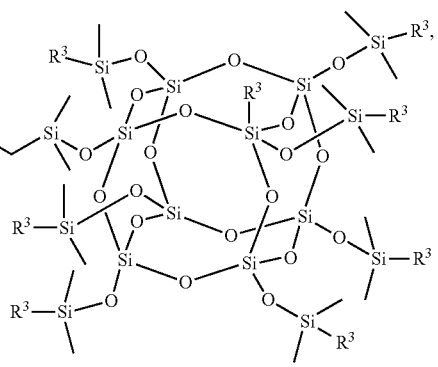
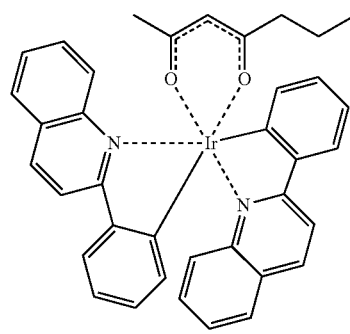 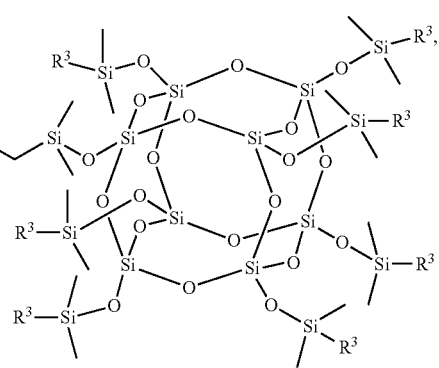
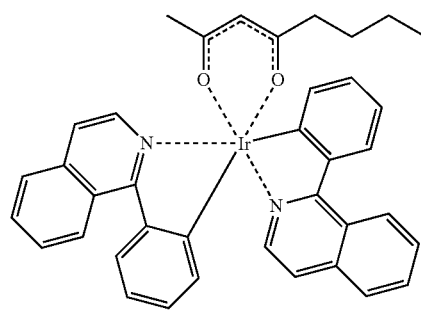 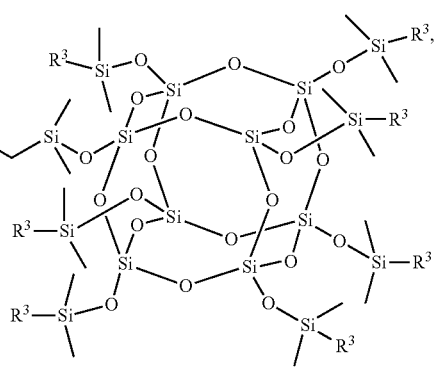

-continued
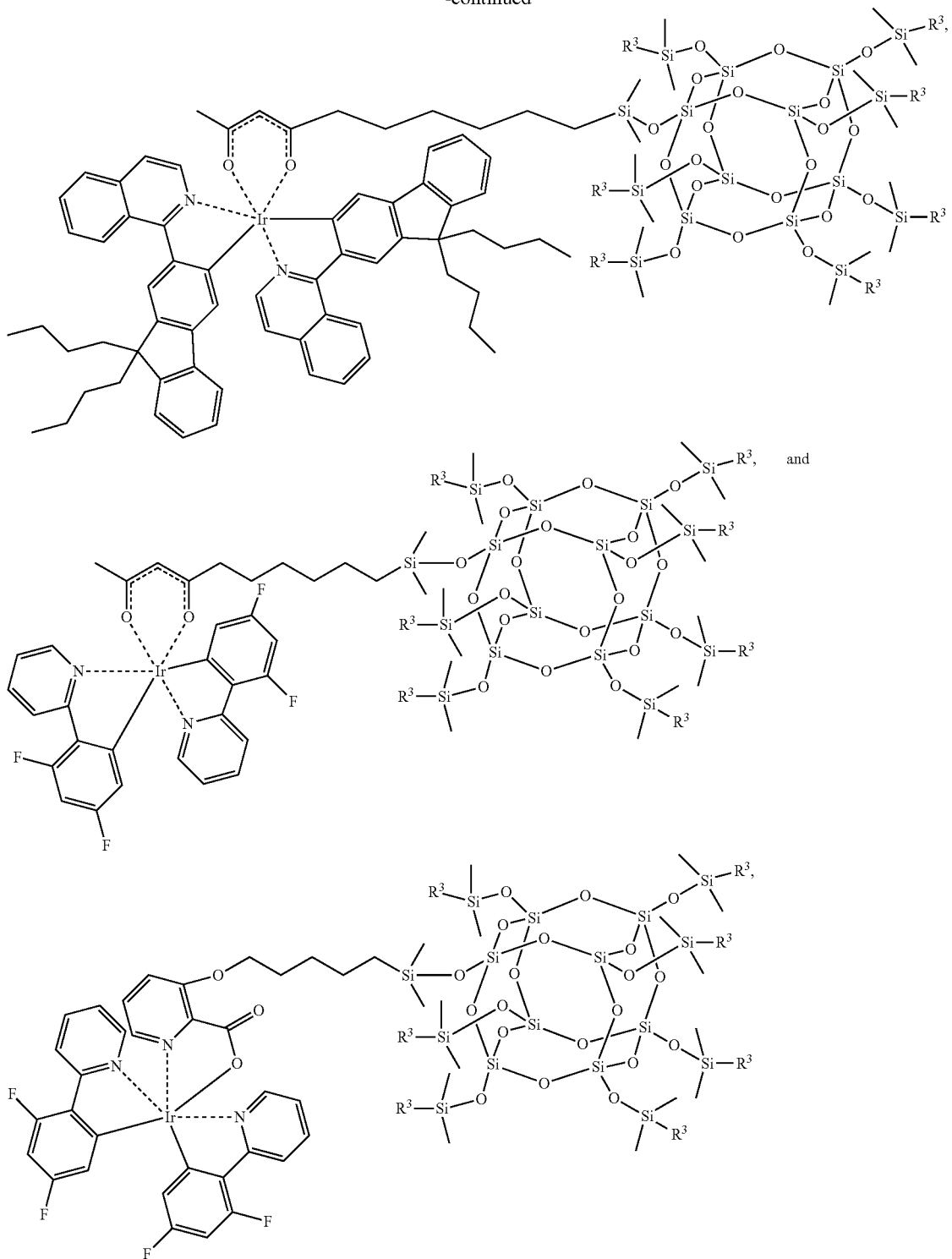
wherein R³ is the host having one of the following formulas
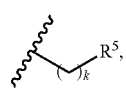

wherein k is 0 or an integer selected from 1 to 20, and $R^5$ can be selected from the following:
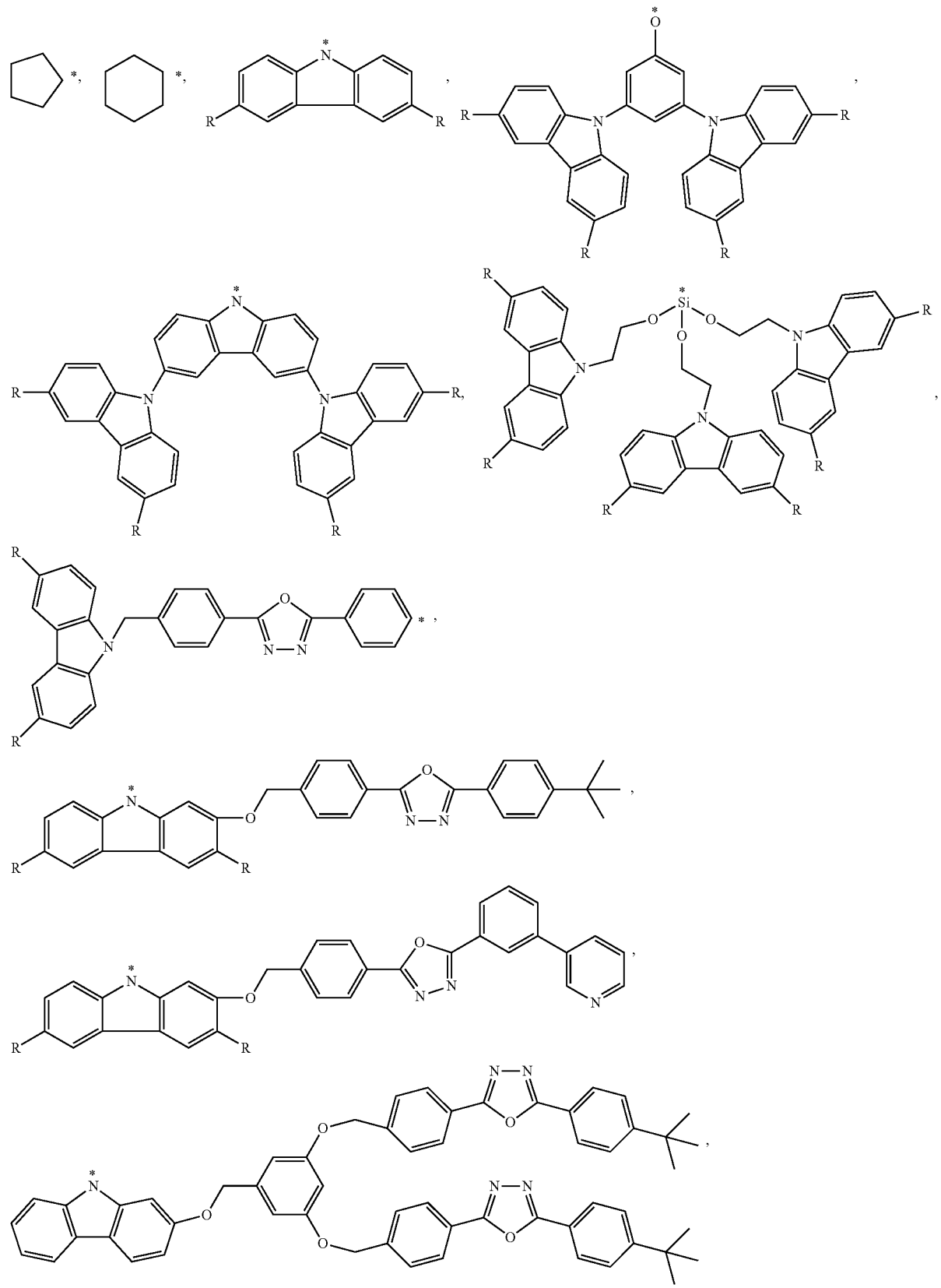

-continued
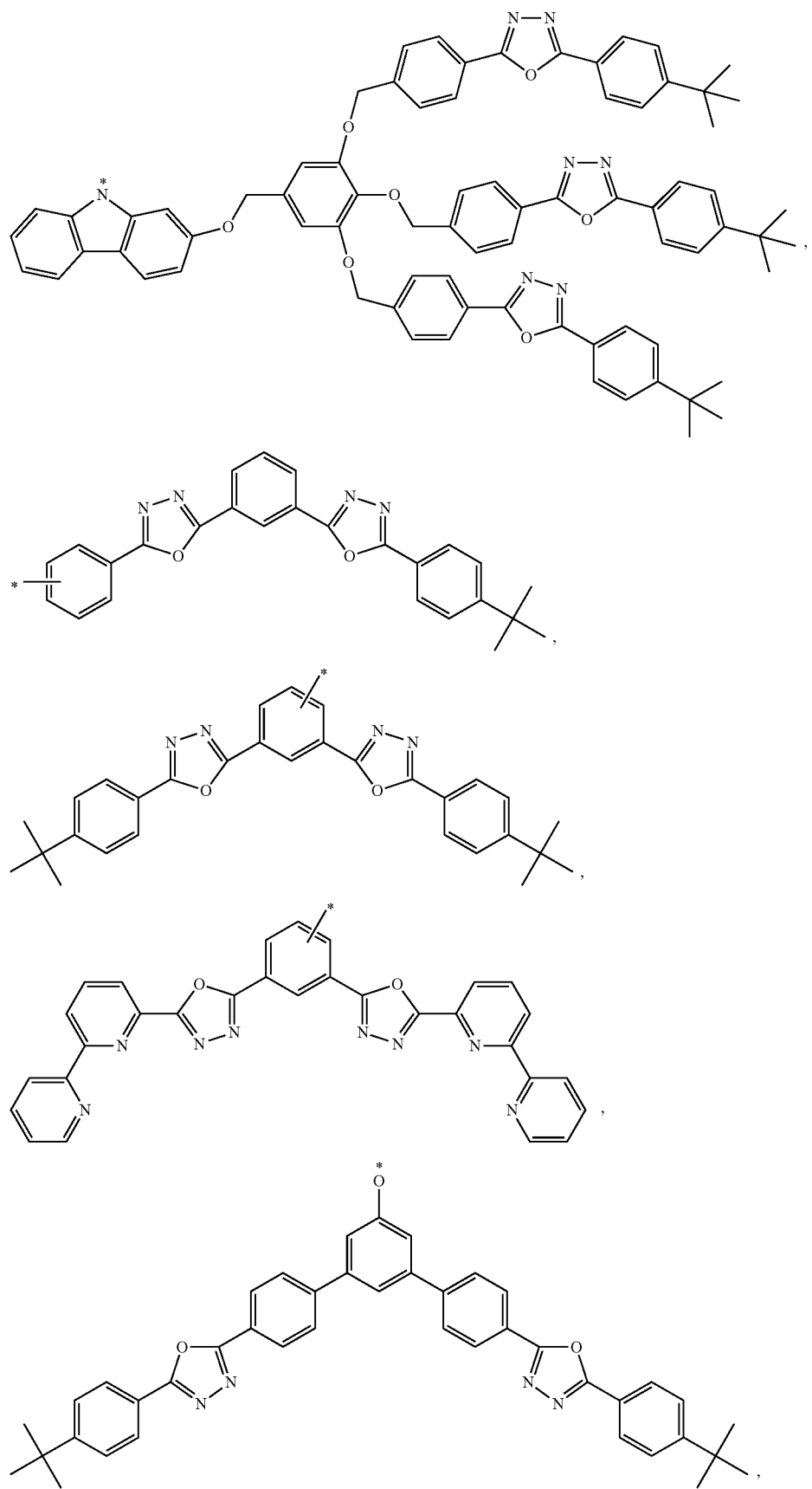

-continued
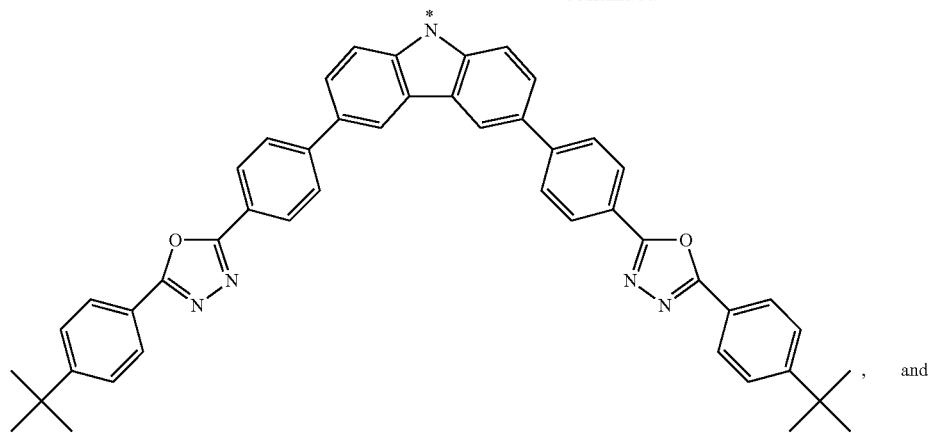
, and
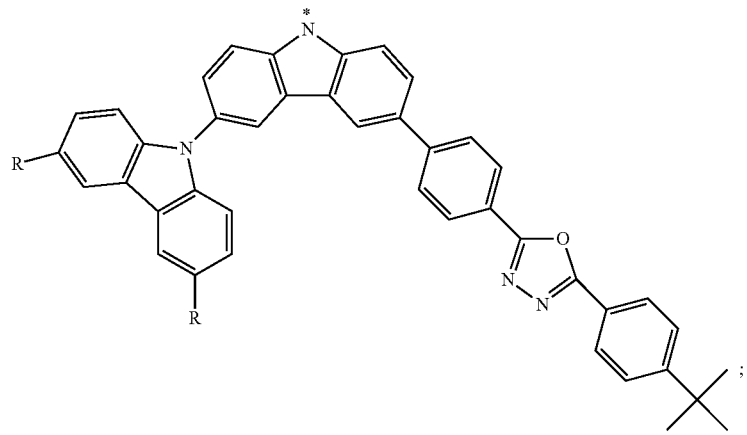
;
wherein R is independently selected from H or alkyl, and * indicates a point of attachment to the Si or the alkyl group in $R^3$.
In some embodiments, the iridium-functionalized nanoparticle or the emissive compound may be represented by the following formula:
Formula (IV)
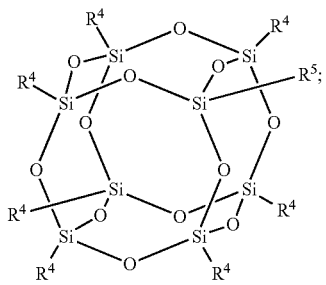
wherein each $R^4$ is independently selected from:
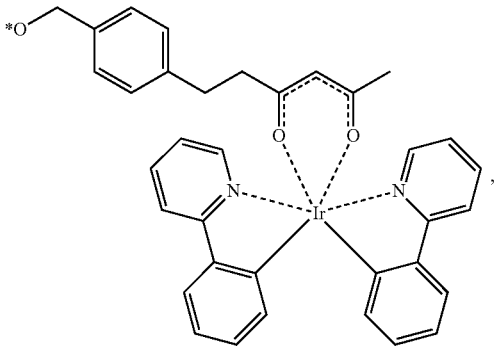
and $R^5$ is
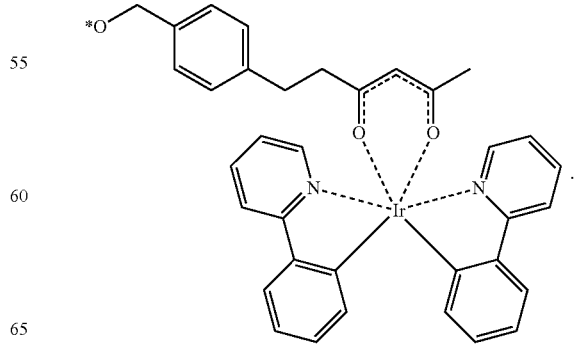

In some embodiments, the iridium-functionalized nanoparticle or the emissive compound may be represented by the following formula:

Formula (V)

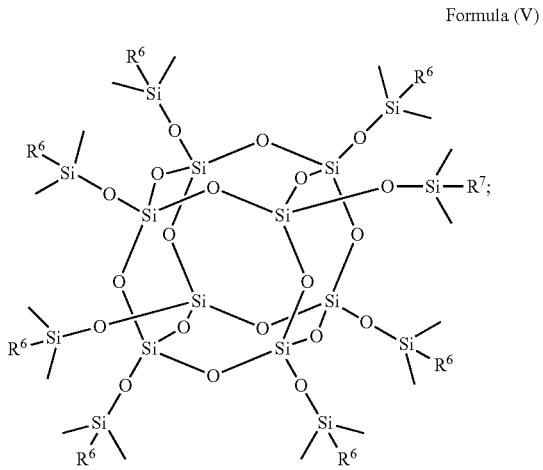

wherein each $R^4$ is independently selected from:

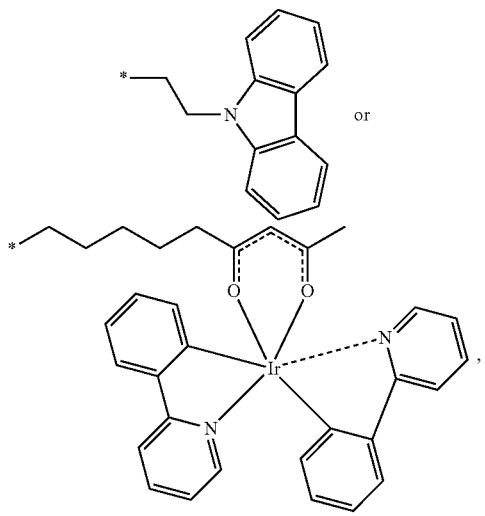

and $R^7$ is

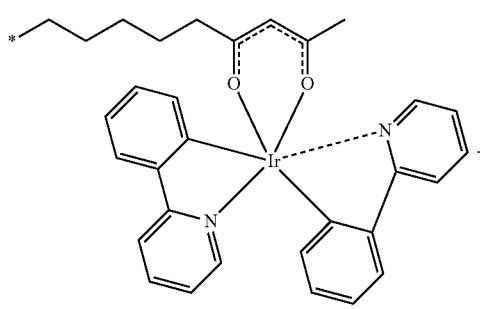

In some embodiments, the composition may further comprise a host material that is not attached to the nanoparticle core. Exemplary host materials are known to those skilled in the art. For example, the host material included in the light-emitting layer can be an optionally substituted compound selected from: an aromatic-substituted amine, an aromatic-substituted phosphine, a thiophene, an oxadiazole, 2-(4-biphenylyl)-5-(4-tert-butylphenyl)-1,3,4-oxadiazole (PBD), 1,3-bis(N,N-t-butyl-phenyl)-1,3,4-oxadiazole (OXD-7), a triazole, 3-phenyl-4-(1'-naphthyl)-5-phenyl-1,2,4-triazole (TAZ), 3,4,5-Triphenyl-1,2,3-triazole, 3,5-Bis(4-tert-butylphenyl)-4-phenyl[1,2,4]triazole, an aromatic phenanthroline, 2,9-dimethyl-4,7-diphenyl-phenanthroline (bathocuproine or BCP), 2,9-Dimethyl-4,7-diphenyl-1,10-phenanthroline, a benzoxazole, a benzothiazole, a quinoline, aluminum tris(8-hydroxyquinolate) (Alq3), a pyridine, a dicyanoimidazole, cyano-substituted aromatic, 1,3,5-tris(2-N-phenylbenzimidazolyl)benzene (TPBI), 4,4'-bis[N-(naphthyl)-N-phenyl-amino]biphenyl (α-NPD), N,N'-bis(3-methylphenyl)N,N'-diphenyl-[1,1'-biphenyl]-4,4'-diamine (TPD), 4,4'-bis[N,N'-(3-toly)amino]-3,3'-dimethylbiphenyl (M14), 4,4'-bis[N,N'-(3-tolyl)amino]-3,3'-dimethylbiphenyl (HMTPD), 1,1-Bis(4-bis(4-methylphenyl)aminophenyl)cyclohexane, a carbazole, 4,4'-N,N'-dicarbazole-biphenyl (CBP), poly(9-vinylcarbazole) (PVK), N,N'N''-1,3,5-tricarbazoloylbenzene (tCP), a polythiophene, a benzidine, N,N-bis(4-butylphenyl)-N,N'-bis(phenyl)benzidine, a triphenylamine, 4,4',4''-Tris(N-(naphthylen-2-yl)-N-phenylamino)triphenylamine, 4,4',4''-tris(3-methylphenylphenylamino)triphenylamine (MTDATA), a phenylenediamine, a polyacetylenes, and a phthalocyanine metal complex. It is understood to those skilled in the art that the groups described above as possible hosts can function as hole-transport materials or electron-transport materials.

In some embodiments, the electron transport compound in the composition may be, for examples, aluminum tris(8-hydroxyquinolate) (Alq3), 2-(4-biphenylyl)-5-(4-tert-butylphenyl)-1,3,4-oxadiazole (PBD), 1,3-bis(N,N-t-butyl-phenyl)-1,3,4-oxadiazole (OXD-7), 3-phenyl-4-(1'-naphthyl)-5-phenyl-1,2,4-triazole (TAZ), 2,9-dimethyl-4,7-diphenyl-phenanthroline (bathocuproine or BCP), and 1,3,5-tris[2-N-phenylbenzimidazol-z-yl]benzene (TPBI).

In some embodiments, the hole transport compound in the composition may be, for examples, 4,4'-bis[N-(naphthyl)-N-phenyl-amino]biphenyl (α-NPD), N,N'-bis(3-methylphenyl)N,N'-diphenyl-[1,1'-biphenyl]-4,4'-diamine (TPD), 4,4'-bis[N,N'-(3-tolyl)amino]-3,3'-dimethylbiphenyl (M14), 4,4',4''-tris(3-methylphenylphenylamino)triphenylamine (MTDATA), 4,4'-bis[N,N'-(3-tolyl)amino]-3,3'-dimethylbiphenyl (HMTPD), N,N'N''-1,3,5-tricarbazoloylbenzene (tCP), 4,4'-N,N'-dicarbazole-biphenyl (CBP), poly(9-vinylcarbazole) (PVK), 3,4,5-Triphenyl-1,2,3-triazole, 3,5-Bis(4-tert-butyl-phenyl)-4-phenyl [1,2,4]triazole, 2,9-Dimethyl-4,7-diphenyl-1,10-phenanthroline, 1,1-Bis(4-bis(4-methylphenyl)aminophenyl)cyclohexane, N,N'-bis(4-butylphenyl)-N,N'-bis(phenyl)benzidine, 4,4',4''-Tris(N-(naphthylen-2-yl)-N-phenylamino)triphenylamine, and copper phthalocyanine. In some embodiments, the hole transport compound may be a carbazole.

In some embodiments, the organic solvent in the composition may comprise a halogenated hydrocarbon. In some embodiments, the organic solvent is selected from the group consisting of chloroform, xylene, 1,3,-dichlorobenzene, 1,4-dichlorobenzene, 1,2-dicholorobenzene, ethylene dichloride, chlorobenzene, benzene, toluene, 1,2-dichloroethane, 4-methyl-2-pentanone and $C_{1-10}$ ketone. In some embodiments, the organic solvent is characterized by having a boiling temperature of greater than 180.5° C. In some embodiments, the organic solvent has a surface tension of greater than about 36.2 dyne/cm.

In some embodiments, a combination of organic solvents described above may be used together in the composition. The organic solvent may comprise a combination of two compounds selected from chloroform, xylene, 1,3,-dichlorobenzene, 1,4-dichlorobenzene, 1,2-dicholorobenzene, ethylene dichloride, chlorobenzene, benzene, toluene, 1,2-cicholorethane, 4-methyl-2-pentanone and $C_{1-10}$ ketone.

In some embodiments, the organic solvent in the composition may have a molecular weight ranged from about 70 to about 200 g/mol, or from about 85 to about 150 g/mol.

In some embodiments, the emissive compound may be present at a concentration of about 0.0001 wt % to about 10 wt %, about 0.001 wt % to about 5 wt %, about 0.01 wt % to about 1.5 wt %, or about 0.03 wt % to about 1.5 wt %.

In some embodiments, the electron transport compound may be present at a concentration of from about 0.1 wt % to about 10 wt %, 0.1 at % to about 1 wt %, about 0.46 wt %, or about 0.17 wt %.

In some embodiments, the hole transport compound may be present at a concentration of from about 0.1 wt % to about 5 wt %, or alternatively from about 0.1% to about 10%.

In some embodiments, the composition has a viscosity of from about 1 cP to about 20 cP or about 1 cP to about 10 cP at about 20° C.

The iridium-functionalized nanoparticles (i.e., emissive compound) can be prepared in various ways, e.g., by attaching the iridium-based complex to a nanoparticle core. A preferred method for making nanoparticles that emit light is illustrated herein. The covalent attachment of the iridium-complexes to the silsesquioxane nanoparticle core is preferably carried out in the general manner as described herein and in PCT WO 02/05971, which is hereby incorporated by reference. A preferred nanoparticle core is a silsesquioxane as shown in Formula (II), more preferably a 1,3,5,7,9,11,13,15-octakis(dimethylsilyloxy)pentacyclo-[9.5.1.1$^{3,9}$.1$^{5,15}$.1$^{7,13}$] octasiloxane as shown in Formula (III), both formulas are shown above.

Emissive compounds that emit various colors may be prepared by attaching one or more iridium-complexes to a nanoparticle core. An exemplary method for preparing the iridium-functionalized nanoparticles described herein is shown in Schemes 1a-c and 2a-d.

Scheme 1a

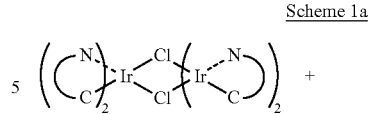

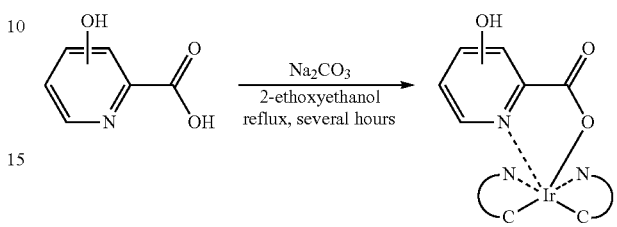

Scheme 1b

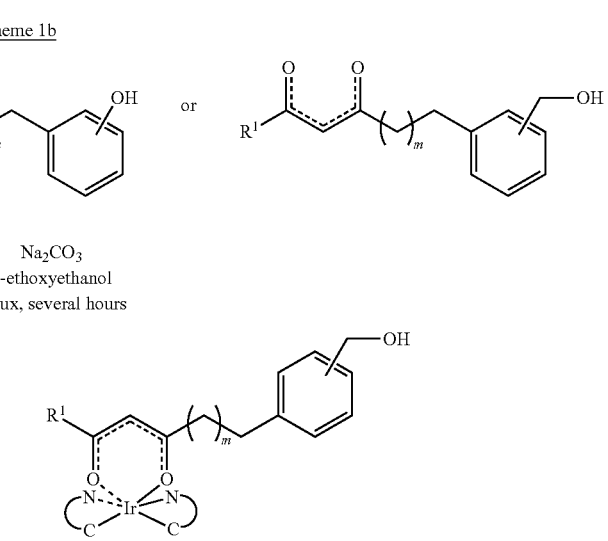

Scheme 1c

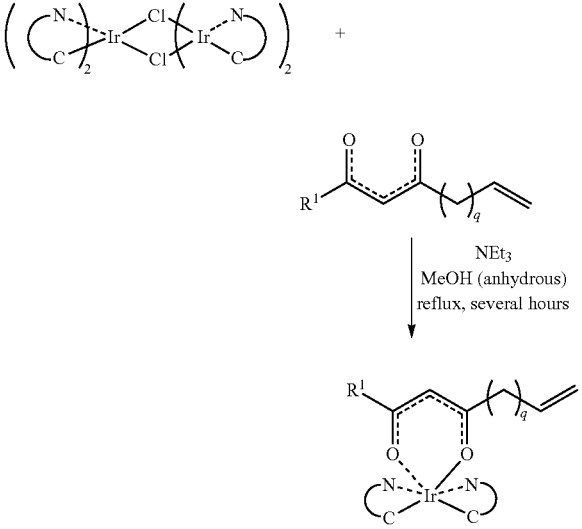

In Schemes 1a, 1b and 1c,
m, and $R^1$ are the same as described above, and q can be 0 or an integer in the range of 1 to 18.
Scheme 2a
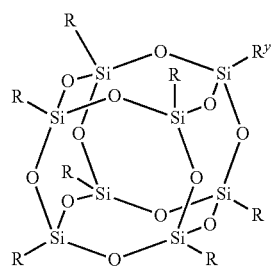
R = alkyl or cycloalkyl
$R^y$ = halogen
+
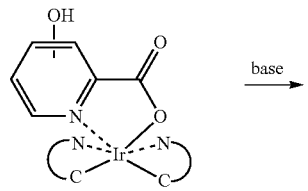
$\xrightarrow{\text{base}}$
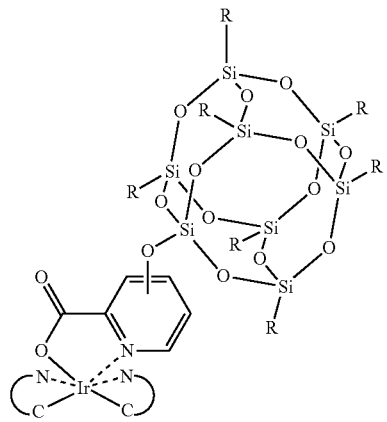
Scheme 2b
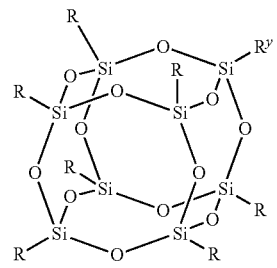
R = alkyl or cycloalkyl
$R^y$ = halogen
+
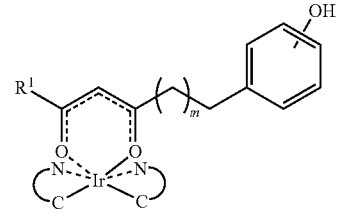
$\downarrow$ base
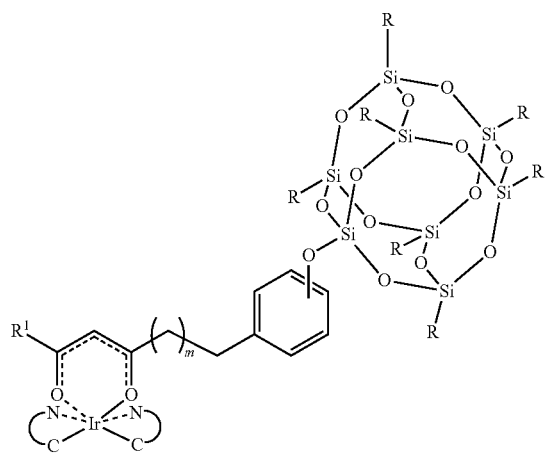

Scheme 2c
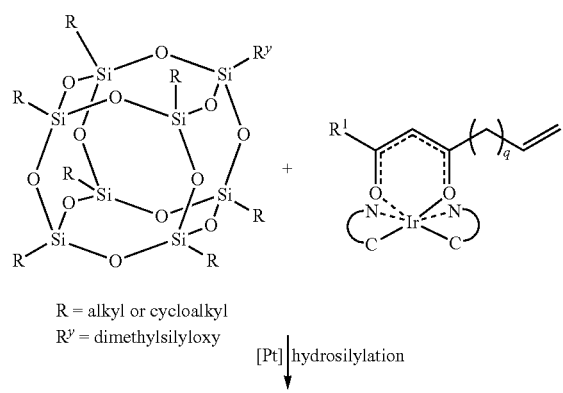
R = alkyl or cycloalkyl
R$^y$ = dimethylsilyloxy
[Pt] hydrosilylation ↓
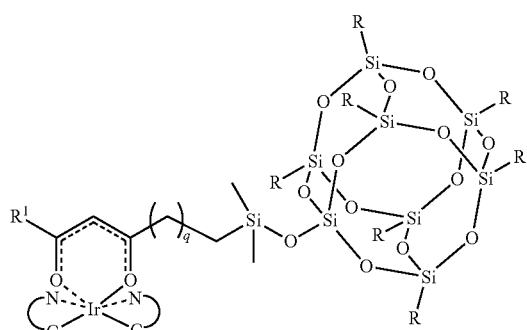
Scheme 2d
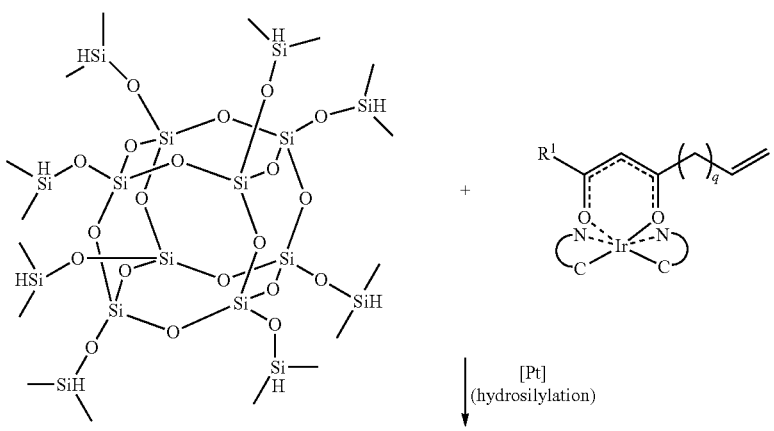
[Pt]
(hydrosilylation) ↓
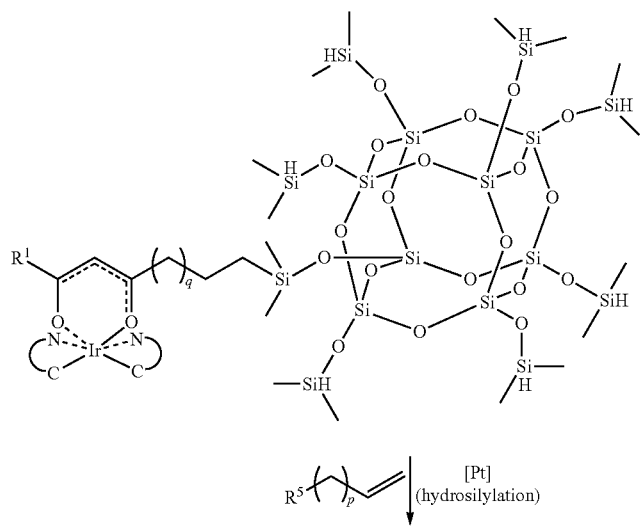
[Pt]
(hydrosilylation) ↓

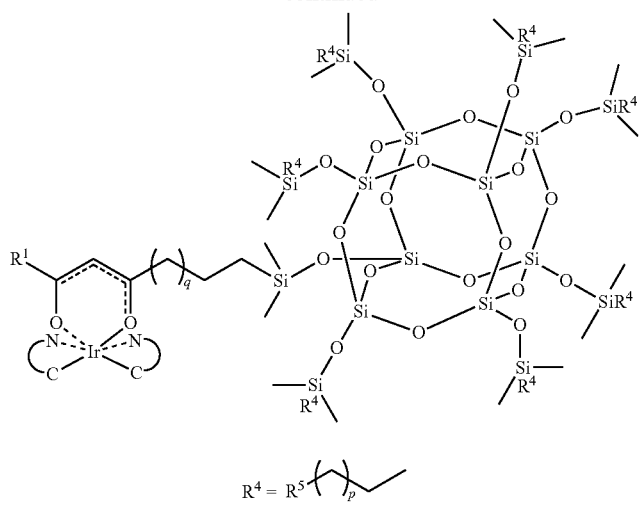
R⁴ = R⁵−(−)ₚ−
Scheme 2e
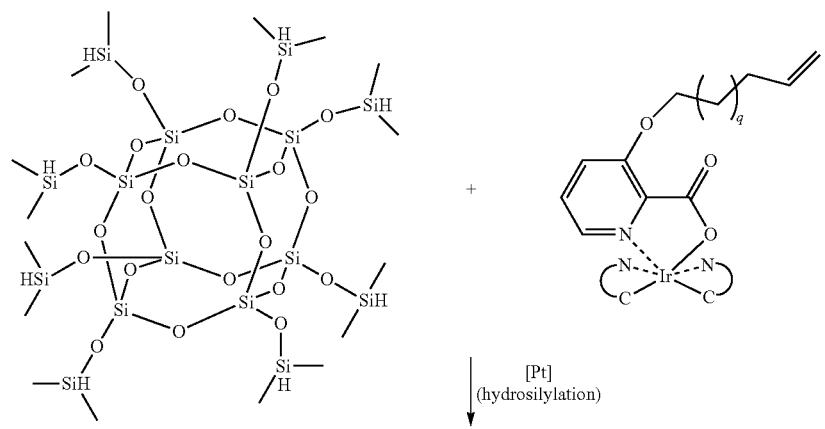
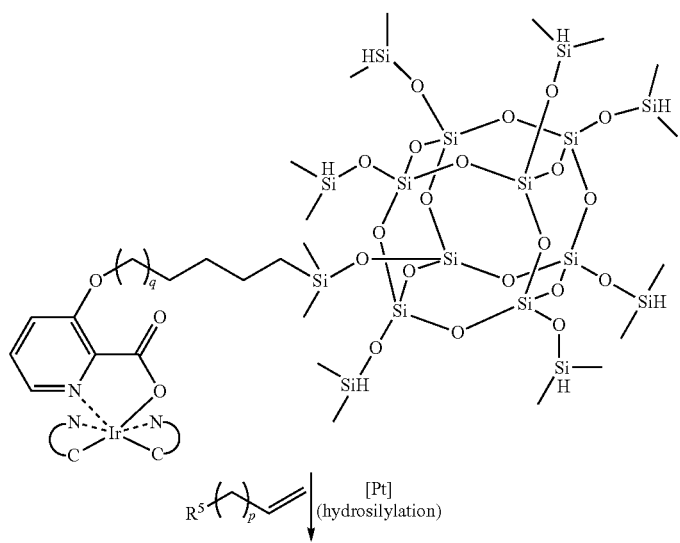

-continued
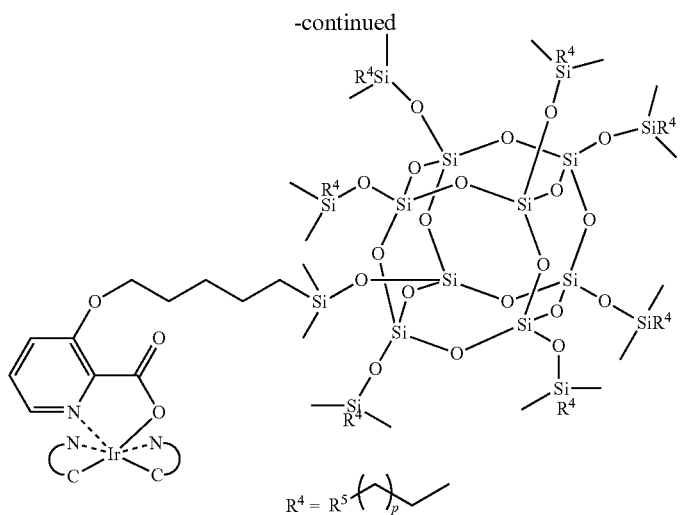
In Schemes 2a, 2b, 2c, 2d and 2e,
and $R^1$ are the same as described above, p and q can be 0 or an integer in the range of 1 to 18, and $R^5$ can be selected from the following:
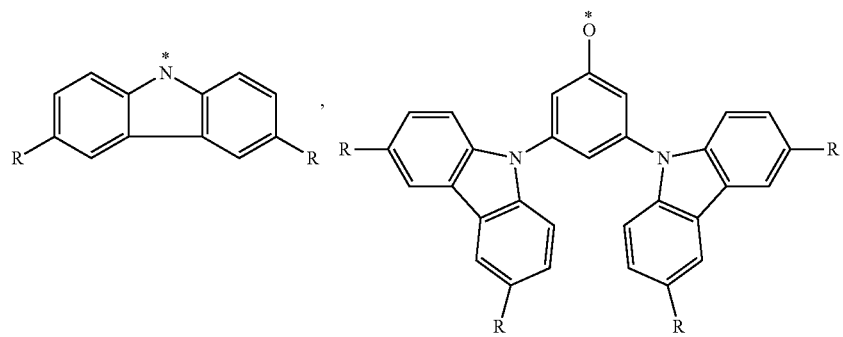
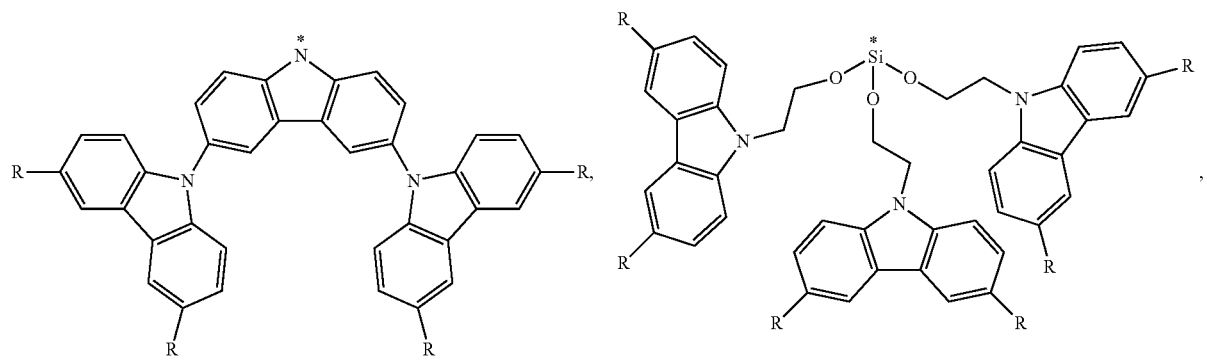

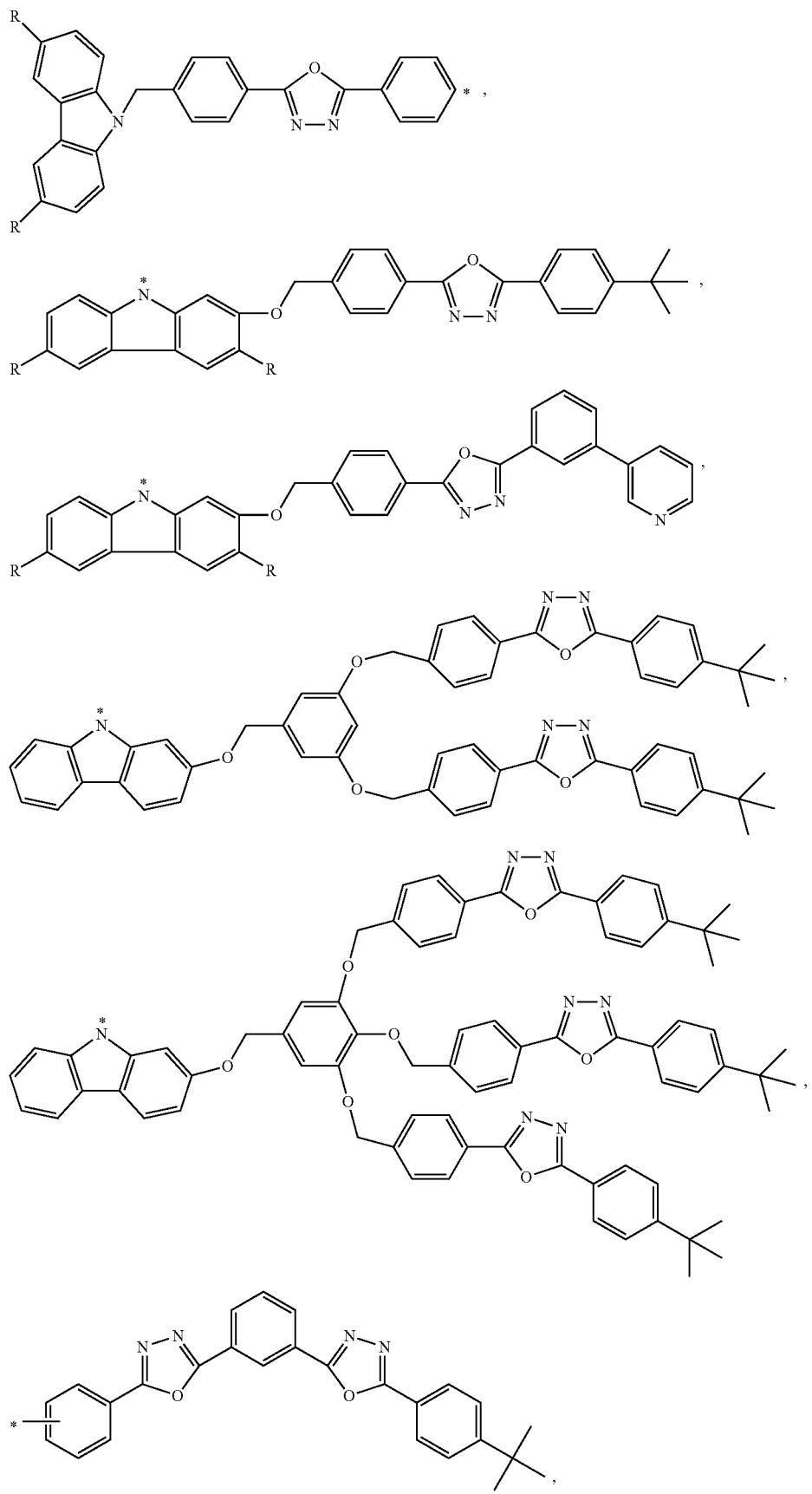

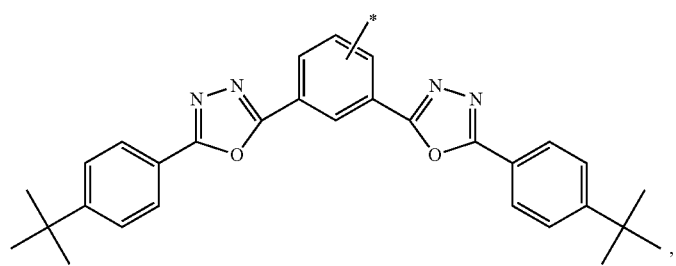
,
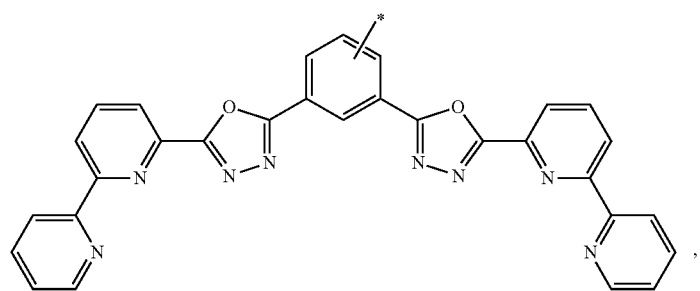
,
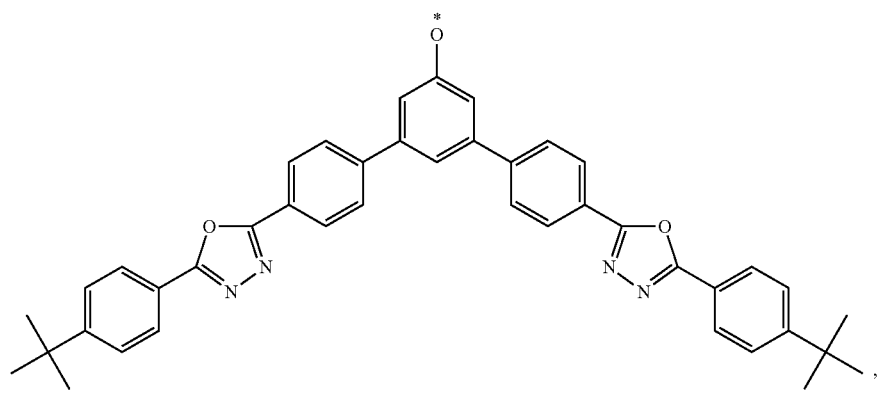
,
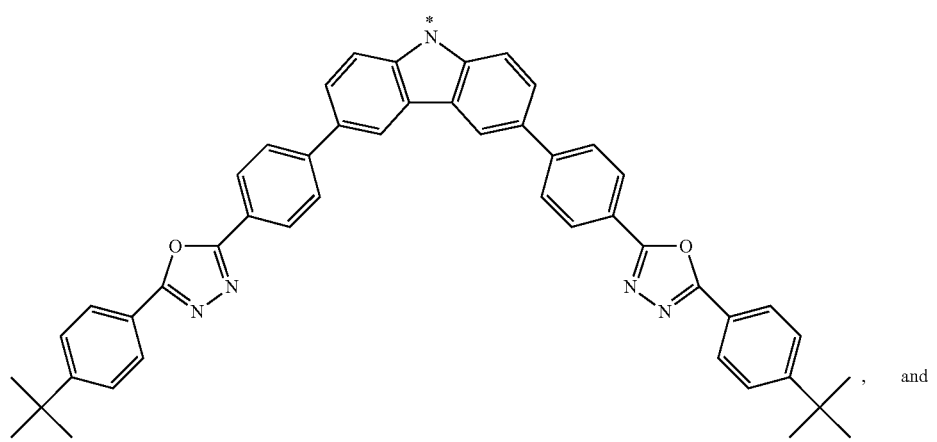
, and

-continued

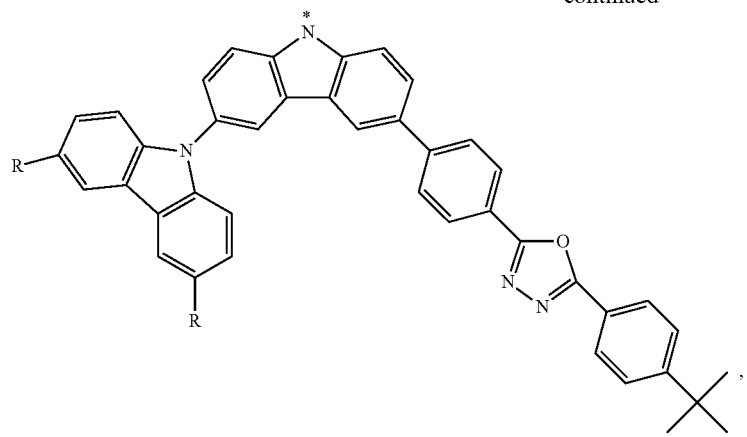

wherein R is independently selected from H or alkyl, and * indicates a point of attachment to the Si or the alkyl group in R⁴. Suitable bases are known to those skilled in the art. In one embodiment, an exemplary base is imidazole. For the hydrosilylation reaction, suitable [Pt] catalysts are known to those skilled in the art. In one embodiment, an exemplary [Pt] catalyst is platinum divinyltetramethyldisiloxane (Pt(dvs)).

Iridium-functionalized nanoparticles may be configured to emit various colors, depending on the identities of the iridium complexes. The iridium complex is preferably selected so that the resulting iridium-functionalized nanoparticles emit the desired color, (e.g., white light). Those skilled in the art recognize that the color emitted by the iridium-functionalized nanoparticles can be tuned by the appropriate choice of the iridium complex In an embodiment, the nanoparticle core can be a single silsesquioxane with a silsesquioxane core represented by Formula (II). The silsesquioxane core shown in Formula (II) has a relatively stiff cubical structure and the iridium complexes, represented by R' groups in Formula (II), can be attached at the vertices of the silsesquioxane. Although this invention is not bound by any theory of operation, it is believed that linking the iridium-complex onto the exterior surface of the nanoparticle core with attached host material with a covalent bond rather than direct incorporation of iridium-complexes into the host may substantially reduce the interaction between iridium-complexes and thus prevent aggregation. As a result, the emission of light by the iridium-functionalized nanoparticles described herein is improved. In addition, it is believed that the silsesquioxane core lends some thermal stability to the light-emitting compositions described herein. In one embodiment, an exemplary iridium-functionalized nanoparticles with a silsesquioxane core is shown below:

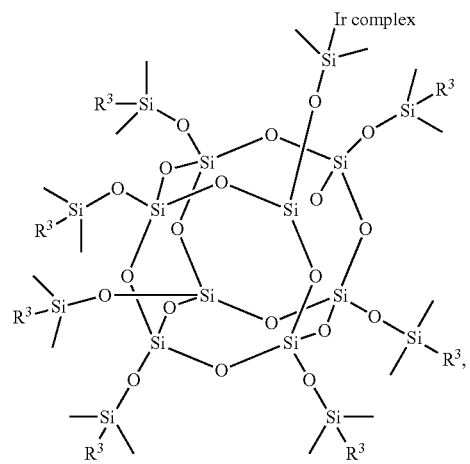

wherein "Ir complex" is an iridium-based complex and $R^3$ is as defined above.

The iridium-functionalized nanoparticles or emissive compounds described herein can be incorporated into light-emitting devices in various ways. For example, an embodiment provides a light-emitting device, comprising: an anode layer comprising a high work function metal; a cathode layer comprising a low work function metal; and a light-emitting layer positioned between, and electrically connected to, the anode layer and the cathode layer. The light-emitting layer comprises an iridium-functionalized nanoparticle or the composition thereof, as described herein. For example, in an embodiment, the light-emitting layer comprises phosphorescent emitting-functionalized nanoparticles such as iridium-functionalized nanoparticles. In an embodiment, the iridium-functionalized nanoparticle is represented by Formula (I). In an embodiment, the iridium-functionalized nanoparticle is an organic-inorganic iridium-functionalized nanoparticle. In an embodiment, the organic-inorganic iridium-functionalized nanoparticle comprises a nanoparticle core that comprises inorganic elements such as phosphorous (P), silicon (Si), and/or a metal. For example, in an embodiment a nanoparticle core comprises a moiety selected from the group consisting of a silsesquioxane, a cyclophosphazene, a triazine, a cyclodextrin, a calizarene, a phthalocyanine, and a silica particle.

The compositions described herein may comprise one or more iridium-functionalized nanoparticles (i.e., emissive compounds), an electron transport compound, and an organic solvent. In some embodiments, the compositions may further comprise a hole transport compound.

An anode layer may comprise a conventional material such as a metal, mixed metal, alloy, metal oxide or mixed-metal oxide, or a conductive polymer. Examples of suitable metals include the Group 1 metals, the metals in Groups 4, 5, 6, and the Group 8-10 transition metals. If the anode layer is to be light-transmitting, mixed-metal oxides of Group 12, 13, and 14 metals or alloys thereof, such as Au, Pt, and indium-tin-oxide (ITO), may be used. The anode layer may include an organic material such as polyaniline, e.g., as described in "Flexible light-emitting diodes made from soluble conducting polymer," Nature, vol. 357, pp. 477-479 (11 Jun. 1992). Examples of suitable high work function metals include but are not limited to Au, Pt, indium-tin-oxide (ITO), or alloys thereof. In an embodiment, the anode layer can have a thickness in the range of about 1 nm to about 1000 nm.

A cathode layer may include a material having a lower work function than the anode layer. Examples of suitable materials for the cathode layer include those selected from alkali metals of Group 1, Group 2 metals, Group 12 metals including rare earth elements, lanthanides and actinides, materials such as aluminum, indium, calcium, barium, samarium and magnesium, and combinations thereof. Li-containing organometallic compounds, LiF, and $Li_2O$ may also be deposited between the organic layer and the cathode layer to lower the operating voltage. Suitable low work function metals include but are not limited to μl, Ag, Mg, Ca, Cu, Mg/Ag, LiF/Al, CsF, CsF/Al or alloys thereof. In an embodiment, the cathode layer can have a thickness in the range of about 1 nm to about 1000 nm.

The amount of the emissive compounds in the composition can vary. In some embodiments, the amount of iridium-functionalized nanoparticles in the light-emitting composition layer can be in the range of from about 1% to about 100% by weight based on total weight of the light-emitting layer. In an embodiment, the amount of iridium-functionalized nanoparticles in the light-emitting layer can be in the range of from about 30% to about 70% by weight based on total weight of the light-emitting layer. In some embodiments, the amount of iridium-functionalized nanoparticles in the light-emitting layer can be in the range of from about 1% to about 10% by weight based on total weight of the light-emitting layer. In some embodiments, the light-emitting layer can have a thickness in the range of about 20 nm to about 150 nm.

If desired, additional layers may be included in the light-emitting device. Additional layers include an electron injection layer (EIL), electron transport layer (ETL), hole blocking layer (HBL), exciton blocking layer (EBL), hole transport layer (HTL), and/or hole injection layer (HIL). In an embodiment, the light-emitting device can include an electron injection layer e.g., between the cathode layer and the light emitting layer. The lowest un-occupied molecular orbital (LUMO) energy level of the material(s) that can be included in the electron injection layer is preferably high enough to prevent it from receiving an electron from the light emitting layer. The energy difference between the LUMO of the material(s) that can be included in the electron injection layer and the work function of the cathode layer is preferably small enough to allow efficient electron injection from the cathode. A number of suitable electron injection materials are known to those skilled in the art. Examples of suitable material(s) that can be included in the electron injection layer include but are not limited to, an optionally substituted compound selected from the following: aluminum quinolate ($Alq_3$), 2-(4-biphenylyl)-5-(4-tert-butylphenyl)-1,3,4-oxadiazole (PBD), phenanthroline, quinoxaline, 1,3,5-tris[N-phenyl-benzimidazol-z-yl]benzene (TPBI) a triazine, a metal chelate of 8-hydroxyquinoline such as tris(8-hydroxyquinoliate) aluminum, and a metal thioxinoid compound such as bis(8-quinolinethiolato) zinc.

Some embodiments described herein can include an electron transport layer positioned between the cathode and the emissive layer. Suitable electron transport materials are known to those skilled in the art. Exemplary electron transport materials that can be included in the electron transport layer are an optionally substituted compound selected from: aluminum tris(8-hydroxyquinolate) (Alq3), 2-(4-biphenylyl)-5-(4-tert-butylphenyl)-1,3,4-oxadiazole (PBD), 1,3-bis (N,N-t-butyl-phenyl)-1,3,4-oxadiazole (OXD-7), 3-phenyl-4-(1'-naphthyl)-5-phenyl-1,2,4-triazole (TAZ), 2,9-dimethyl-4,7-diphenyl-phenanthroline (bathocuproine or BCP), and 1,3,5-tris[2-N-phenylbenzimidazol-z-yl]benzene (TPBI).

In another embodiment, the device can include a hole blocking layer, e.g., between the cathode and the light-emitting layer. Various suitable hole blocking materials that can be included in the hole blocking layer are known to those skilled in the art. Suitable hole blocking material(s) include but are not limited to, an optionally substituted compound selected from the following: bathocuproine (BCP), 3,4,5-triphenyl-1, 2,4-triazole, 3,5-bis(4-tert-butyl-phenyl)-4-phenyl-[1,2,4] triazole, 2,9-dimethyl-4,7-diphenyl-1,10-phenanthroline, and 1,1-bis(4-bis(4-methylphenyl)aminophenyl)-cyclohexane.

In still another embodiment, the light-emitting device can include an exciton blocking layer, e.g., between the light-emitting layer and the anode. The band gap of the material(s) that comprise exciton blocking layer is preferably large enough to substantially prevent the diffusion of excitons. A number of suitable exciton blocking materials that can be included in the exciton blocking layer are known to those skilled in the art. Examples of material(s) that can compose an exciton blocking layer include an optionally substituted compound selected from the following: aluminum quinolate ($Alq_3$), 4,4'-bis[N-(naphthyl)-N-phenyl-amino]biphenyl (α-NPD), 4,4'-N,N'-dicarbazole-biphenyl (CBP), and bathocuproine (BCP), and any other material(s) that have a large enough band gap to substantially prevent the diffusion of excitons.

In yet still another embodiment, the light-emitting device can include a hole transport material. The hole transport material can be either as separate layer, or can be included in emissive layer, or can be simultaneously in both, depending on the need. If there is a hole transfer layer, it may be between the light-emitting layer and the anode. Suitable hole transport materials that can be included in the hole transport layer are known those skilled in the art. For example, hole transport material(s) that can be included in the hole transport layer are 4,4'-bis[N-(naphthyl)-N-phenyl-amino]biphenyl (α-NPD), N,N'-bis(3-methylphenyl)N,N'-diphenyl-[1,1'-biphenyl]-4, 4'-diamine (TPD), 4,4'-bis[N,N'-(3-tolyl)amino]-3,3'-dimethylbiphenyl (M14), 4,4'-4'-tris(3-methylphenylphenylamino)triphenylamine (MTDATA), 4,4'-bis[N,N'-(3-tolyl) amino]-3,3'-dimethylbiphenyl (HMTPD), N,N'N"-1,3,5-tricarbazoloylbenzene (tCP), 4,4'-N,N'-dicarbazole-biphenyl (CBP), poly(9-vinylcarbazole) (PVK), 3,4,5-Triphenyl-1,2, 3-triazole, 3,5-Bis(4-tert-butyl-phenyl)-4-phenyl [1,2,4]triazole, 2,9-Dimethyl-4,7-diphenyl-1,10-phenanthroline, 1,1-Bis(4-bis(4-methylphenyl)aminophenyl)cyclohexane, a carbazole, a polythiophene, a benzidine, N,N'-bis(4-butylphenyl)-N,N'-bis(phenyl)benzidine, a triphenylamine, a phenylenediamine, 4,4',4"-Tris(N-(naphthylen-2-yl)-N-phenylamino)triphenylamine, an oxadiazole, a polyacetylene and a phthalocyanine metal complex.

In an embodiment, the light-emitting device can include a hole injection layer, e.g., between the light-emitting layer and the anode. Various suitable hole injection materials that can be included in the hole injection layer are known to those skilled in the art. Exemplary hole injection material(s) include an optionally substituted compound selected from the following: a polythiophene derivative such as poly(3,4-ethylenedioxythiophene (PEDOT)/polystyrene sulphonic acid (PSS), a benzidine derivative such as N,N,N',N'-tetraphenyl-benzidine, poly(N,N'-bis(4-butylphenyl)-N,N'-bis(phenyl) benzidine), a triphenylamine or phenylenediamine derivative such as N,N'-bis(4-methylphenyl)-N,N'-bis(phenyl)-1,4-phenylenediamine, 4,4',4"-tris(N-(naphthylen-2-yl)-N-phenylamino)triphenylamine, an oxadiazole derivative such as 1,3-bis(5-(4-diphenylamino)phenyl-1,3,4-oxadiazol-2-yl) benzene, a polyacetylene derivative such as poly(1,2-bis-benzylthio-acetylene), or a phthalocyanine metal complex derivative such as phthalocyanine copper. Hole-injection materials while still being able to transport holes are distinguished from conventional hole-transport materials in that hole injection materials have a hole mobility substantially less than the hole mobility of conventional hole transport materials.

Those skilled in the art recognize that the various materials described above can be incorporated in several different layers depending on the configuration of the device. Preferably, the materials used in each layer are selected to result in the recombination of the holes and electrons in the light-emitting layer. The electron injection layer (EIL), electron transport layer (ETL), hole blocking layer (HBL), exciton blocking layer (EBL), hole transport layer (HTL), and hole injection layer (HIL) can be added to the light-emitting device using methods known to those skilled in the art (e.g., vapor deposition).

Light-emitting devices comprising an emissive compound can be fabricated using techniques known in the art, as informed by the guidance provided herein. For example, a glass substrate can be coated with a high work functioning metal such as ITO which can act as an anode. After patterning the anode layer, a emissive layer that includes the iridium-functionalized nanoparticles or emissive compounds can be formed on the anode. The cathode layer, comprising a low work functioning metal (e.g., Mg:Ag), can then be vapor evaporated onto the light-emitting composition layer. If desired, the device can also include an electron transport/injection layer, a hole blocking layer, a hole injection layer, an exciton blocking layer and/or a second emissive layer that can be added to the device using techniques known in the art, as informed by the guidance provided herein. In a preferred embodiment, the composition disclosed herein may be printed using an ink jet printer for making the light-emitting device. As a result, the manufacture of the OLED device becomes much easier.

In some embodiments, a method of fabricating an organic light-emitting device comprises the following steps: providing an electrically conductive substrate (e.g., ITO), depositing the composition described above over the electrically conductive substrate by a printing process, and heating the emissive layer and the substrate in an inert atmosphere to form an emissive layer. The composition may have a viscosity of about 1 to about 10 cP or alternatively about 1 to about 20 cP at 20° C. In some embodiments, the composition may also have a surface tension of about 10 to about 50 dyne/cm, or alternatively about 32 to about 41 dyne/cm. In some embodiment, the method may further comprise depositing a hole-blocking layer over said emissive layer and depositing a cathode on said hole-blocking layer.

In some embodiments, the deposited emissive layer has a roughness of less than about 51 nm root-mean-square (RMS), less than about 24 nm RMS, or in the range of about 3 to about 5 nm RMS. Roughness is determined by optical interferometry edge scans. The light-emitting device fabricated using the printable composition can provide a luminescence in excess of about 5000 cd/m$^2$, or even over about 10,000 cd/m$^2$.

The light-emitting devices described herein can be configured to emit various colors of light. In an embodiment, two or more emissive compounds can be combined in different ratios to produce a color of light. In another embodiment, one or more iridium-functionalized nanoparticles can be combined with one or more other type of light-emitting compounds to produce a color of light. For example, blue emitting iridium-functionalized nanoparticles and orange emitting compound(s) (e.g., orange iridium-functionalized nanoparticles) can be placed in the light-emitting layer to produce white light. In some of the embodiments described herein the light-emitting composition is configured to emit light such as blue, green, orange, red and white.

Without being bound by any particular theory or operation, it is believed that the incorporation of hole-transport or electron-transport moieties onto the nanoparticle core as hosts can increase the charge mobility, and/or balance the hole-transport or electron-transport inside the device. The direct attachment of the host to the nanoparticle core can further improve the compatibility between hole-transport or electron-transport moieties (i.e., host) and emissive dopant (i.e., Ir complex) or reduce the possibility of phase separation.

In some embodiments, exemplary lumophore-functionalized nanoparticles with a silsesquioxane core are shown below:

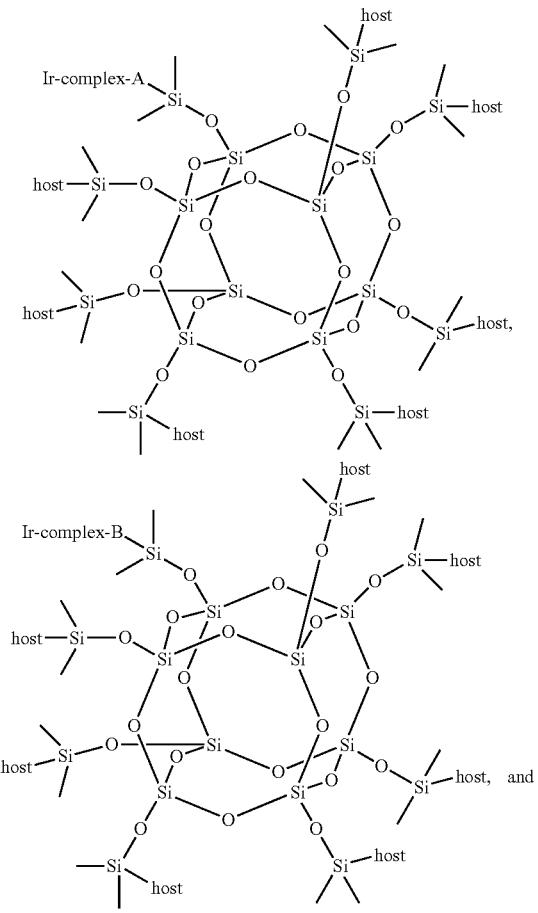

-continued

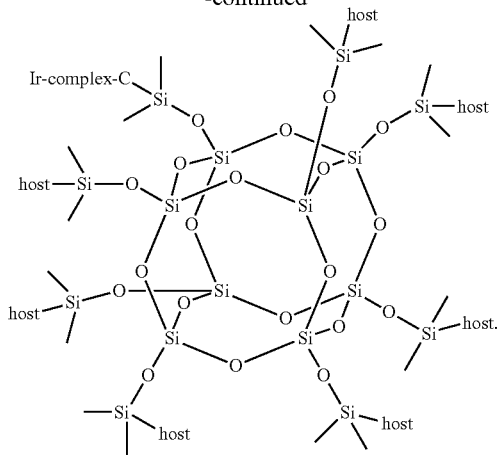

The Ir-complex-A, Ir-complex-B and Ir-complex-C represent three different Ir-complexes that can be any of the Ir-complexes described above. The "host" is also the same as defined above. By mixing different ratio of the three red-green-blue host/lumophore-functionalized nanoparticles, one embodiment of light-emitting device may emit white or near white light.

An embodiment provides a light-emitting composition that includes a mixture of different host/lumophore-functionalized nanoparticles. In some embodiments, the light-emitting composition may comprise one or more compound of formula (I) as defined above. In some embodiments, the light emitting composition may be a mixture of two or more compounds selected from the following group:

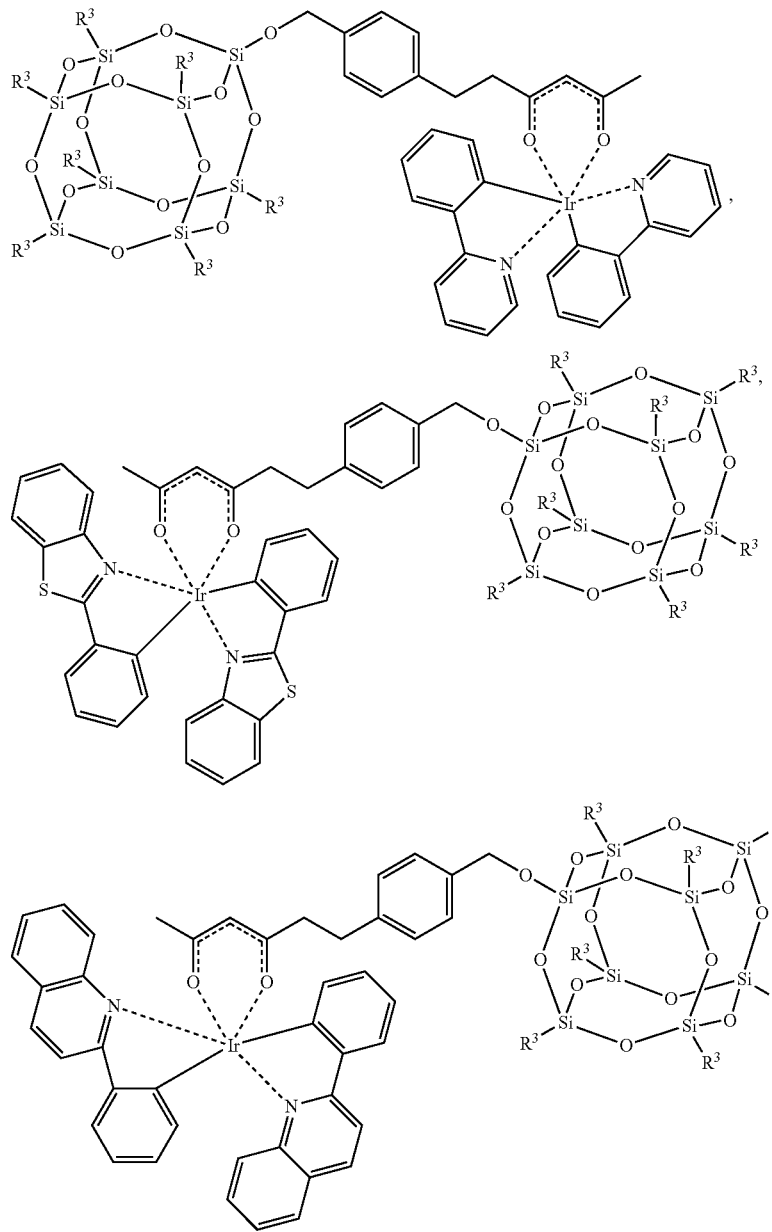

-continued
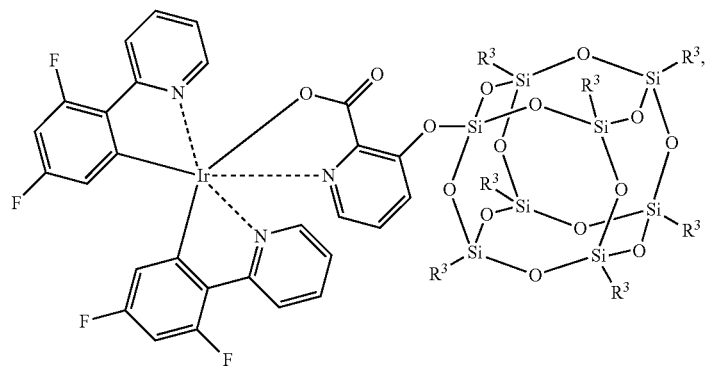
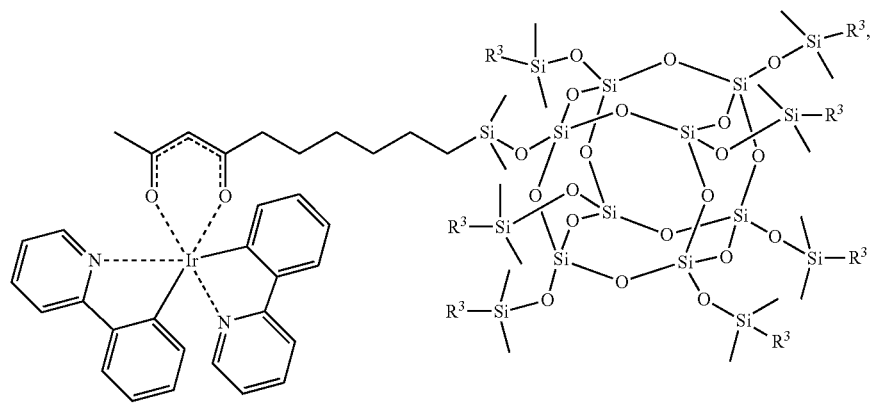
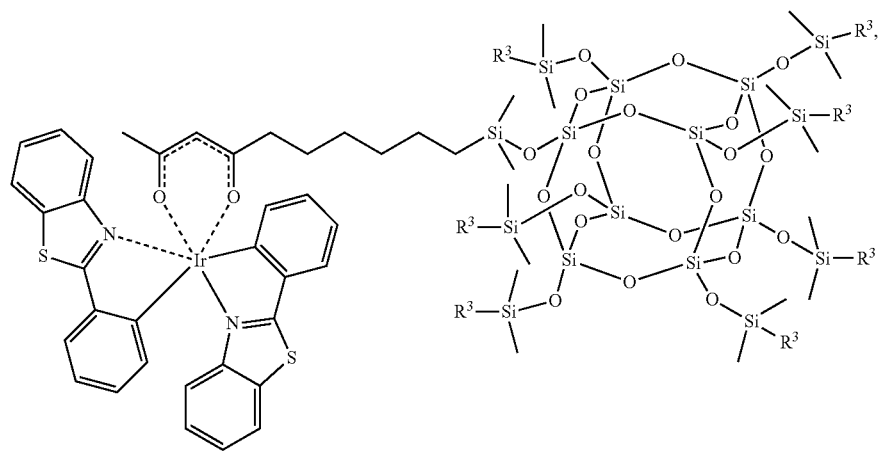
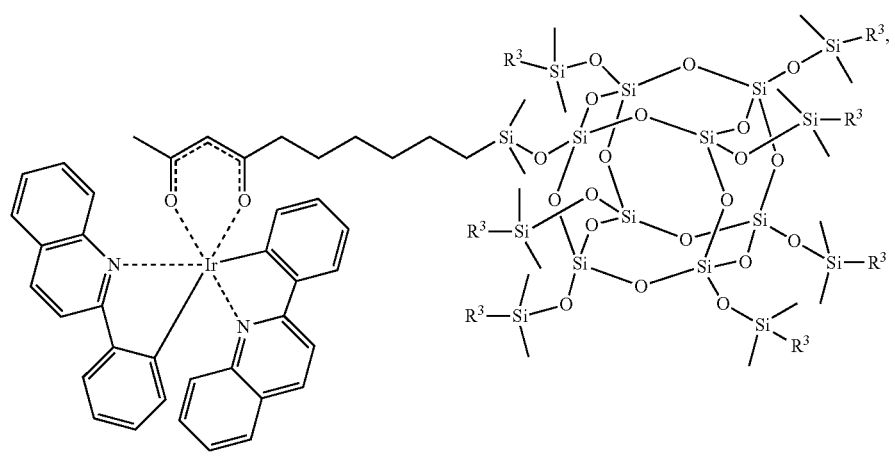

-continued
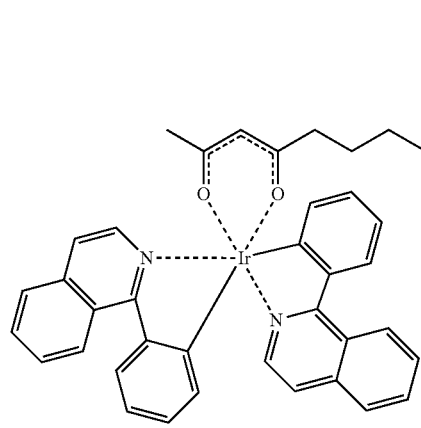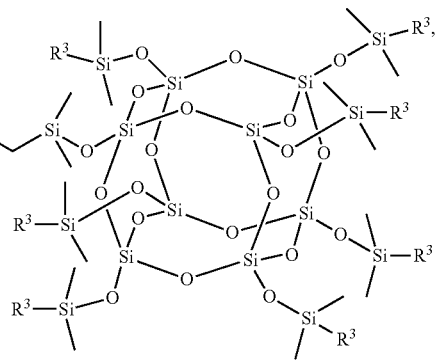
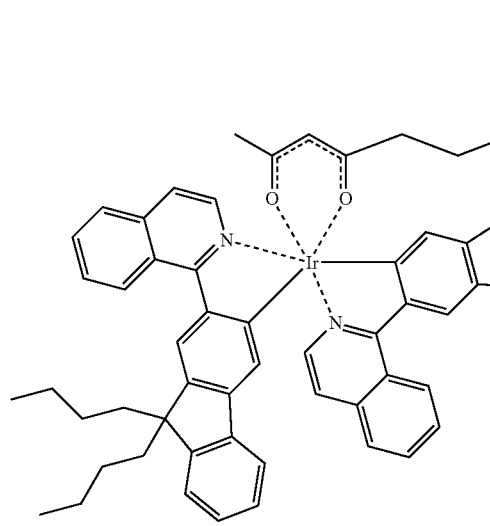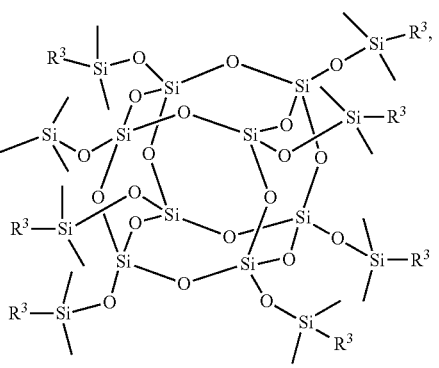
and
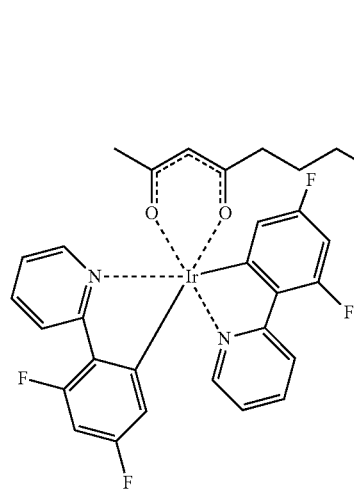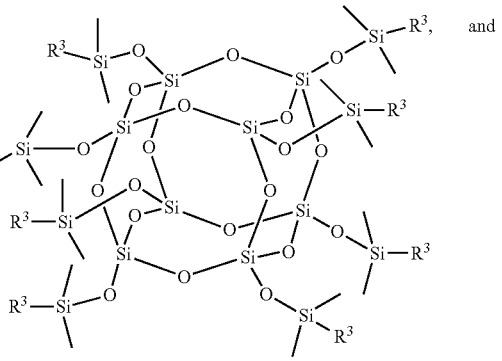

-continued
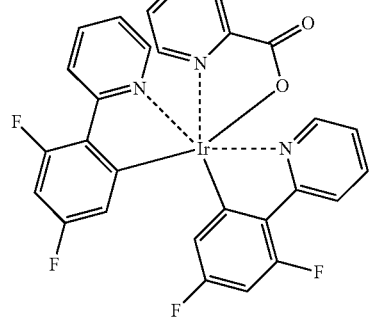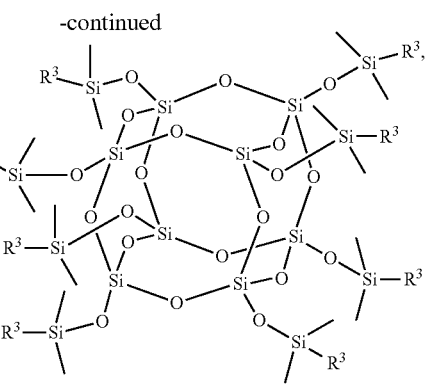
wherein R³ is the host having the formula
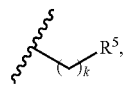
wherein k is 0 or an integer selected from 1 to 20 and R⁵ can be selected from the following:
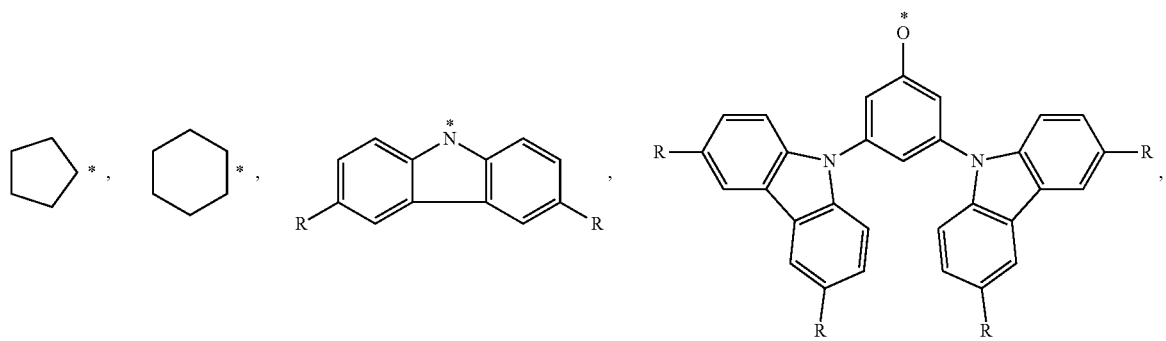
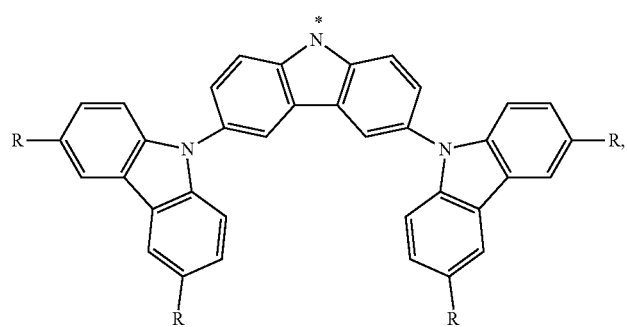

71
-continued
72
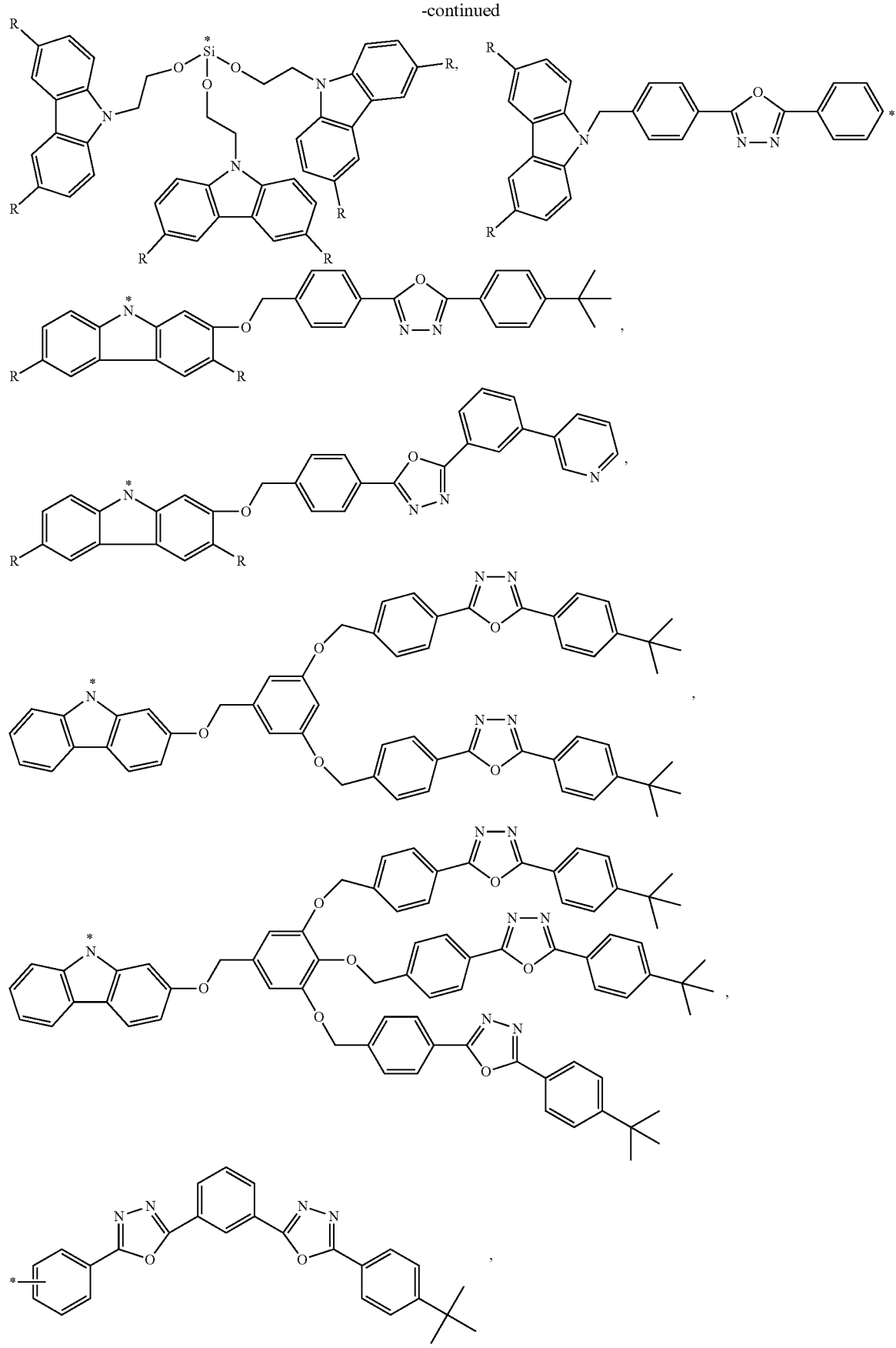

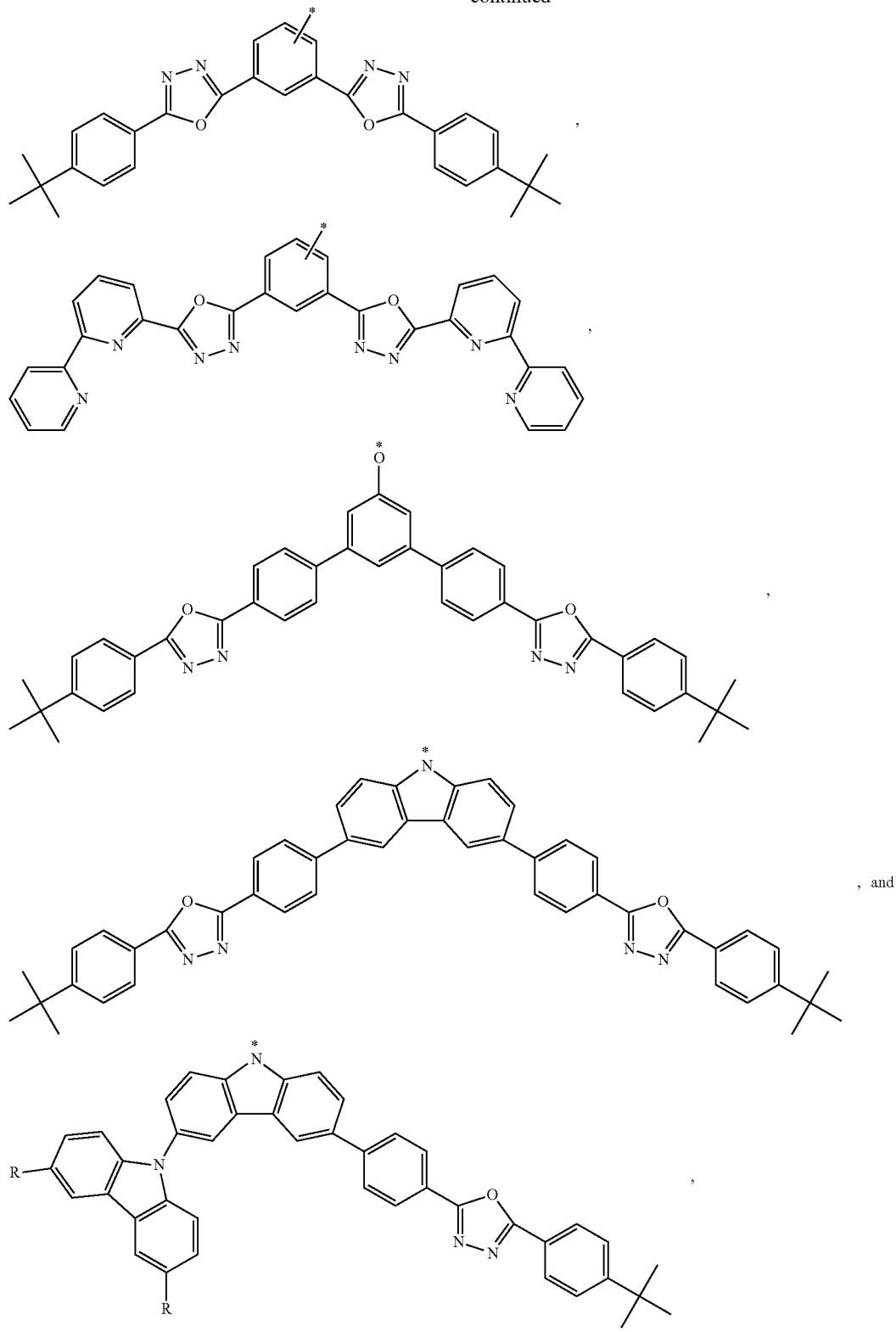

wherein R is independently selected from H or alkyl, and * indicates a point of attachment to the Si or the alkyl group in R³.

In some embodiments, the identities of the lumophores and the relative ratio of lumophores to host groups can be selected to as to have a CRI value in the range of about 60 to about 100, about 80 to about 100, or greater than 70.

Some of the embodiments comprise at least one host attached to the core, wherein the host is independently selected from a hole transport material or an electron transport material. In these embodiments, there may be several hosts. For example, 1, 2, 3, 4, or more hosts may be present. Since the hosts are independently selected, multiple hosts may be the same or different. For example all hosts may be the same hole transport material or all hosts may be the same electron transport material. Additionally, one or more hosts may be a different hole transport material from one or more other hosts. Similarly, one or more hosts may be a different electron transport material from one or more other hosts. Furthermore, one or more hosts may be one more electron transport materials, and one or more hosts may be one or more hole transport materials, where all are attached to a single core.

For example, a compound represented by Formula (IV) may have 1, 2, 3, or more $R^4$ groups that are:

and 1, 2, 3, or more $R^4$s that are:

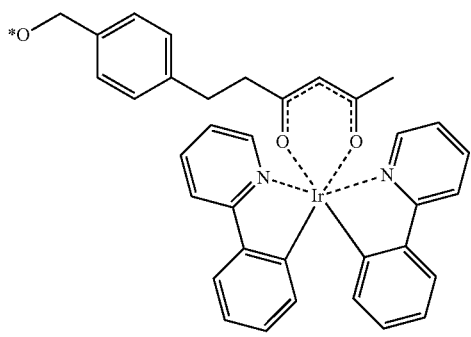

Alternatively, all of the $R^4$ moieties of the compound represented by Formula (IV) may be:

Alternatively, all of the $R^4$ moieties of the compound represented by Formula (IV) may be:

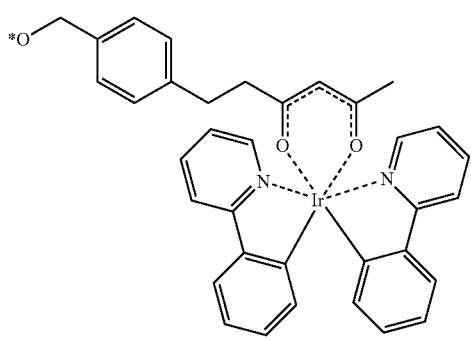

Different substitution patterns for the combinations of $R^4$ are also possible.

Similarly, for example, the compound represented by Formula (V) may have:
1, 2, 3, or more $R^4$ groups that are:

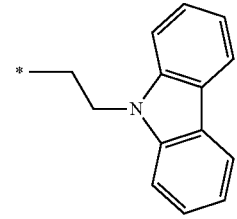

and 1, 2, 3, or more $R^4$ groups that are:

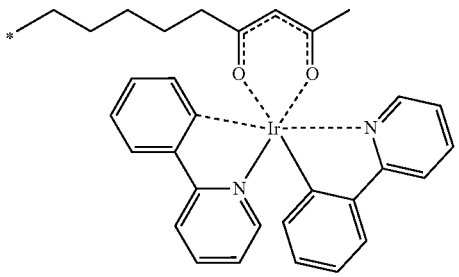

Alternatively, all of the $R^6$ moieties of the compound represented by Formula (IV) may be:

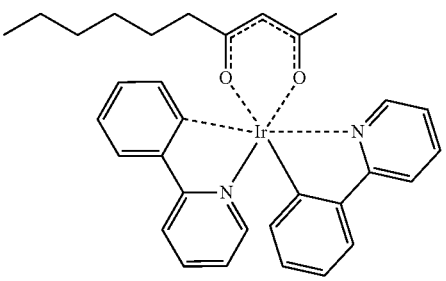

Different substitution patterns for the combinations of $R^6$ are also possible.

Any of the compositions disclosed above may be used in a method of fabricating a light-emitting device comprising depositing the composition upon an electrically conductive substrate via an inkjet printer.

The compounds used in the compositions disclosed herein may be prepared by methods described in U.S. patent application Ser. No. 12/167,127, entitled LIGHT EMITTING DEVICES AND COMPOSITIONS filed Jul. 2, 2008 on behalf of inventors HYUN SIK CHAS, et. al., which is incorporated by reference in its entirety herein. The compositions described herein may also be used to prepare devices such as those described in U.S. Ser. No. 12/167,127.

EXAMPLES

Representative embodiments will now be described, including how such embodiments may be made. It is understood that the methods, materials, conditions, process parameters, apparatus and the like do not necessarily limit the scope of the invention.

All chemicals, solvents, and reagents were purchased from Aldrich and ACROS ORGANICS and used without further purification. All procedures involving $IrCl_3 \cdot H_2O$ or any other Ir(III) species were carried out in inert gas atmosphere despite the air stability of the compounds, the main concern being their oxidative stability and stability of intermediate complexes at high temperature. $^1H$ and $^{13}C$ NMR data were measured at room temperature on a 400 MHz (100 MHz for $^{13}C\{1H\}$) in $CDCl_3$ or $(CD_3)_2CO$. UV-vis spectra were recorded on a Perkin-Elmer UV-vis Lambda spectrometer and were recorded as solution in spectroscopic grade chloroform or dichloromethane. Mass spectra were recorded on a Brummer Daltonics microflex LT. Melting and decomposition temperatures were measured on a Perkin-Elmer differential scanning calorimeter Pyris 1.

Example 1

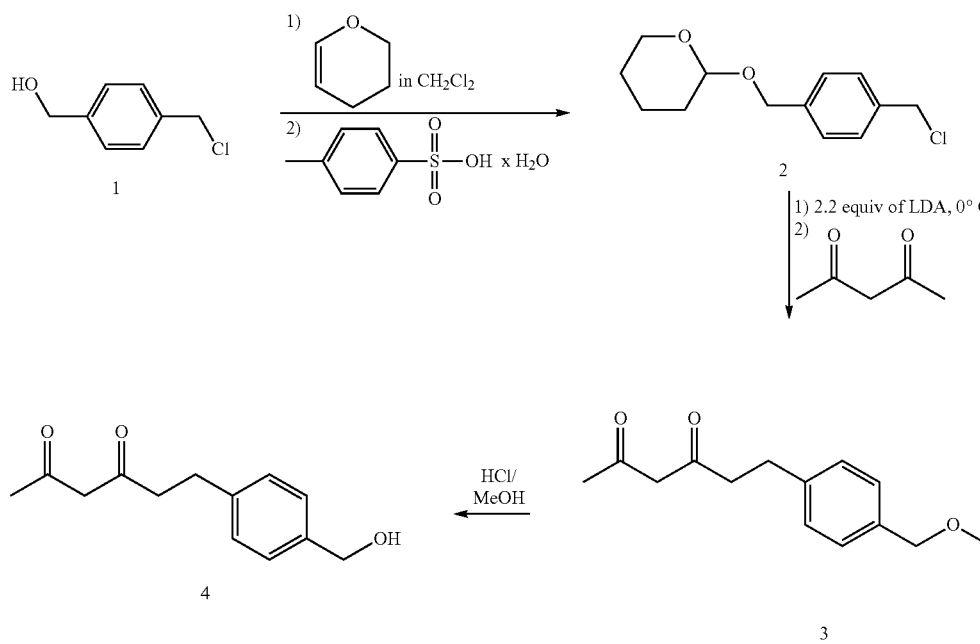

Synthetic Procedure of 2

4-(chloromethyl)benzyl alcohol 1 (5 g, 32 mmol), 3,4-Dihydro-2H-pyran (2.69 g, 32 mmol) and p-Toluenesulfonic acid monohydrate (60 mg, 0.32 mmol) were dissolved in 60 mL of anhydrous dichloromethane. The mixture was stirred for 3 h under argon at room temperature. After which, the crude mixture was extracted with dichloromethane and washed three times with water (50 mL×3), brine (50 mL), and dried over anhydrous magnesium sulfate, $MgSO_4$. The organic solvent was then evaporated under reduced pressure. The crude product was eluted with 1:4 ratios ($R_f$=0.63) of ethyl acetate and hexane by flash chromatograph, and gave 6.15 g (80%) 2 as a colorless oil.

Synthetic Procedure of 3

Acetylacetone (2 g, 20 mmol) was reacted with 2.2 equiv of 1.8 M of LDA (24 mL, 44 mmol) in anhydrous THF at 0° C. in ice/water bath. The reaction mixture was stirred for 20 min at 0° C. followed by slow addition of 2 (3.05 g, 20 mmol). The reaction mixture was then stirred for another 20 min at 0° C. and then was quenched with 1M of HCl (aq). The organic solvent was completely evaporated by rotary evaporator and the residue was dissolved in dichloromethane. The organic layer was washed three times (3×50 mL) with water and brine, dried over $MgSO_4$. The crude product was further purified by a silica gel chromatography with a 1:4 ratio ($R_f$=0.45) of ethyl acetate and hexane, and gave 1.35 g (31% yield) 3 as a pale yellow oil.

Synthetic Procedure of 4

3 (1.06 g, 3.48 mmol) was dissolved in methanol (20 mL) and was mixed with 0.5 mL of conc. HCl (aq). The mixture was stirred for 2 h at room temperature. The methanol was removed by rotary evaporator and the residue was dissolved in ethyl acetate. The organic layer was washed with water, brine, and dried over $MgSO_4$. The crude mixture was further purified by a silica-gel chromatography with a 1:1 ratio ($R_f$=0.65) of ethyl acetate and hexane, and gave 0.72 g (94%) 4 as a purified product.

Example 2

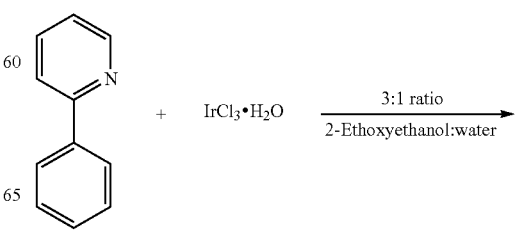

-continued

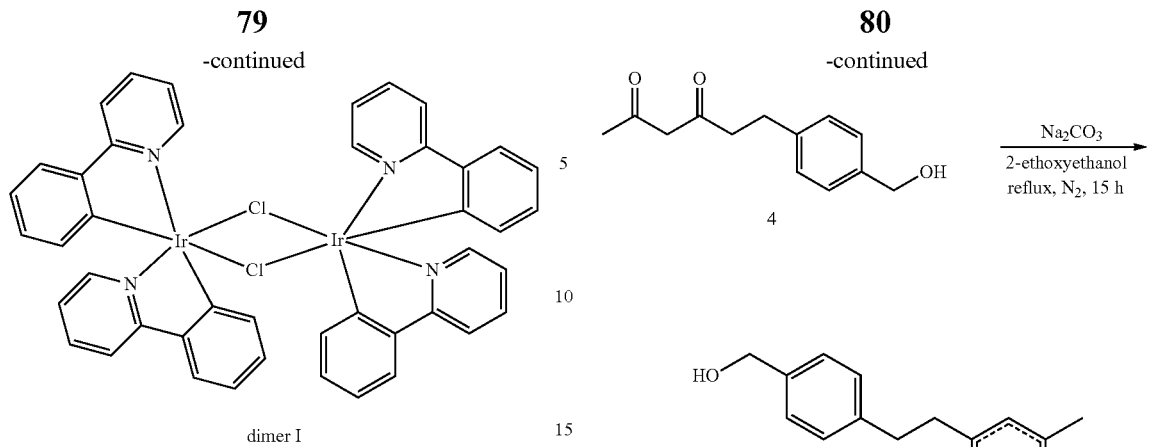

dimer I

Synthetic Procedure of Dimer I, [Ir(μ-Cl) (ppy)$_2$]$_2$

Dimer I was synthesized in accordance with the procedures described in *J. Am. Chem. Soc.*, 1984, 106, 6647 and *Bull. Chem. Soc. Jpn.*, 1974, 47, 767, which are both hereby incorporated by reference in their entireties. Iridium trichloride hydrate (1 mmol) was combined with 2-phenylpyridine (4.46 mmol) dissolved in a mixture of 2-ethoxyethanol and water (3/1). The mixture was refluxed for 24 h. The solution was then cooled to room temperature, and the yellow precipitate was washed with 95% ethanol and acetone. The yellow precipitate was then dissolved in dichloromethane and filtered. Toluene and hexane were added to the filtrate, which was then reduced in volume by evaporation. After cooling, crystals of dimer I was obtained Example 3

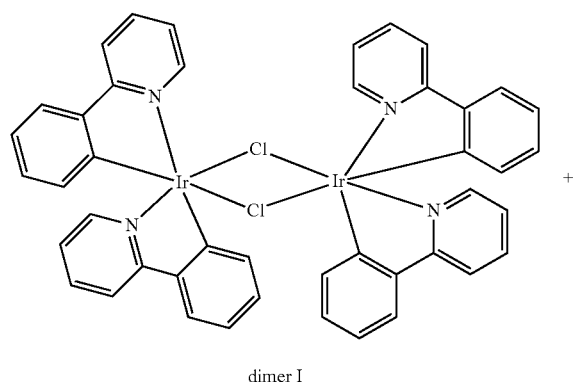

dimer I

Synthetic Procedure of Ir-Compound I

Dimer I (3.11 g, 2.9 mmol), 4 (1.64 g, 7.45 mmol), and sodium bicarbonate Na$_2$CO$_3$ (3.26 g) were dissolved in 2-ethoxyethanol (50 mL) and refluxed under argon atmosphere for 12-15 h. After cooling, Na$_2$CO$_3$ was filtered off. The filtrate was evaporated under a reduced pressure and the resulting residue was redissolved in dichloromethane. The solution was washed with water and brine. The organic layer was dried over MgSO$_4$ and then subjected to silica-gel column chromatography eluted with 1:1 ratio (R$_f$=0.33) of ethyl acetate and hexane, and gave 2.85 g (68%) of Ir compound I. MS (m/z): calculated for C$_{35}$H$_{31}$IrN$_2$O$_3$ 719.85, found 720.0. Melting point: 245° C. TGA; T$_5$%=309° C. in air.

Example 4

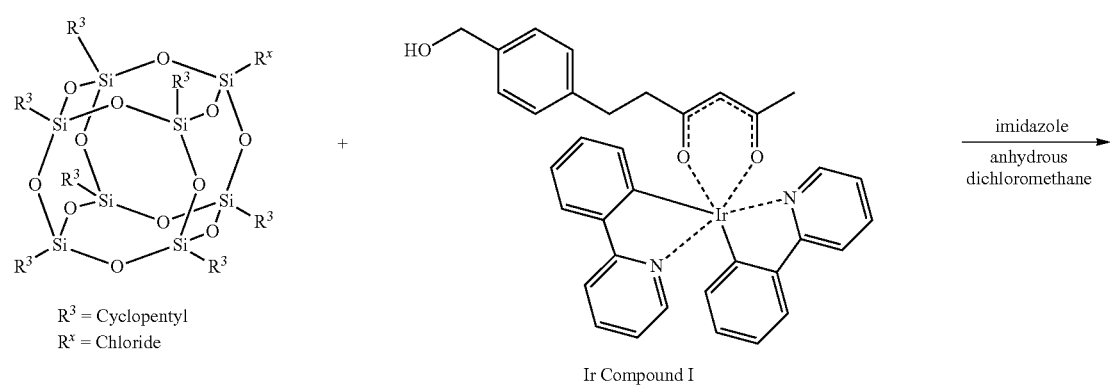

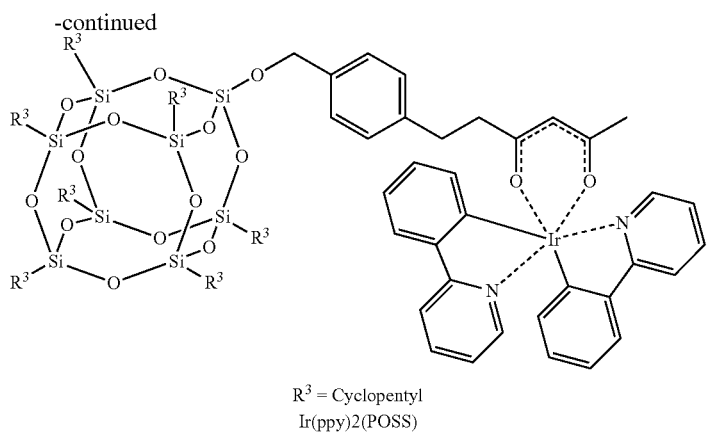

$R^3$ = Cyclopentyl
Ir(ppy)2(POSS)

Synthetic Procedure of Ir(ppy)2POSS—Green Emitting

Ir compound I (0.47 g, 0.65 mmol), 1.5 equiv of POSS-Chloro-heptacyclopentyl substituted (0.92 g, 0.98 mmol), and 2 equiv of imidazole (89 mg, 1.3 mmol) in anhydrous dichloromethane was stirred for 2 h at room temperature. The reaction mixture was then washed with water and brine. The organic layer was dried over MgSO$_4$, giving 1.54 g of the crude product as a yellow solid. The crude solid was purified by a silica-gel chromatography eluting with 1:4 ratio ($R_f$=0.25) of ethyl acetate and hexane, and gave 0.88 g (83%) (POSS)(Ir Compound I). $C_{70}H_{94}IrN_2O_{15}Si_8$ m/e: 1619.44 (100%). MS (m/z): calculated for $C_{70}H_{93}IrN_2O_{15}Si_8$ 1619.39, found 1619.

Example 5

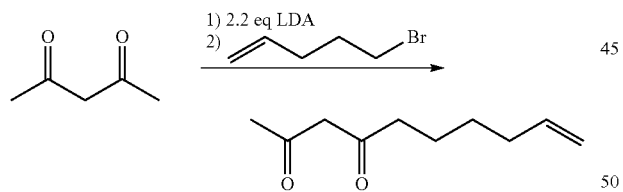

Dec-9-ene-2,4-dione was synthesized using a similar procedure as described in Example 1 or following the literature procedure described in *Helv. Chim. Acta.*, 1977, 60, 638.

Example 6

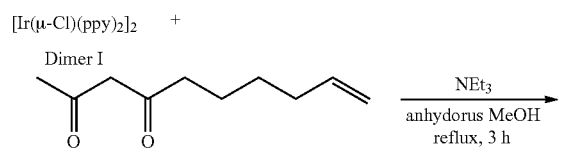

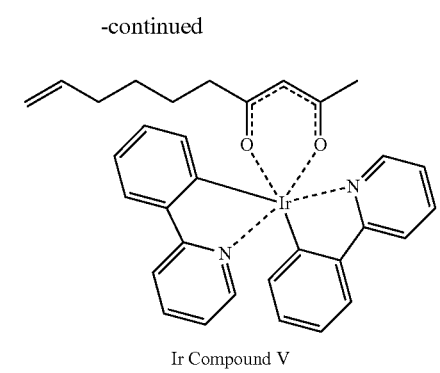

Ir Compound V

Synthetic Procedure of Ir Compound V

Dimer I [Ir(ppy)$_2$(μ-Cl)] (6.0 g, 5.6 mmol) was suspended in 100 mL of anhydrous methanol degassed with nitrogen gas. Dec-9-ene-2,4-dione (2.19 g, 13 mmol) and triethylamine (NEt$_3$) (2.40 mL, 17.5 mmol) were added, and the obtained mixture was heated to reflux for 3 h. The resulting reaction mixture was cooled to room temperature and concentrated by using a rotary evaporator. The crude mixture was extracted with 200 mL of chloroform (CHCl$_3$) and washed with water (100 mL×3) and brine. The organic layer was dried over magnesium sulfate. After removal of the solvent, the residue was purified by flash chromatography using silica-gel, with 1:2 ratio of EtOAc:n-Hexane as eluent, giving 4.8 g (64%) the product, Ir Compound V, as of fine yellow powder.

Example 7

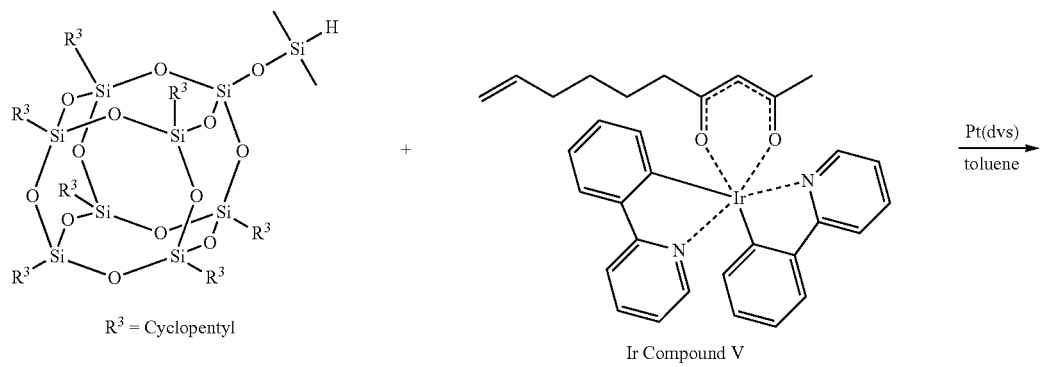

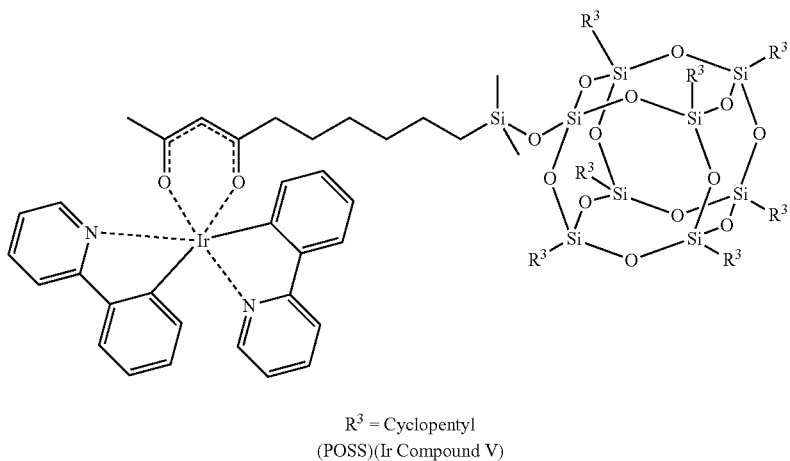

R³ = Cyclopentyl
(POSS)(Ir Compound V)

Synthetic Procedure of (POSS)(Ir Compound V)—Green Emitting

Ir Compound V (800 mg, 1.2 mmol) and PSS-(Hydridodimethyl-siloxy)-Heptacyclopentyl substituted (Aldrich) (1.17 g, 1.2 mmol) were dissolved in 10 mL of dry toluene, followed by addition of Pt(0)-1,3-divinyl-1,1,3,3-tetramethyldisiloxane, Pt(dvs) catalyst (0.03 mL). The reaction mixture was stirred for 24 h under Ar atmosphere before poured into excess amount of methanol. The precipitate was purified by a silica-gel chromatography with 1:4 ratio of n-Hexane: EtOAc as eluent, giving 1.8 g (92%) of (POSS)(Ir Compound V) as a pale yellow powder.

Example 8

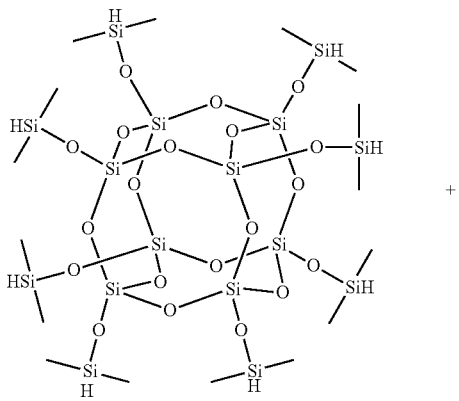

Octakis(dimethylsiloxy)-POSS

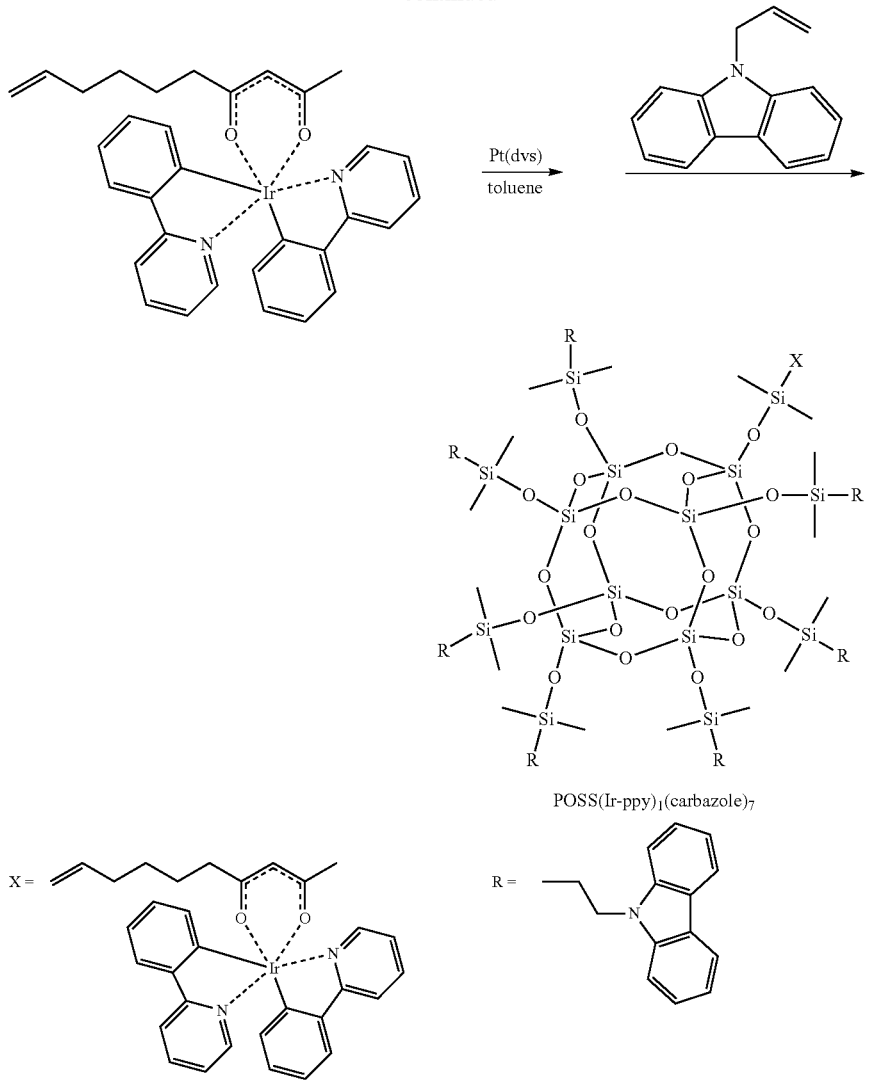

POSS(Ir-ppy)₁(carbazole)₇

Synthetic Procedure of POSS(Ir-Ppy)₁(Carbazole)₇

A round bottom flask was charged with a stirbar, Octakis (dimethylsiloxy)-POSS (492 mg, 0.483 mmol), (Ir Compound V) (323 mg, 0.483 mmol), and anhydrous toluene (20 ml). The solution was degassed with argon for 5 minutes and then platinum-divinyltetramethyl disiloxane (Pt(dvs)) (0.04 ml, 2% Pt wt. solution in xylene) was added and the reaction mixture was stirred at room temperature under positive argon pressure for 1 hour. N-allylcarbazole (1.00 g, 4.83 mmol) was added and the reaction mixture was allowed to stir at room temperature for 2 hours. The toluene was evaporated in vacuo and the product was separated chromatographically using 1:1 dichloromethane:hexanes to yield 301 mg (20%).

Example 9

Fabrication of Light-Emitting Device:
Device substrates, such as ITO coated glasses, were prepared using a standard multi-step cleaning process involving detergent wash, solvent rinse, and solvent boil. This was followed by a plasma ashing process to remove any surface organic impurities. Poly(3,4-ethylenedioxythiophene)poly (styrenesulfonate) (PEDOT:PSS) purchased from H. C. Stark (PVP AI 4083) was then spin coated onto the substrate to form a hole injection layer. After spin coating, the substrates were heated at about 115° C. for 20 minutes to eliminate moisture. An emissive layer with the composition listed in Table 1 was deposited on the PEDOT:PSS-coated substrate by inkjet printing using a Dimatix/Fujifilm DMP-2800 materials printer in air. The resulting emissive compound concentration in the composition was about 2.6 wt % based on total mass of PVK plus PBD, which corresponded to about 1 wt % dye loading in the solid composition. The ink composition was printed with a droplet spacing of 50 μm. The droplet spacing was less than the measured droplet size of approximately 88 μm, and thus provided continuous coverage of the composition on the substrate. Furthermore, each subsequent layer was offset from the previous layer by (_x,_y)=(±25 μm,±25 μm) to ensure complete coverage. The resulting stack was then heated at 115° C. for 30 minutes in an inert atmosphere prior to further processing. Then, 400 Å of a 2,9-dimethyl-4,7-diphenyl-1,10-phenanthroline (BCP) hole-blocking layer were deposited in a vacuum deposition chamber (Angstrom) at a pressure of 10-6 Torr with a uniform growth rate of 1 Å/s.

Cathodes were next deposited through a shadow mask using 15° A LiF followed by at least 1000 Å of Al. The resulting devices were characterized in an inert atmosphere.

TABLE 1

Printable composition for making emissive layer.

| Composition Ingredient | Function | Amount |
|---|---|---|
| Ir(ppy)2POSS | Emissive compound | 0.016 wt % |
| poly(9-vinylcarbazole) (PVK) | Hole transport compound | 0.44 wt % |
| 2-4-biphenylyl-5-4-tertbutyl-phenyl-1,3,4-oxadiazole (PBD) | Electron transport compound | 0.17 wt % |
| 1,2-dichlorobenzene | Solvent | 99.37 wt % |

It will be appreciated by those skilled in the art that various omissions, additions and modifications may be made to the processes described above without departing from the scope of the invention, and all such modifications and changes are intended to fall within the scope of the invention.

What is claimed is:

1. A composition comprising:
an electron transport compound;
an emissive compound; and
an organic solvent;
wherein the emissive compound is represented by formula (I):

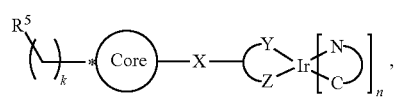

wherein:
core is a nanoparticle core;
n is 2;
X is a single bond or

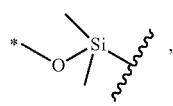

wherein * indicates a point of attachment to the core;

each

is independently a first optionally substituted bidentate ligand;

is a second optionally substituted bidentate ligand selected from:

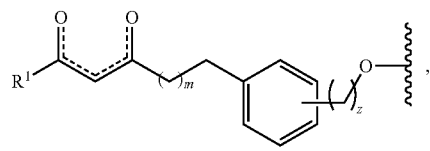

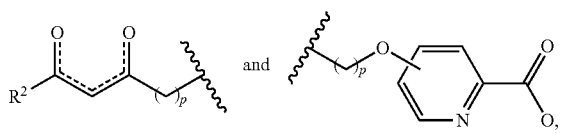

wherein k is 0 or an integer selected from 1 to 20;

m is an integer in the range of 1 to 9;

p is an integer in the range of 1 to 20, z is 0, 1 or 2;

$R^1$ is selected from alkyl, substituted alkyl, aryl and substituted aryl;

$R^2$ is selected from: alkyl, substituted alkyl, aryl and substituted aryl;

each $R^5$ is independently selected from the following:

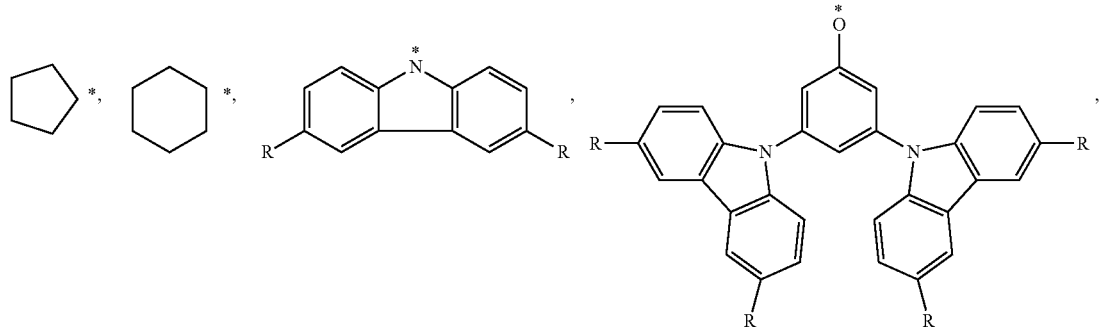

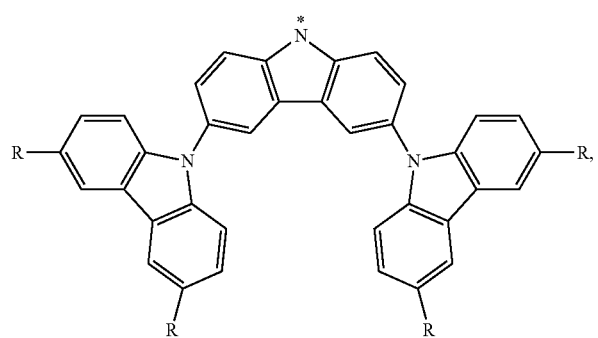
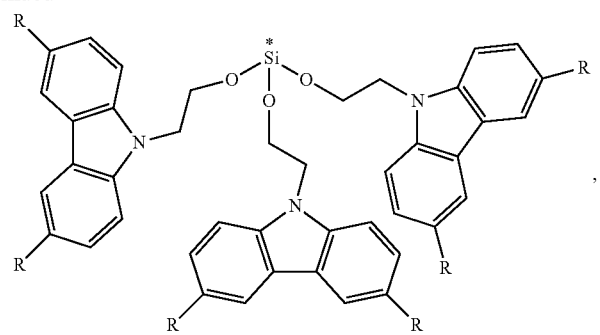
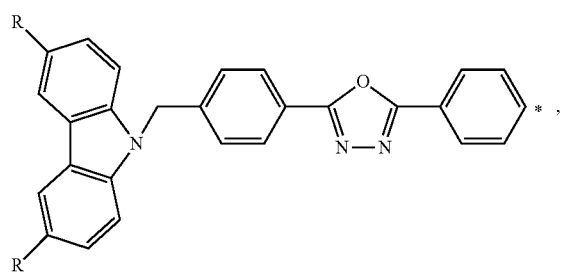
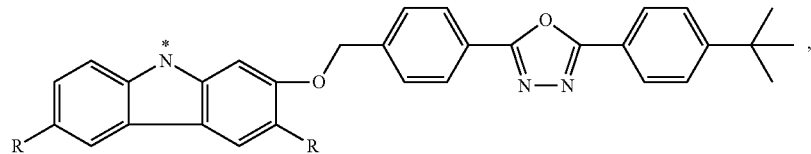
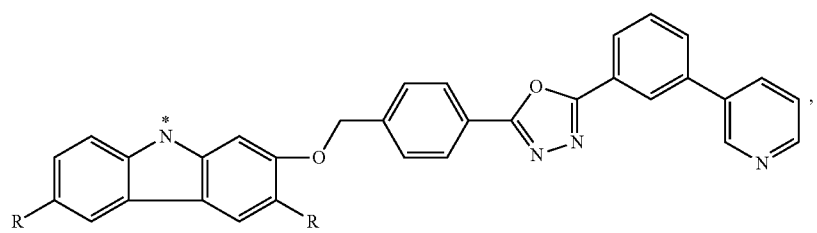
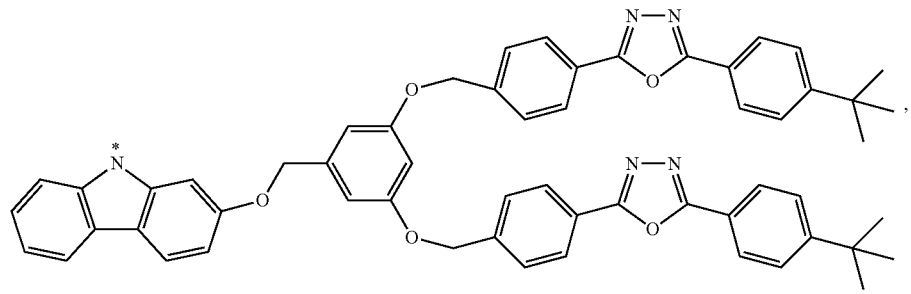

-continued
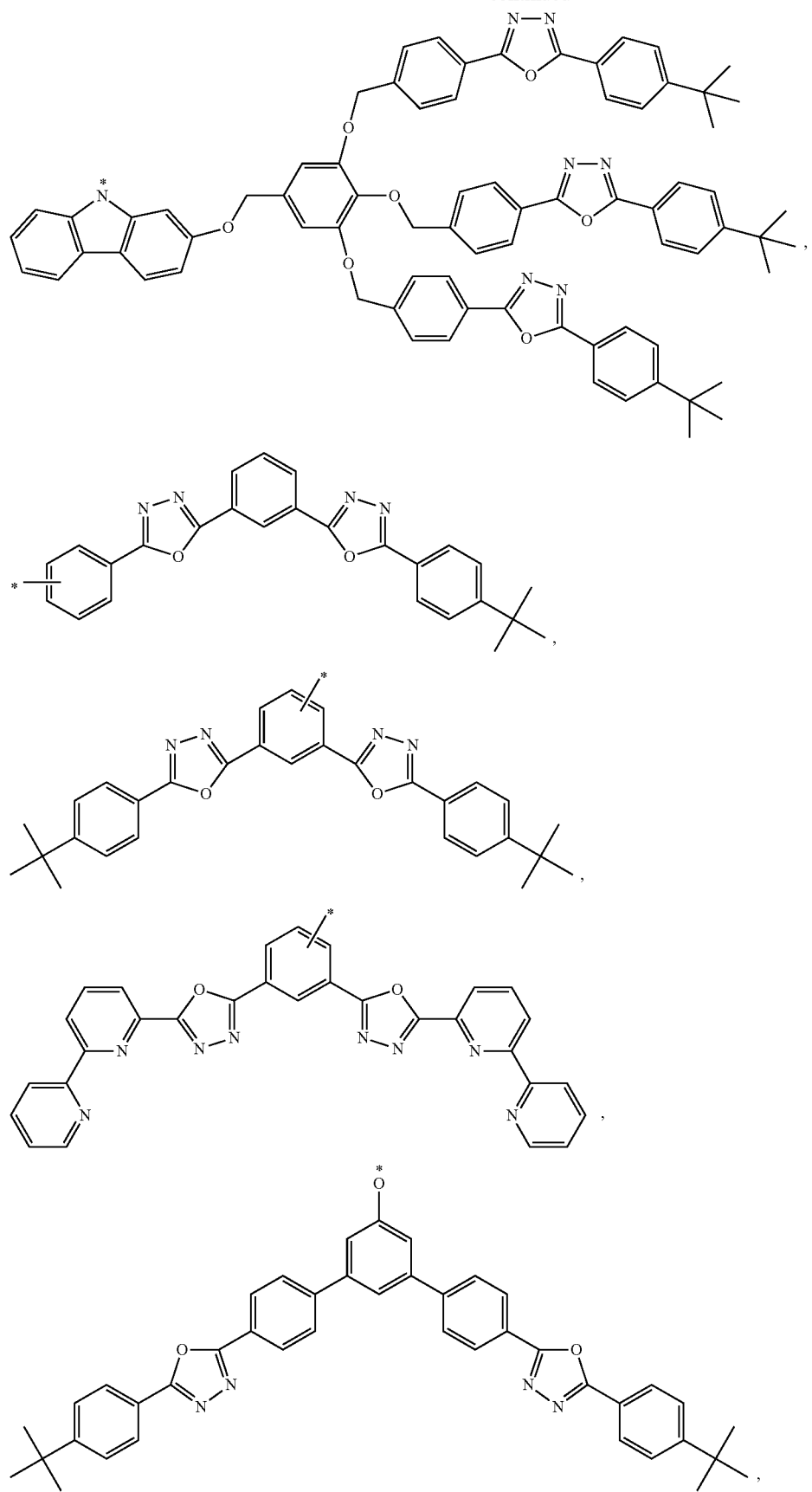

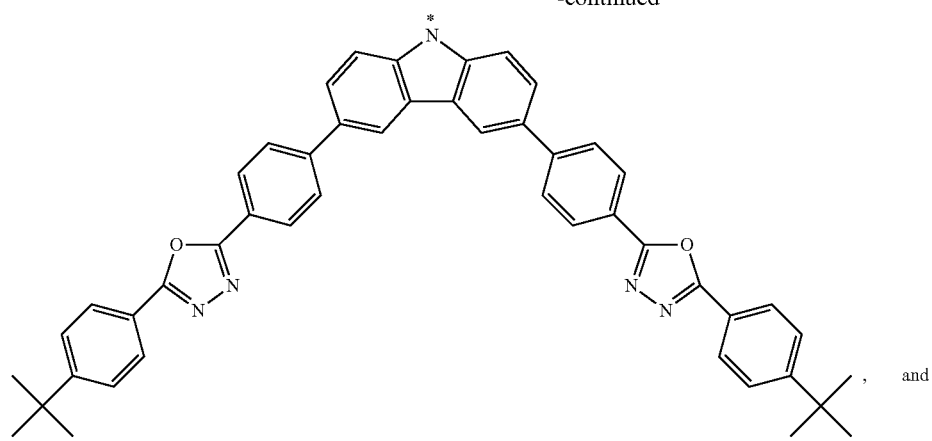

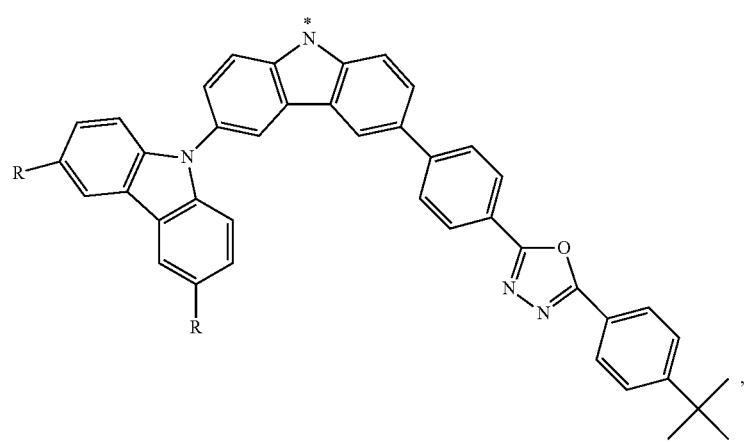

wherein R is independently selected from H or alkyl; and * indicates a point of attachment.

2. The composition of claim 1, wherein the core comprises a moiety selected from the group consisting of a silsesquioxane, a cyclophosphazene, a triazine, a cyclodextrin, a calizarene, a phthalocyanine, and a silica particle.

3. The composition of claim 2, wherein the silsesquioxane comprises a 1,3,5,7,9,11,13,15-octakis(dimethylsilyloxy)pentacyclo-[9.5.1.13,9.15,15.17,13]-octasiloxane.

4. The composition of claim 1, wherein the first optionally substituted bidentate ligand is selected from:

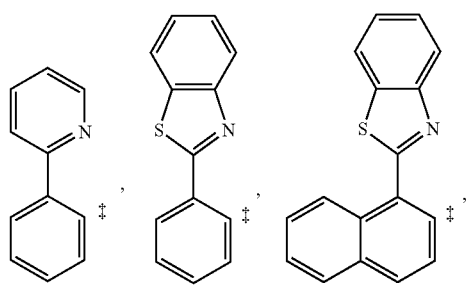

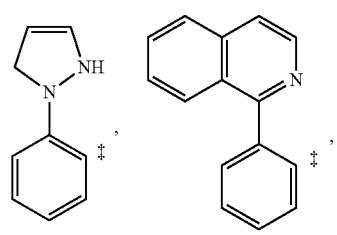

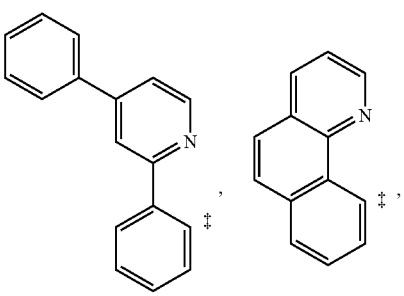

-continued

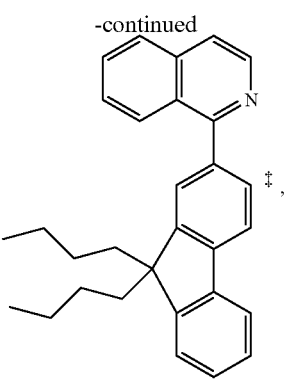

and optionally substituted derivatives thereof, wherein ‡ indicates a point of attachment to the Ir.

5. The composition of claim 1, wherein the first optionally substituted bidentate ligand is a substituted derivative selected from:

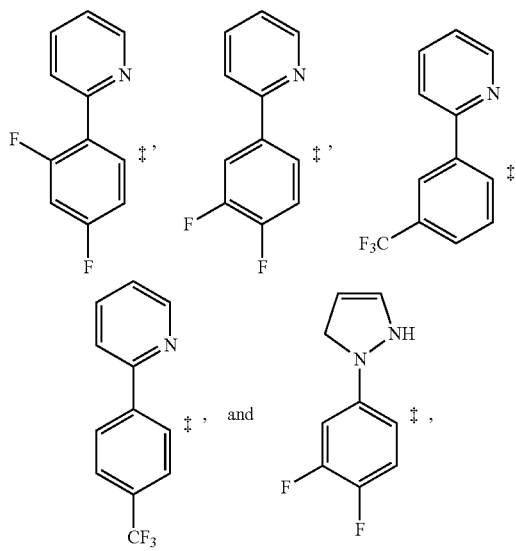

wherein ‡ indicates a point of attachment to the Ir.

6. The composition of claim 1, wherein the first optionally substituted bidentate ligand is selected from:

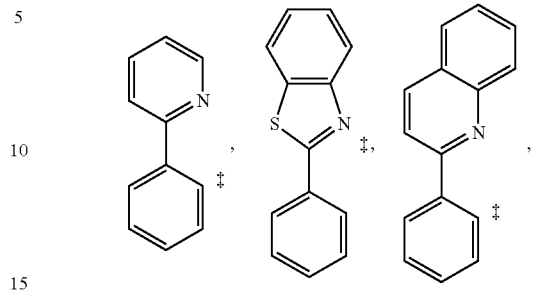

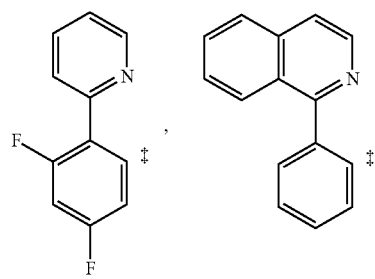

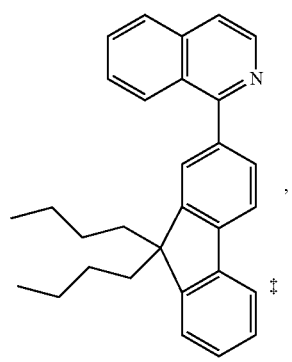

wherein ‡ indicates a point of attachment to the Ir.

7. The composition of claim 1, wherein the compound of formula (I) is selected from:

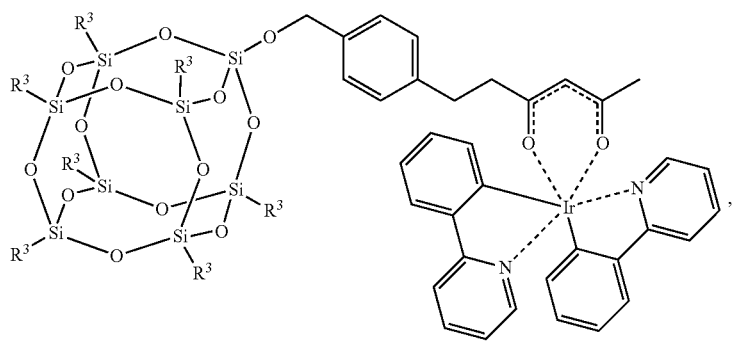

-continued
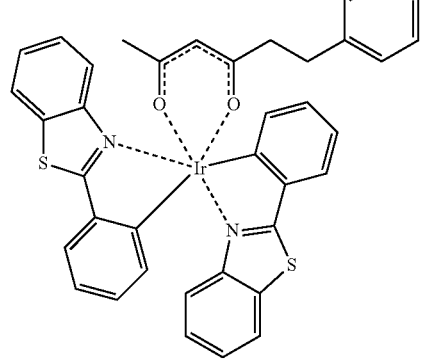 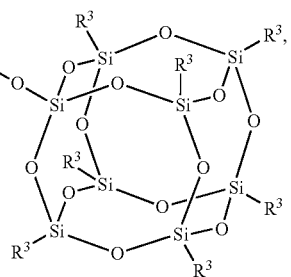
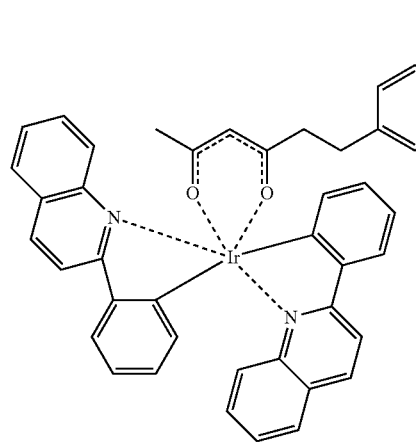 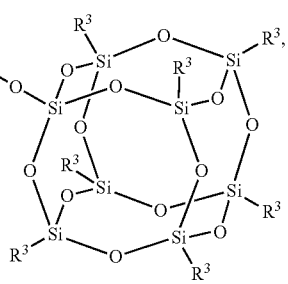
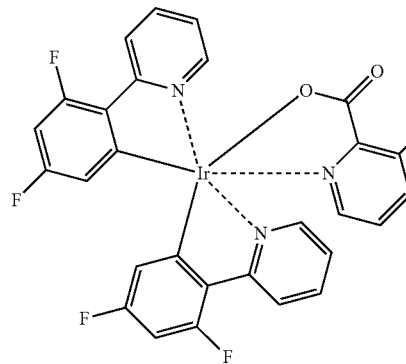 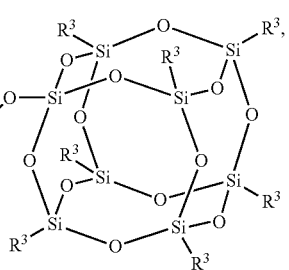
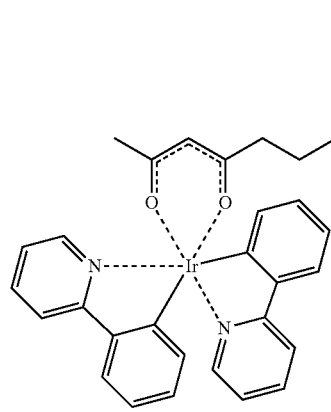 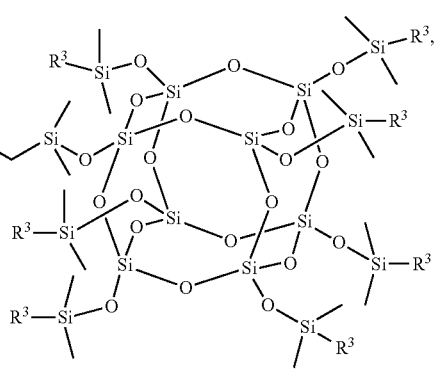

-continued
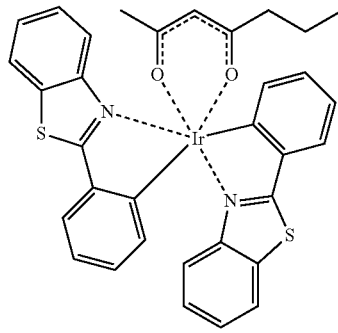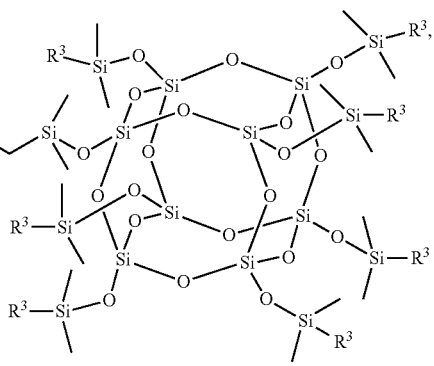
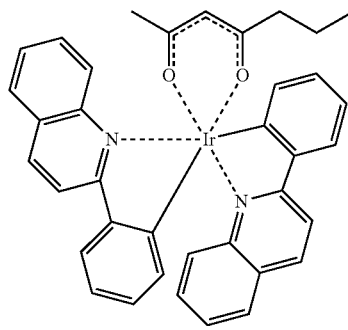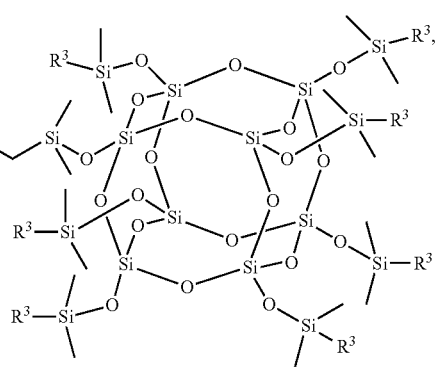
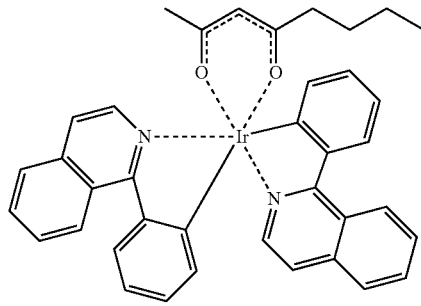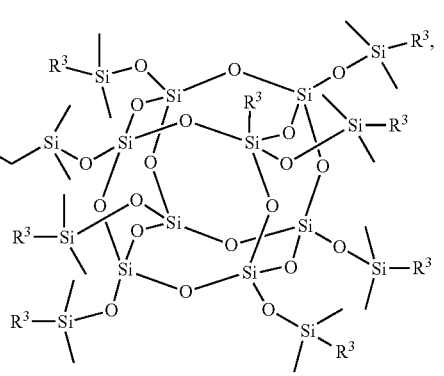

-continued
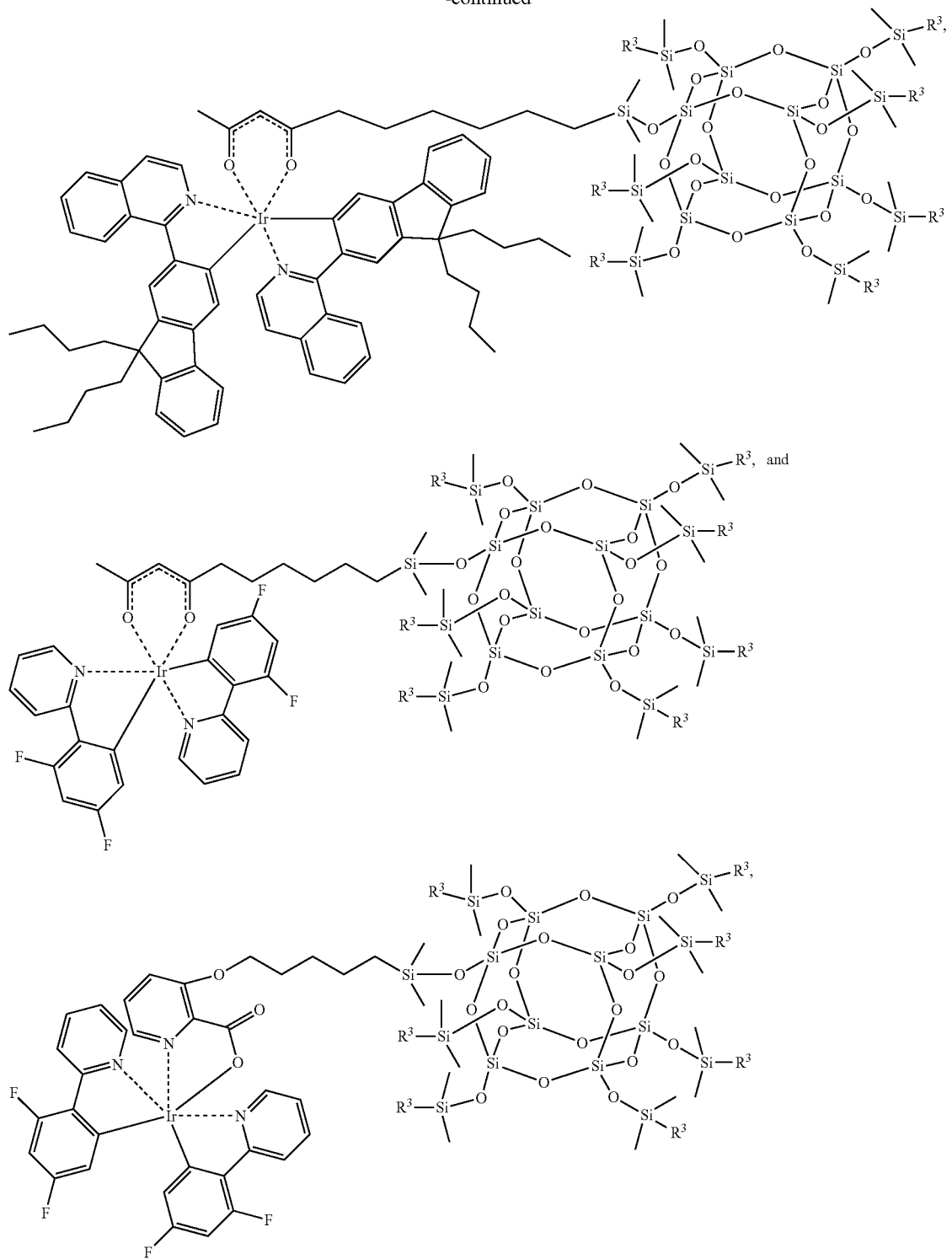
wherein R³ is
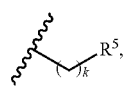

wherein k is 0 or an integer selected from 1 to 20, and $R^5$ can be selected from the following:
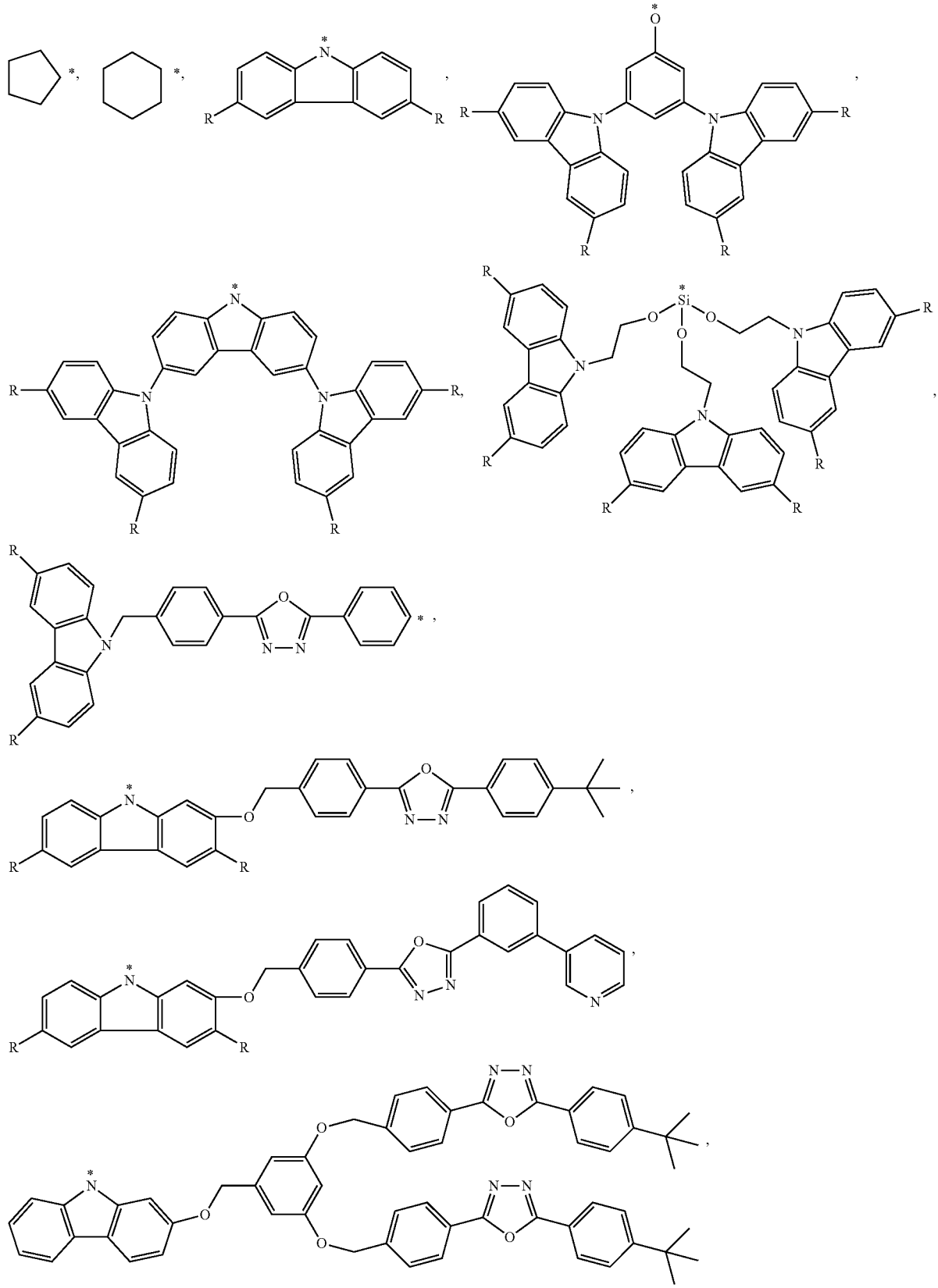

-continued
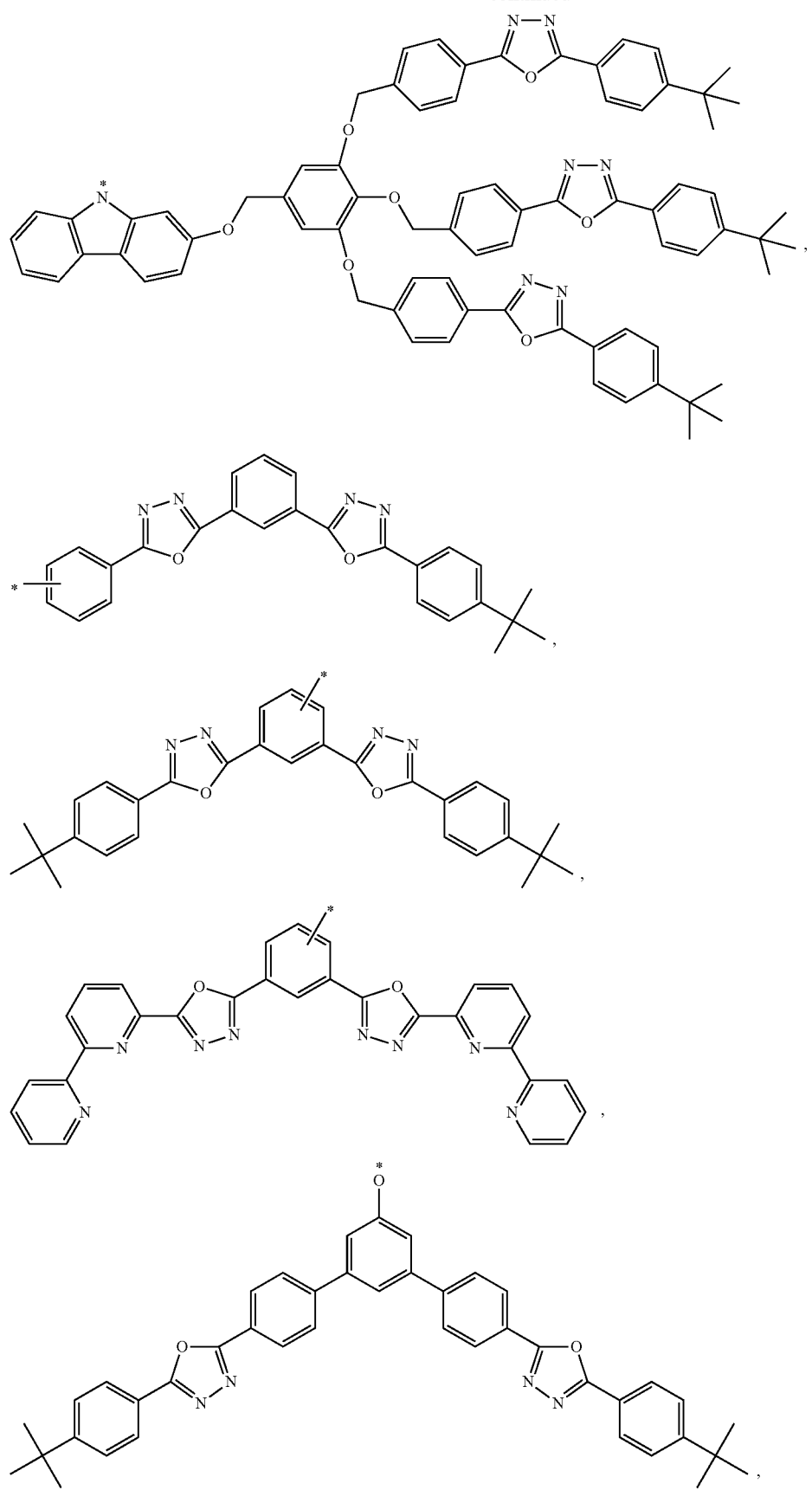

-continued
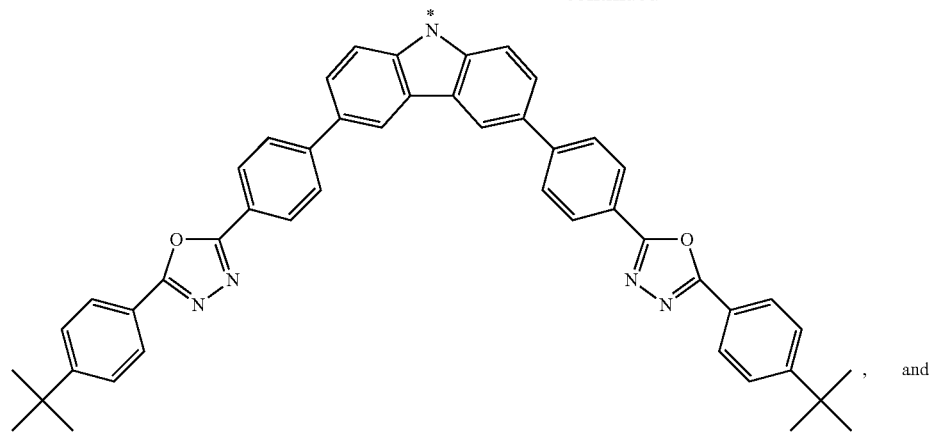
, and
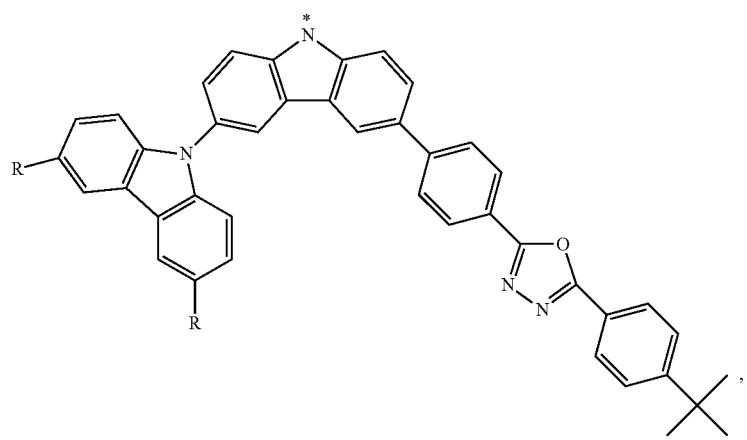
,
and wherein R is independently selected from H or alkyl, and * indicates a point of attachment.
8. A composition comprising:
an electron transport compound;
an emissive compound; and
an organic solvent,
wherein the emissive compound is represented by one of the following formulas:
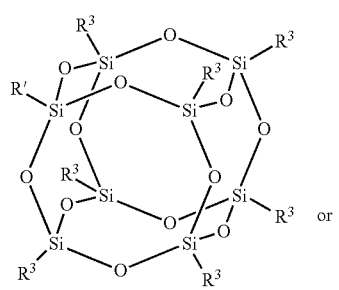
(II)
-continued
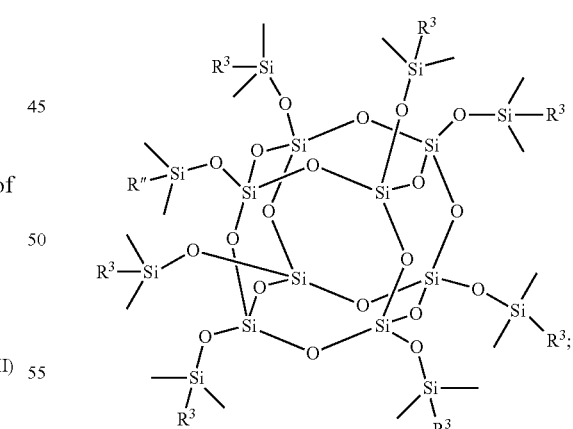
(III)
wherein R' is represented by
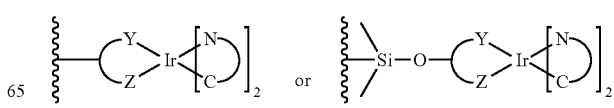
or 109
or and R" is represented by
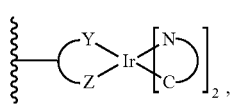
wherein each
110
is independently a first optionally substituted bidentate ligand, and
is a second optionally substituted bidentate ligand; $R^3$ is
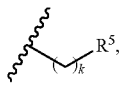
wherein k is 0 or an integer selected from 1 to 20, and $R^5$ is independently selected from the following:
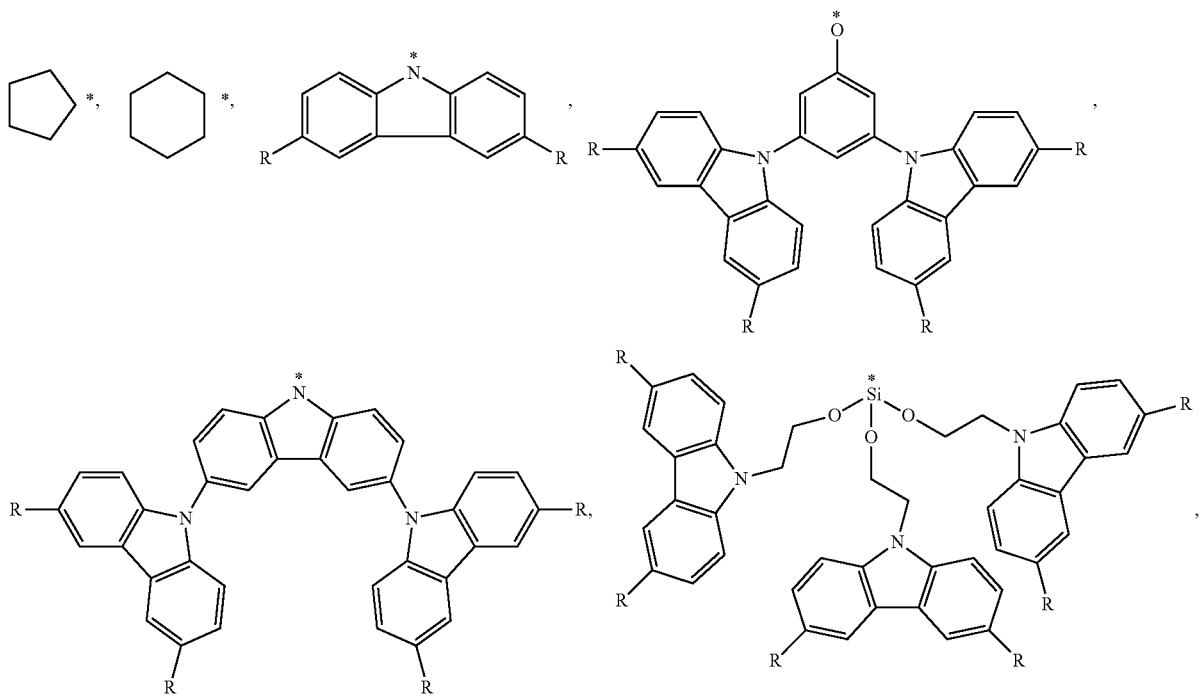
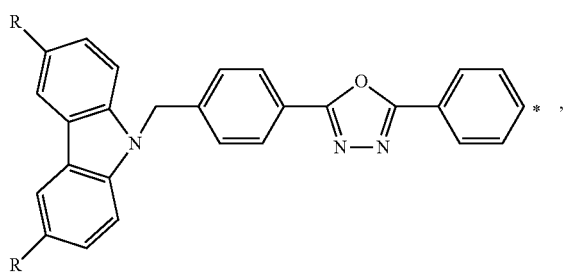
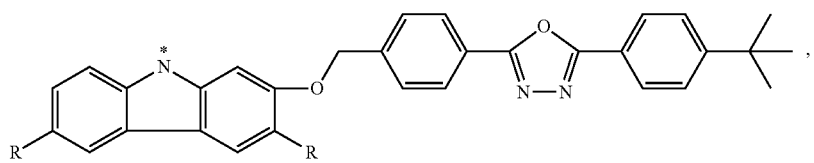

-continued
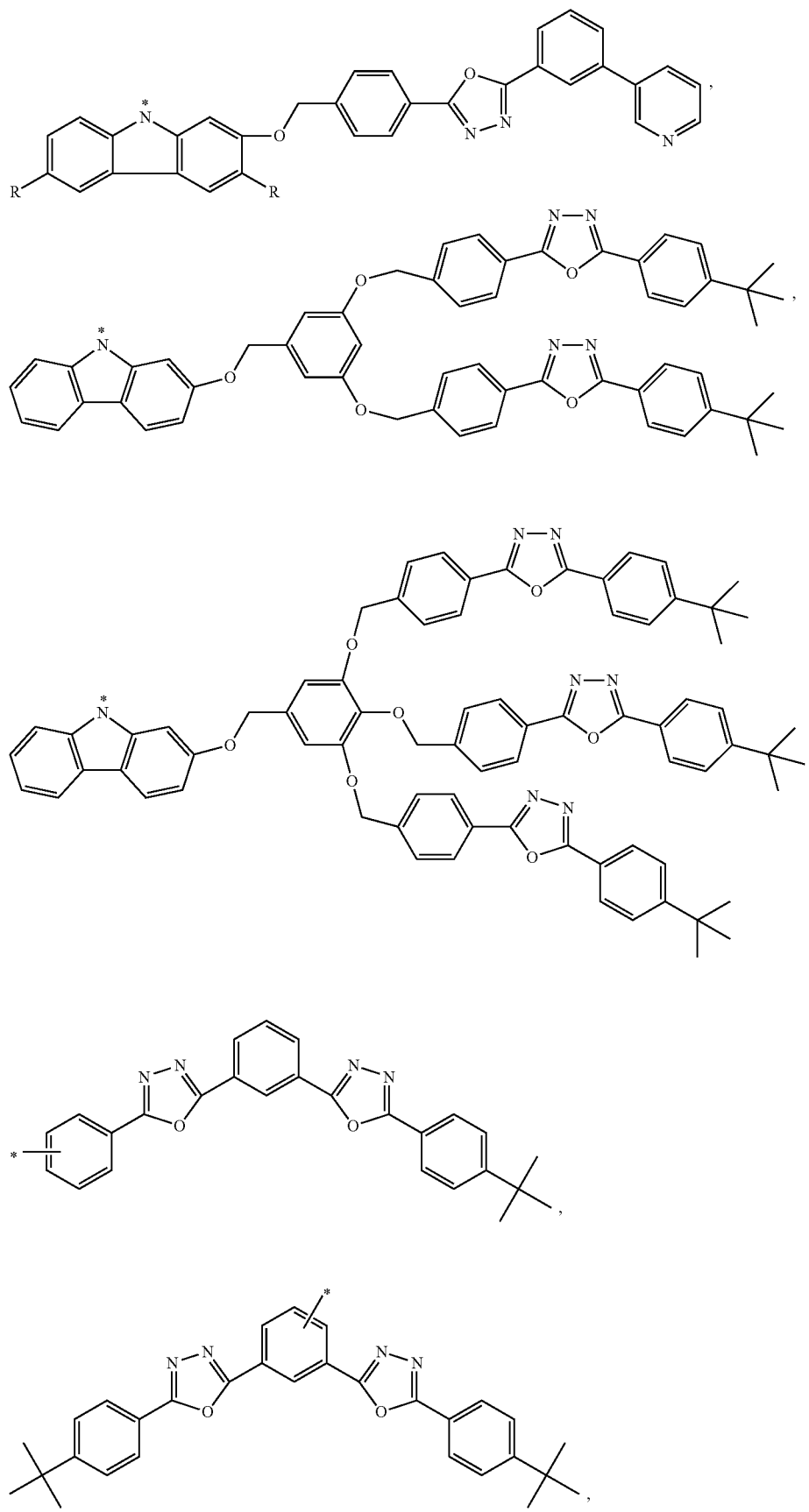

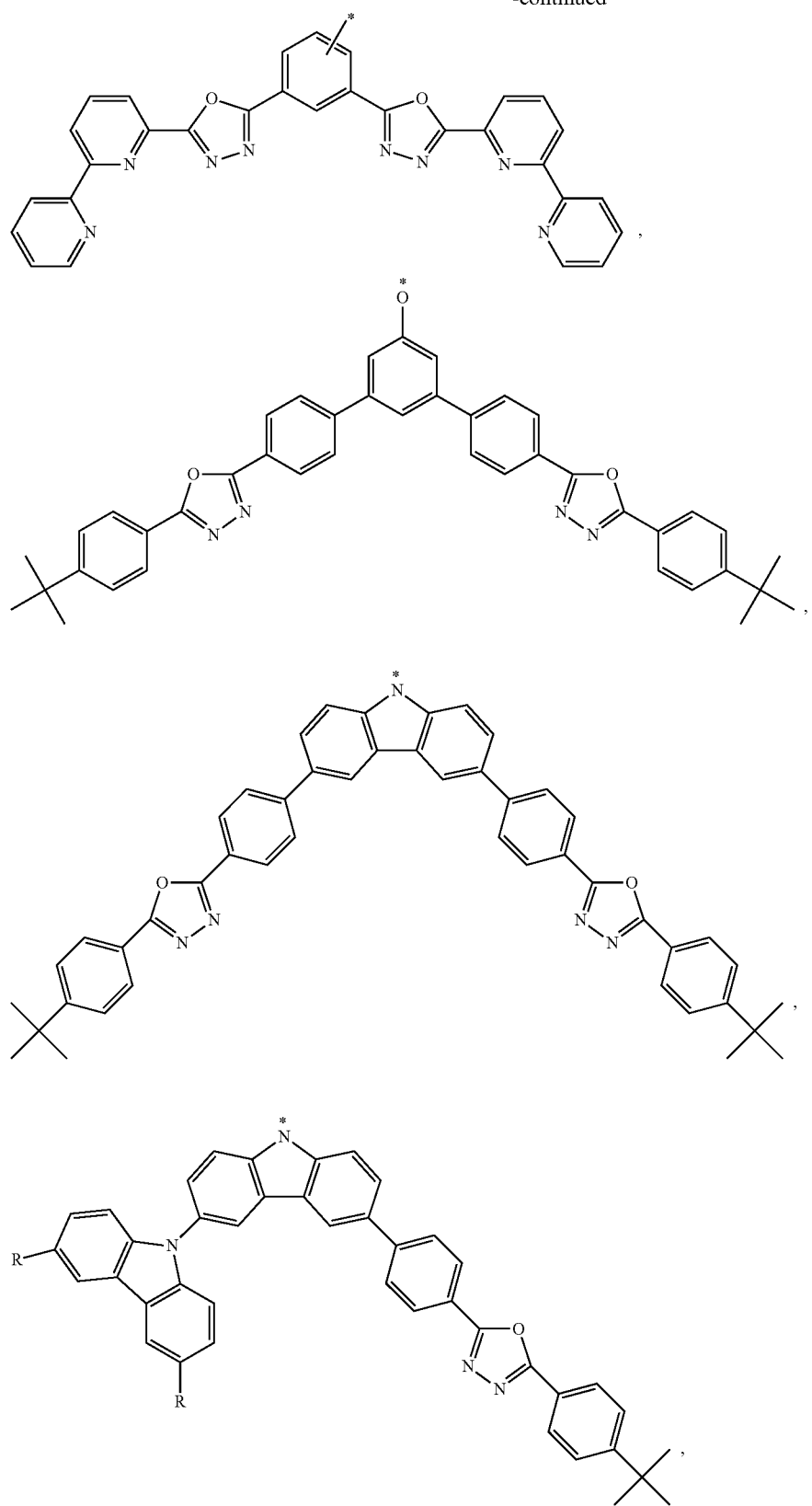
wherein R is independently selected from H or alkyl, and * indicates a point of attachment.

9. The composition of claim 8, wherein

is selected from:

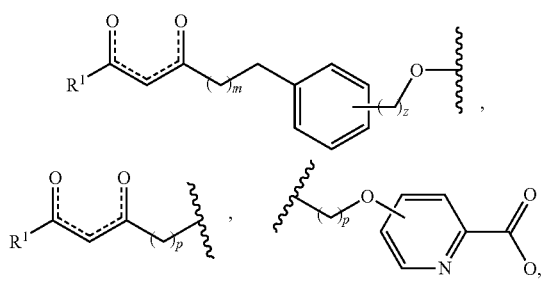

and optionally substituted derivatives thereof, wherein m is an integer in the range of 1 to 9, p is an integer in the range or 1 to 20, z is 0, 1 or 2, $R^1$ is selected from alkyl, substituted alkyl, aryl and substituted aryl, and $R^2$ is selected from alkyl, substituted alkyl, aryl and substituted aryl.

10. The composition of claim 8, wherein

is selected from:

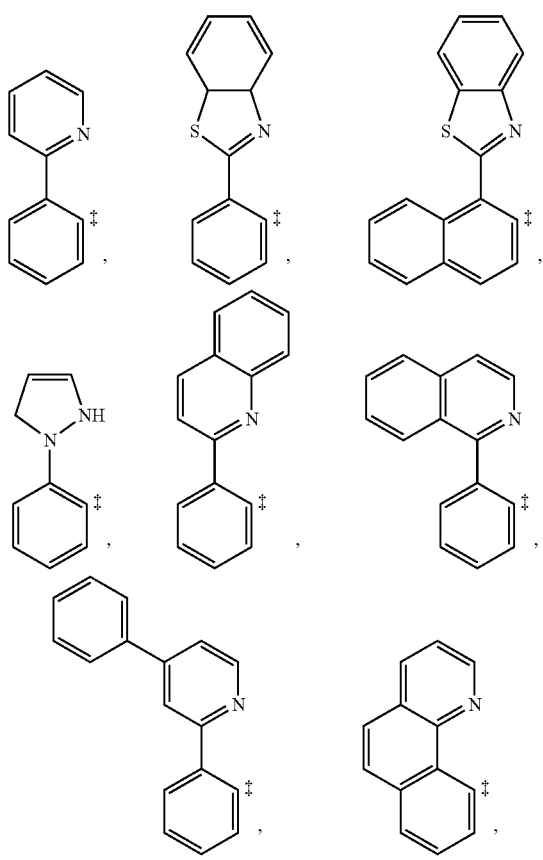

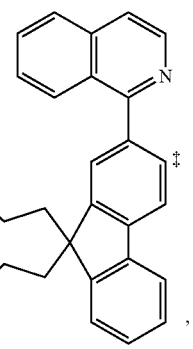

and optionally substituted derivatives thereof, wherein ‡ indicates a point of attachment to the Ir.

11. The composition of claim 8, wherein the molecular weight of the organic solvent is from about 85 to about 150 g/mol.

12. The composition of claim 8, wherein the organic solvent is selected from: ethylene dichloride, chlorobenzene, dichlorobenzene, and a combination thereof.

13. The composition of claim 8, wherein the organic solvent comprises 4-methyl-2-pentanone.

14. The composition of claim 8, wherein the organic solvent comprises a combination of two compounds selected from: benzene, toluene, 1,2-dichloroethane, chlorobenzene, dichlorobenzene, and a $C_{1-10}$ ketone.

15. The composition of claim 8, wherein the emissive compound is present at a concentration of from about 0.0001 wt % to about 10 wt %.

16. The composition of claim 8, wherein the electron transport compound is present at a concentration of from about 0.1 wt % to about 10 wt %.

17. The composition of claim 8, wherein the composition has a viscosity of from about 1 cP to about 20 cP at 20° C.

18. A composition comprising:

an emissive compound represented by Formula (IV):

Formula (IV)

wherein each $R^4$ is independently selected from:

-continued

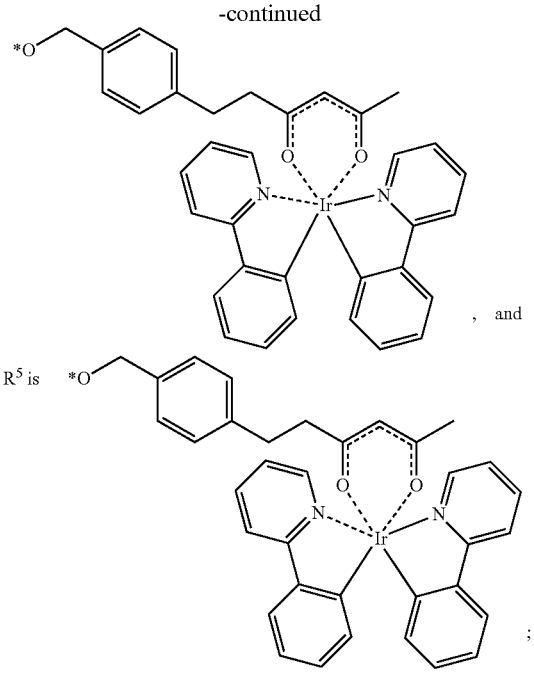
, and $R^5$ is
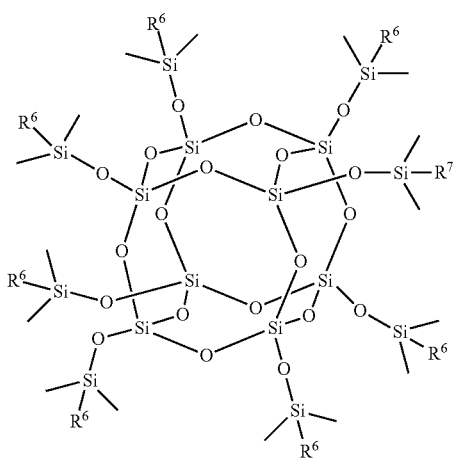
;

an electron transport compound; and
an organic solvent.

19. The composition of claim 18, wherein the composition has a viscosity of from about 1 cP to about 20 cP at about 20° C.

20. The composition of claim 18, wherein the organic solvent is dichlorobenzene.

21. The composition of claim 18 further comprising a hole transport compound.

22. The composition of claim 21, wherein the composition comprises:
from about 0.0001 wt % to about 2 wt % of the emissive compound;
from about 0.1 wt % to about 5 wt % of the hole transport compound;
from about 0.1 wt % to about 5 wt % of the electron transport compound; and
wherein the organic solvent is dichlorobenzene.

23. A composition comprising
an emissive compound represented by Formula (V):

Formula (V)

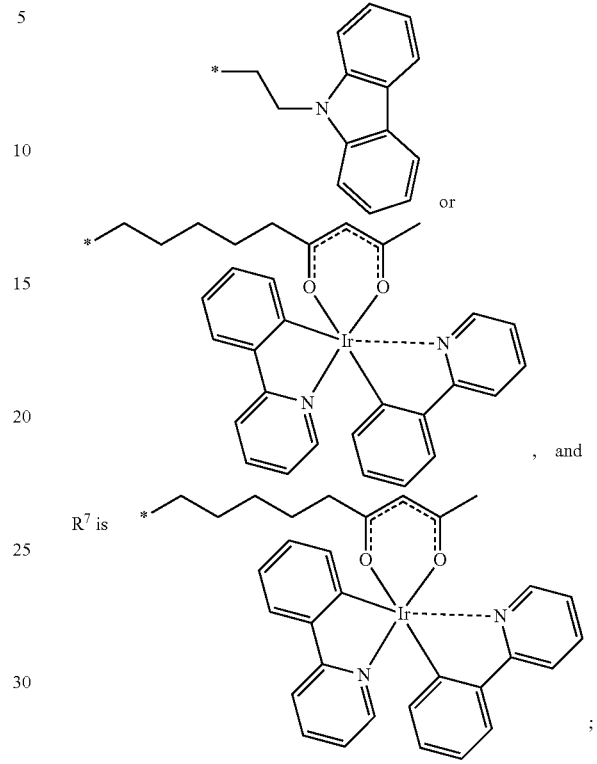

wherein each $R^6$ is independently selected from the following:

[structures shown]

or

, and $R^7$ is

[structure shown]

;

an electron transport compound; and
an organic solvent.

24. The composition of claim 23, wherein the composition has a viscosity of from about 1 cP to about 20 cP at about 20° C.

25. The composition of claim 23, wherein the organic solvent is selected from dichlorobenzene and 4-methyl-2-pentanone.

26. The composition of claim 23, wherein:
the emissive compound has a concentration of from about 0.0001 wt % to about 5 wt %;
the electron transport compound has a concentration of from about 0.1 wt % to about 5 wt %; and
the organic solvent is 4-methyl-2-pentanone.

27. The composition of claim 26, further comprising poly (vinylcarbazole).

28. The composition of claim 23, wherein the organic solvent is dichlorobenzene.

29. The composition of claim 23, wherein the composition further comprises from about 0.1 wt % to about 5 wt % of a hole transport compound, wherein:
the emissive compound has a concentration of from about 0.0001 wt % to about 2 wt %;
the electron transport compound has a concentration of from about 0.1 wt % to about 5 wt %; and
the organic solvent is dichlorobenzene.

30. A method of fabricating a light-emitting device comprising depositing a composition according to claim 1 upon an electrically conductive substrate via an inkjet printer.

31. The composition of claim 29, wherein the hole transport compound is poly(vinylcarbazole).

* * * * *

UNITED STATES PATENT AND TRADEMARK OFFICE
CERTIFICATE OF CORRECTION

Page 1 of 3

PATENT NO.         : 8,721,922 B2
APPLICATION NO.    : 13/123895
DATED              : May 13, 2014
INVENTOR(S)        : Mochizuki et al.

It is certified that error appears in the above-identified patent and that said Letters Patent is hereby corrected as shown below:

On the title page
    Column 1 page 1, item 86, PCT No., Change "PCT/US2009/045263" to --PCT/US2009/060555--.
    Column 1 page 1, item 86, § 371 (c)(1), (2), (4) Date, line 2, Change "Apr. 12, 2010" to --Apr. 12, 2011--.
    Column 2 page 1, item 56, line 39, change "silsequioxanes" to --silsesquioxanes--.
    Column 2 page 1, item 56, line 42, change "Phosphoresent" to --Phosphorescent--.
    Column 2 page 1, item 56, line 51, change "Polhedral" to --Polyhedral--.
    Column 2 page 1, item 56, line 52, change "Silsesquixanes" to --Silsesquioxanes--.
    Column 1 page 2, item 56, line 12, change "Coordinationg" to --Coordinating--.
    Column 1 page 2, item 56, line 13, change "Phosphoresence" to --Phosphorescence--.
    Column 2 page 2, item 56, line 1, change "Stabalized" to --Stabilized--.
In the specification
    Column 1 at line 33, Change "luminousity" to --luminosity--.
    Column 12 at line 25, Change "used" to --be used--.

Signed and Sealed this
Fifteenth Day of March, 2016

Michelle K. Lee
*Director of the United States Patent and Trademark Office*

Columns 32-33 line 2, Change

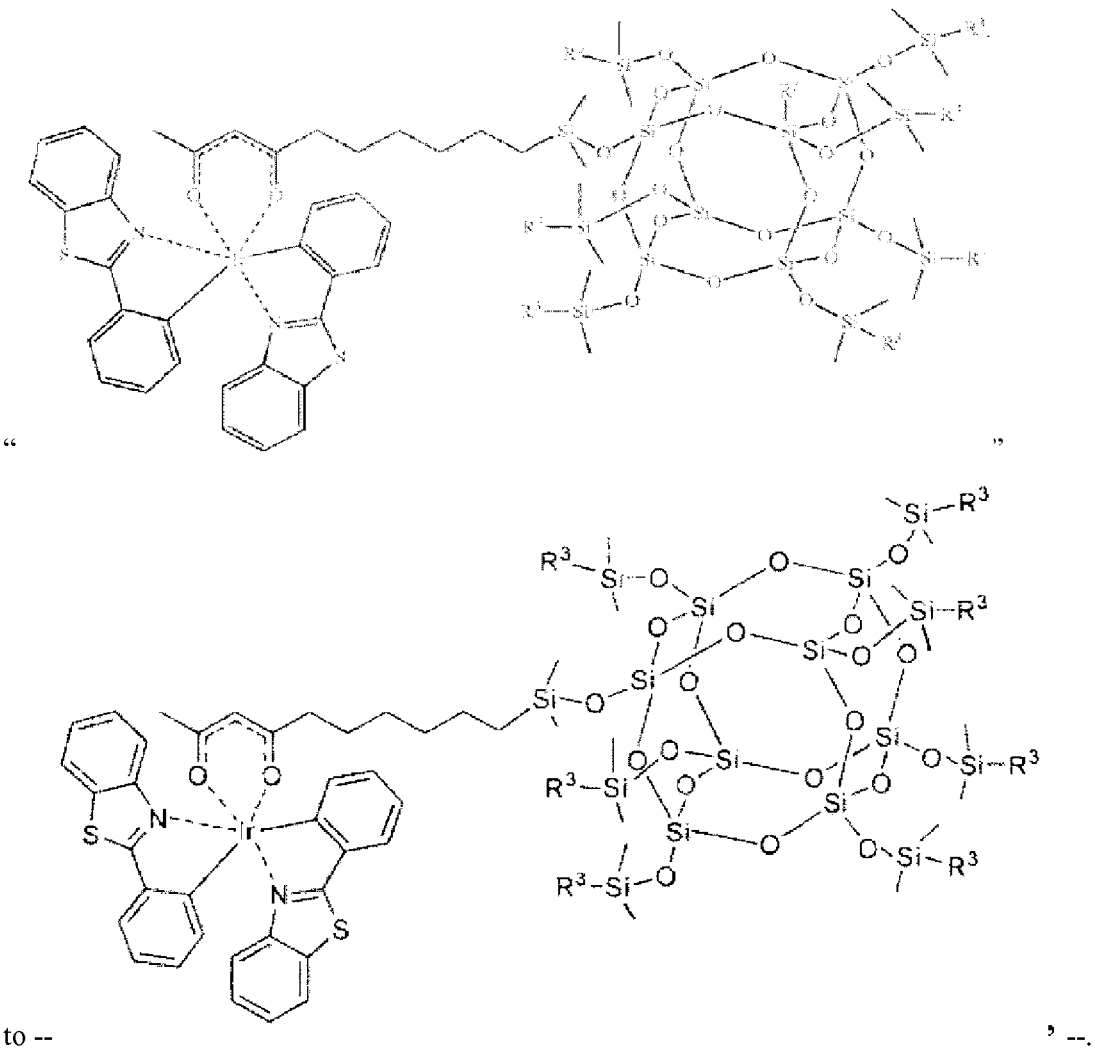

to --      , --.

Column 42 at line 22, Change "tricarbazoloylbenzene" to --tricarbazolylbenzene--.

Column 42 at line 47, Change "tricarbazoloylbenzene" to --tricarbazolylbenzene--.

Column 43 line 7, Change "cicholorethane," to --dichloroethane,--.

Column 57 line 42, Change "complex" to --complex.--.

Column 59 line 31, Change "µl," to --Al,--.

Column 60 line 5, Change "hydroxyquinoliate" to --hydroxyquinolate--.

Column 60 line 58, Change "tricarbazoloylbenzene" to --tricarbazolylbenzene--.

Column 79 line 32, Change "obtained" to --obtained.--.

Columns 85-86 line 1, Change "$\xrightarrow[\text{toluene}]{\text{Pt(dvs)}}$" to --$\xrightarrow[\text{toluene}]{\text{Pt}_2\text{(dvs)}_3}$--.

CERTIFICATE OF CORRECTION (continued)
U.S. Pat. No. 8,721,922 B2

In the claims

Column 96 lines 28-43, Claim 6, change " 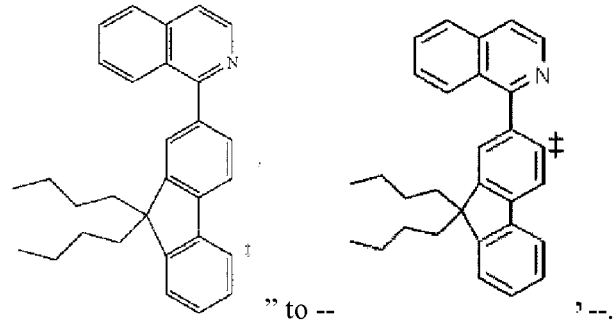 " to -- ' --.

Columns 99-100 line 3, Claim 7, change

" 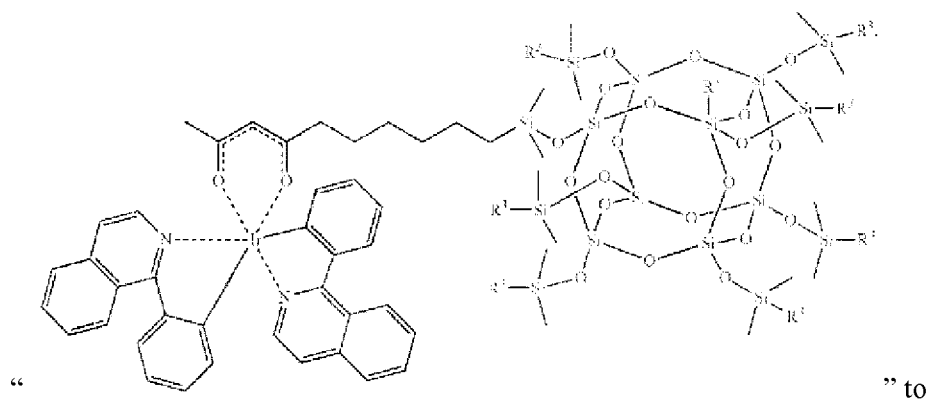 " to

-- 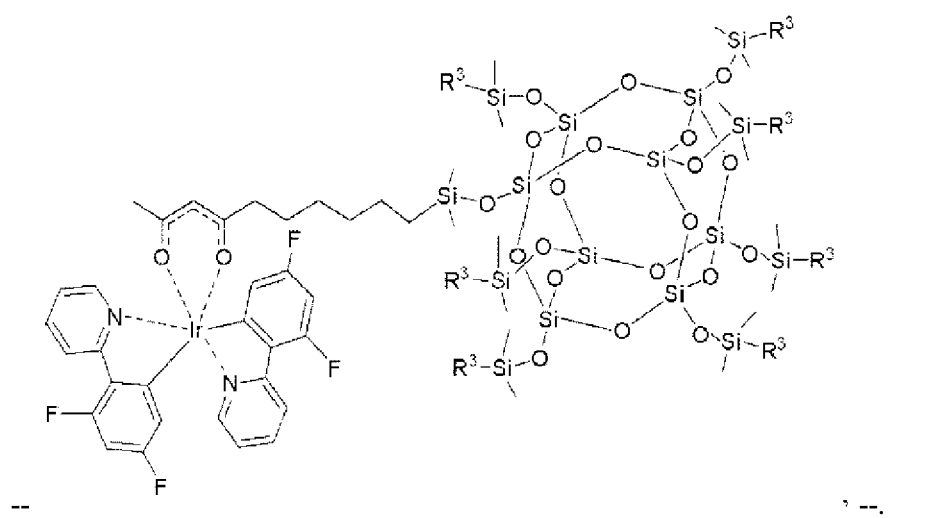 ' --.